US012787503B2

(12) United States Patent
Takayama

(10) Patent No.: US 12,787,503 B2
(45) Date of Patent: Nov. 3, 2026

(54) NITRIDE-BASED SEMICONDUCTOR LIGHT-EMITTING ELEMENT

(71) Applicant: Nuvoton Technology Corporation Japan, Kyoto (JP)

(72) Inventor: Toru Takayama, Toyama (JP)

(73) Assignee: Nuvoton Technology Corporation Japan, Kyoto (JP)

( * ) Notice: Subject to any disclaimer, the term of this patent is extended or adjusted under 35 U.S.C. 154(b) by 1000 days.

(21) Appl. No.: 18/063,487

(22) Filed: Dec. 8, 2022

(65) Prior Publication Data

US 2023/0140710 A1 May 4, 2023

Related U.S. Application Data

(63) Continuation-in-part of application No. PCT/JP2022/018699, filed on Apr. 25, 2022.

(30) Foreign Application Priority Data

Jul. 9, 2021 (JP) ................................ 2021-114115

(51) Int. Cl.
*H10H 20/81* (2025.01)
*H10H 20/815* (2025.01)
(Continued)

(52) U.S. Cl.
CPC ........ *H10H 20/8252* (2025.01); *H10H 20/81* (2025.01); *H10H 20/815* (2025.01); *H10H 20/8162* (2025.01)

(58) Field of Classification Search
CPC .... H10H 20/01; H10H 20/821; H10H 20/857; H10H 20/0145; H10H 20/826–8262;
(Continued)

(56) References Cited

U.S. PATENT DOCUMENTS 6,163,037 A * 12/2000 Matsumoto ............ H10H 20/81 257/97
2009/0141765 A1 6/2009 Kohda et al.
(Continued)

FOREIGN PATENT DOCUMENTS

JP 2009-141340 A 6/2009
JP 2013-093382 A 5/2013
(Continued)

OTHER PUBLICATIONS

Extended European Search Report issued in the corresponding European patent application No. 22837323.9, dated Oct. 14, 2024.
International Search Report issued on Jul. 12, 2022 in International Patent Application No. PCT/JP2022/018699.

*Primary Examiner* — Moin M Rahman
(74) *Attorney, Agent, or Firm* — Rimon P.C.

(57) ABSTRACT

A nitride-based semiconductor light-emitting element includes a semiconductor stack body that includes: an N-type first cladding layer; an N-side guide layer; an active layer that includes a well layer and a barrier layer; a P-side guide layer; and a P-type cladding layer. Band gap energy of the P-side guide layer monotonically increases with an increase in distance from the active layer. An average of the band gap energy of the P-side guide layer is greater than or equal to an average of band gap energy of the N-side guide layer. Band gap energy of the barrier layer is less than or equal to a smallest value of the band gap energy of the N-side guide layer and a smallest value of the band gap energy of the P-side guide layer. A thickness of the P-side guide layer is greater than a thickness of the N-side guide layer.

20 Claims, 37 Drawing Sheets

(51) Int. Cl.
*H10H 20/816* (2025.01)
*H10H 20/825* (2025.01)

(58) Field of Classification Search
CPC ...... H10H 20/013–0137; H10H 20/824–8252; H10H 20/012–0125; H10H 20/823–8232; H10H 20/0165; H10H 20/817–818; H10H 20/052; H10H 20/814–8142; H10H 20/8312; H10H 20/032; H10H 20/0364; H10H 20/0363; H10H 20/855; H10H 20/819; H10H 20/856; H10H 20/82; H10H 20/831; H10H 29/142; H10H 20/84; H10H 20/042; H10H 20/83; H10H 20/81; H10H 20/815; H10H 20/8252; H10H 20/8162; H10H 20/812; H10H 20/825; H01L 25/0753; H01L 24/75; H01L 24/98; H01L 2221/68322; H01L 2221/68354; H01L 2224/75822; H01L 2224/7598; H01L 2924/12041; H01L 21/6835; H01L 24/95; H01L 25/167; H01L 2224/0344; H01S 5/3213; H01S 5/3215; H01S 5/2202; H01S 5/3063; H01S 5/4031; H01S 5/2009; H01S 5/2031; H01S 5/34333; H01S 5/22
See application file for complete search history.

(56) References Cited

U.S. PATENT DOCUMENTS

| | | | | |
|---|---|---|---|---|
| 2013/0142210 | A1 | 6/2013 | Kyono et al. | |
| 2014/0231838 | A1* | 8/2014 | Tokuda | H01S 5/2009 438/47 |
| 2014/0294029 | A1 | 10/2014 | Masui | |
| 2015/0063392 | A1* | 3/2015 | Takayama | H01S 5/0287 372/45.01 |
| 2017/0155230 | A1 | 6/2017 | Nakatsu | |
| 2019/0074665 | A1* | 3/2019 | Takayama | H10H 20/8162 |
| 2020/0274330 | A1* | 8/2020 | Nagawa | H01S 5/2031 |
| 2020/0412101 | A1 | 12/2020 | Takayama et al. | |
| 2021/0184434 | A1* | 6/2021 | Watanabe | H01S 5/3213 |
| 2021/0281039 | A1 | 9/2021 | Kaji et al. | |
| 2021/0376194 | A1* | 12/2021 | Hahn | H10H 20/816 |

FOREIGN PATENT DOCUMENTS

| | | | |
|---|---|---|---|
| JP | 2014-131019 | A | 7/2014 |
| JP | 2014-183120 | A | 9/2014 |
| JP | 2018-050021 | A | 3/2018 |
| WO | 2019/187583 | A1 | 10/2019 |
| WO | 2020/039904 | A1 | 2/2020 |
| WO | 2020/116172 | A1 | 6/2020 |

* cited by examiner

NITRIDE-BASED SEMICONDUCTOR LIGHT-EMITTING ELEMENT

CROSS REFERENCE TO RELATED APPLICATIONS

This is a continuation-in-part application of PCT International Application No. PCT/JP2022/018699 filed on Apr. 25, 2022, designating the United States of America, which is based on and claims priority of Japanese Patent Application No. 2021-114115 filed on Jul. 9, 2021. The entire disclosures of the above-identified applications, including the specifications, drawings and claims are incorporated herein by reference in their entirety.

FIELD

The present disclosure relates to a nitride-based semiconductor light-emitting element.

BACKGROUND

Conventionally, a nitride-based semiconductor light-emitting element is used as a light source of a processing device, for instance. There has been a demand for a light source of a processing device to output higher power and to have higher efficiency. In order to improve efficiency of a nitride-based semiconductor light-emitting element, for example, technology for lowering an operating voltage has been known (for example, Patent Literature (PTL) 1).

CITATION LIST

Patent Literature

PTL 1: Japanese Unexamined Patent Application Publication No. 2018-50021

SUMMARY

Technical Problem

It is effective to reduce the thickness of a P-type cladding layer in order to lower the operating voltage of a nitride-based semiconductor light-emitting element, other than the technology stated in PTL 1. However, along with a reduction in the thickness of the P-type cladding layer, a peak of a light intensity distribution in a stack direction (that is, a direction in which semiconductor layers are grown) shifts from an active layer toward an N-type cladding layer. Accordingly, a coefficient of confinement of light in the active layer decreases, and due to this, a heat saturation level of light output decreases. Thus, it is difficult to increase output power of a nitride-based semiconductor light-emitting element.

The present disclosure is to address such problems, and is to provide a nitride-based semiconductor light-emitting element having a lowered operating voltage and an increased coefficient of confinement of light in an active layer.

Solution to Problem

In order to address the above problems, a nitride-based semiconductor light-emitting element according to an aspect of the present disclosure is a nitride-based semiconductor light-emitting element including: a semiconductor stack body. The nitride-based semiconductor light-emitting element emits light from an end surface that faces in a direction perpendicular to a stack direction of the semiconductor stack body. The semiconductor stack body includes: an N-type first cladding layer; an N-side guide layer provided above the N-type first cladding layer; an active layer provided above the N-side guide layer, the active layer including a well layer and a barrier layer and having a quantum well structure; a P-side guide layer provided above the active layer; and a P-type cladding layer provided above the P-side guide layer. Band gap energy of the P-side guide layer monotonically increases with an increase in distance from the active layer. The P-side guide layer includes a portion in which the band gap energy continuously increases with an increase in distance from the active layer. An average of the band gap energy of the P-side guide layer is greater than or equal to an average of band gap energy of the N-side guide layer. Band gap energy of the barrier layer is less than or equal to a smallest value of the band gap energy of the N-side guide layer and a smallest value of the band gap energy of the P-side guide layer, and $Tn<Tp$ is satisfied, where Tp denotes a thickness of the P-side guide layer, and Tn denotes a thickness of the N-side guide layer.

Advantageous Effects

According to the present disclosure, a nitride-based semiconductor light-emitting element that has a lowered operating voltage, and an increased coefficient of confinement of light in an active layer can be provided.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
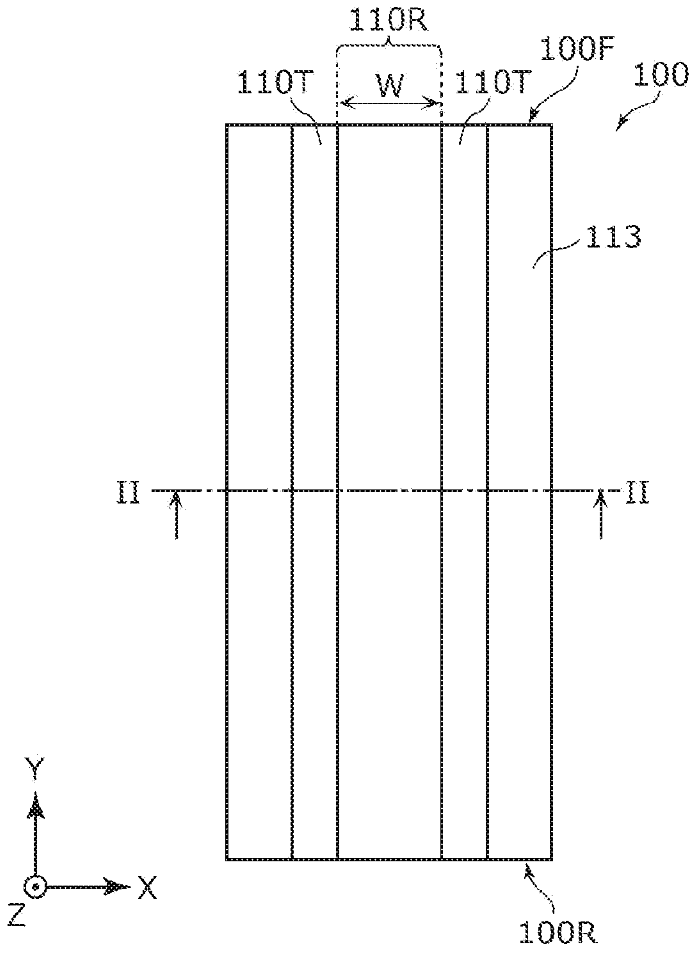
FIG. 1 is a schematic plan view illustrating the overall configuration of a nitride-based semiconductor light-emitting element according to Embodiment 1.

The following describes embodiments of the present disclosure, with reference to the drawings. Note that the embodiments described below each show a particular example of the present disclosure. Accordingly, the numerical values, shapes, materials, elements, the arrangement and connection of the elements, and others stated in the following embodiments are mere examples, and therefore are not intended to limit the present disclosure.

The drawings are schematic diagrams, and do not necessarily provide strictly accurate illustration. Accordingly, scales, for instance, are not necessarily the same throughout the drawings. In the drawings, the same numeral is given to substantially the same configuration, and a redundant description thereof may be omitted or simplified.

In the present specification, the terms "above" and "below" do not indicate vertically upward and vertically downward in the absolute space recognition, but are rather used as terms defined by a relative positional relation based on the stacking order in a stacked configuration. Furthermore, the terms "above" and "below" are used not only when two elements are spaced apart from each other and another element is present therebetween, but also when two elements are disposed in contact with each other.

Embodiment 1

A nitride-based semiconductor light-emitting element according to Embodiment 1 is to be described.

1-1. Overall Configuration

Figure 2A:
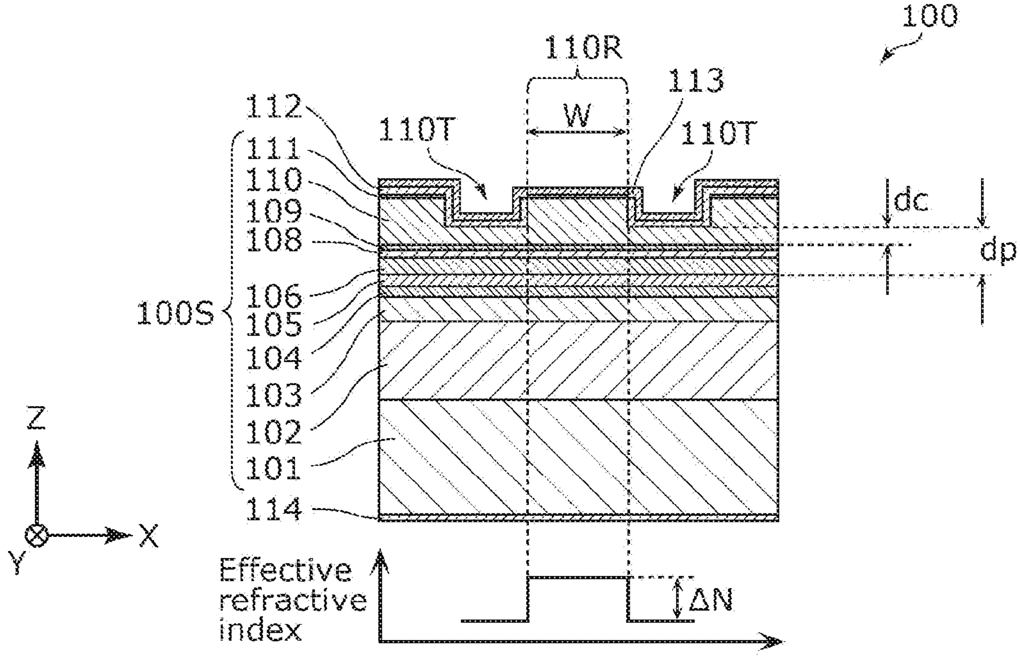
FIG. 2A is a schematic cross sectional view illustrating the overall configuration of the nitride-based semiconductor light-emitting element according to Embodiment 1.
Figure 2B:
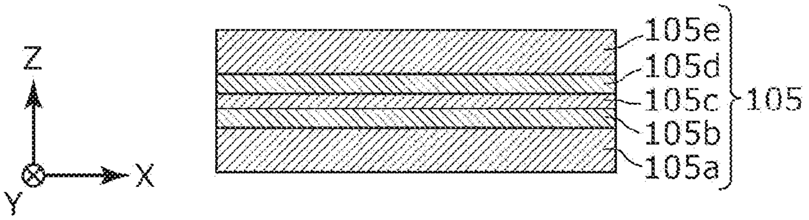
FIG. 2B is a schematic cross sectional view illustrating a configuration of an active layer included in the nitride-based semiconductor light-emitting element according to Embodiment 1.

First, an overall configuration of the nitride-based semiconductor light-emitting element according to the present embodiment is to be described with reference to FIG. 1, FIG. 2A, and FIG. 2B. FIG. 1 and FIG. 2A are a schematic plan view and a schematic cross sectional view, respectively, which illustrate the overall configuration of nitride-based semiconductor light-emitting element 100 according to the present embodiment. FIG. 2A illustrates a cross section taken along line II-II in FIG. 1. FIG. 2B is a schematic cross sectional view illustrating a configuration of active layer 105 included in nitride-based semiconductor light-emitting element 100 according to the present embodiment. Note that the drawings show the X axis, the Y axis, and the Z axis orthogonal to one another. The X axis, the Y axis, and the Z axis form a right-handed orthogonal coordinate system. A stack direction of nitride-based semiconductor light-emitting element 100 is parallel to the Z-axis direction, and a principal direction in which light (laser beam) is emitted is parallel to the Y-axis direction.

As illustrated in FIG. 2A, nitride-based semiconductor light-emitting element 100 includes semiconductor stack body 100S that includes nitride-based semiconductor layers, and emits light from end surface 100F (see FIG. 1) in a direction perpendicular to the stack direction of semiconductor stack body 100S (that is, the Z-axis direction). In the present embodiment, nitride-based semiconductor light-emitting element 100 is a semiconductor laser element having two end surfaces 100F and 100R that form a resonator. End surface 100F is a front end surface from which a laser beam is emitted, and end surface 100R is a rear end surface having a higher reflectance than that of end surface 100F. In the present embodiment, the reflectance of end surfaces 100F and the reflectance of 100R are 16% and 95%, respectively. The length of the resonator (that is, a distance between end surface 100F and end surface 100R) of nitride-based semiconductor light-emitting element 100 according to the present embodiment is about 1200 μm.

As illustrated in FIG. 2A, nitride-based semiconductor light-emitting element 100 includes semiconductor stack body 100S, current block layer 112, P-side electrode 113, and N-side electrode 114. Semiconductor stack body 100S includes substrate 101, N-type first cladding layer 102, N-type second cladding layer 103, N-side guide layer 104, active layer 105, P-side guide layer 106, intermediate layer 108, electron barrier layer 109, P-type cladding layer 110, and contact layer 111.

Substrate 101 is a plate shaped member serving as a base for nitride-based semiconductor light-emitting element 100. In the present embodiment, substrate 101 is an N-type GaN substrate.

N-type first cladding layer 102 is an example of an N-type cladding layer provided above substrate 101. N-type first cladding layer 102 has a smaller refractive index and greater band gap energy than those of active layer 105. In the present embodiment, N-type first cladding layer 102 is an N-type $Al_{0.026}Ga_{0.974}N$ layer having a thickness of 1200 nm. N-type first cladding layer 102 is doped with Si having a concentration of $1\times10^{18}$ $cm^{-3}$, as an impurity.

N-type second cladding layer 103 is an example of an N-type cladding layer provided above substrate 101. In the present embodiment, N-type second cladding layer 103 is provided above N-type first cladding layer 102. N-type second cladding layer 103 has a smaller refractive index and greater band gap energy than those of active layer 105. In the present embodiment, N-type second cladding layer 103 is an N-type GaN layer having a thickness of 100 nm. N-type second cladding layer 103 is doped with Si having a concentration of $1\times10^{18}$ $cm^{-3}$, as an impurity. The band gap energy of N-type second cladding layer 103 is less than that of N-type first cladding layer 102 and is greater than or equal to the greatest value of the band gap energy of P-side guide layer 106.

N-side guide layer 104 is a light guide layer provided above N-type second cladding layer 103. N-side guide layer 104 has a greater refractive index and less band gap energy than those of N-type first cladding layer 102 and N-type second cladding layer 103. In the present embodiment, N-side guide layer 104 is an undoped $In_{0.04}Ga_{0.96}N$ layer having a thickness of 160 nm.

Active layer 105 is a light-emitting layer provided above N-side guide layer 104 and having a quantum well structure. In the present embodiment, active layer 105 includes well layers 105*b* and 105*d*, and barrier layers 105*a*, 105*c*, and 105*e*, as illustrated in FIG. 2B.

Barrier layer 105*a* is provided above N-side guide layer 104, and functions as a barrier of the quantum well structure. In the present embodiment, barrier layer 105*a* is an undoped $In_{0.05}Ga_{0.95}N$ layer having a thickness of 7 nm.

Well layer 105*b* is provided above barrier layer 105*a*, and functions as a well of the quantum well structure. Well layer 105*b* is provided between barrier layer 105*a* and barrier layer 105*c*. In the present embodiment, well layer 105*b* is an undoped $In_{0.18}Ga_{0.82}N$ layer having a thickness of 3 nm.

Barrier layer 105*c* is provided above well layer 105*b*, and functions as a barrier of the quantum well structure. In the present embodiment, barrier layer 105*c* is an undoped $In_{0.05}Ga_{0.95}N$ layer having a thickness of 7 nm.

Well layer 105*d* is provided above barrier layer 105*c*, and functions as a well of the quantum well structure. Well layer 105*d* is provided between barrier layer 105*c* and barrier layer 105*e*. In the present embodiment, well layer 105*d* is an undoped $In_{0.18}Ga_{0.82}N$ layer having a thickness of 3 nm.

Barrier layer 105*e* is provided above well layer 105*d*, and functions as a barrier of the quantum well structure. In the present embodiment, barrier layer 105*e* is an undoped $In_{0.05}Ga_{0.95}N$ layer having a thickness of 5 nm.

In the present embodiment, band gap energy of each barrier layer is less than or equal to the smallest value of the band gap energy of N-side guide layer 104 and P-side guide layer 106. Thus, the refractive index of each barrier layer is greater than the refractive indices of N-side guide layer 104 and P-side guide layer 106. Thus, a coefficient of confinement of light in active layer 105 can be increased.

P-side guide layer 106 is a light guide layer provided above active layer 105. P-side guide layer 106 has a greater refractive index and less band gap energy than those of P-type cladding layer 110. The band gap energy of P-side guide layer 106 monotonically increases with an increase in distance from active layer 105. Here, a configuration in which band gap energy monotonically increases includes a configuration in which a region where band gap energy is constant in the stack direction is present. P-side guide layer 106 includes a portion in which band gap energy monotonically increases with an increase in distance from active layer 105. Here, a configuration in which band gap energy continuously increases does not include a configuration in which band gap energy discontinuously changes in the stack direction. In the present disclosure, the configuration in which band gap energy continuously and monotonically increases means a configuration in which a discontinuous increase in band gap energy in the stack direction at a certain position is less than 2% of the magnitude of band gap energy at the position. For example, the configuration in which band gap energy continuously increases does not include a configuration in which band gap energy increases stepwise by 2% or more in the stack direction, but includes a configuration in which band gap energy increases stepwise by less than 2% in the stack direction. In the present embodiment, band gap energy of entire P-side guide layer 106 continuously increases with an increase in distance from active layer 105, yet the configuration of P-side guide layer 106 is not limited thereto. For example, a proportion of the thickness of a portion of P-side guide layer 106 having band gap energy that continuously increases with an increase in distance from active layer 105 may be 50% or more of the thickness of entire P-side guide layer 106. The proportion may be 70% or more, or may be 90% or more.

An amount of increase ($\Delta Egp$) in band gap energy of P-side guide layer 106 in the stack direction may be preferably greater than or equal to 100 meV. Here, an amount of increase in band gap energy of P-side guide layer 106 in the stack direction is defined by a difference between band gap energy of P-side guide layer 106 at and in the vicinity of an edge surface on the side close to active layer 105 and band gap energy of P-side guide layer 106 at and in the vicinity of an edge surface on the side close to P-side cladding layer 110, for example. The magnitude of band gap energy that continuously increases may be 70% or more of $\Delta Egp$. The percentage may be 80% or more, or may be 90% or more.

When P-side guide layer 106 consists essentially of $In_{Xp}G_{1-Xp}N$, In composition ratio Xp of P-side guide layer 106 may monotonically decrease with an increase in distance from active layer 105. Accordingly, the band gap energy of P-side guide layer 106 monotonically increases with an increase in distance from active layer 105. Here, the configuration in which In composition ratio Xp continuously and monotonically decreases also includes a configuration in which a region where In composition ratio Xp is constant in the stack direction is present. P-side guide layer 106 includes a portion in which In composition ratio Xp continuously decreases with an increase in distance from active layer 105. Here, the configuration in which In composition ratio Xp continuously decreases does not include a configuration in which In composition ratio Xp discontinuously changes in the stack direction. In the present disclosure, the configuration in which the In composition ratio continuously decreases means a configuration in which an amount of discontinuous decrease in In composition ratio Xp in the stack direction at a certain position in P-side guide layer 106 is less than 20% of In composition ratio Xp at the position.

Average band gap energy of P-side guide layer 106 is greater than or equal to average band gap energy of N-side guide layer 104. Stated differently, an average of the In composition ratio of N-side guide layer 104 is greater than or equal to an average of the In composition ratio of P-side guide layer 106. In the present embodiment, an average of the In composition ratio of N-side guide layer 104 is greater than the average of the In composition ratio of P-side guide layer 106. The following relation is satisfied, where Tp denotes the thickness of P-side guide layer 106, and Tn denotes the thickness of N-side guide layer 104:

$$Tn < Tp \quad (1)$$

Further, the greatest value of the In composition ratio of P-side guide layer 106 is less than or equal to the In composition ratio of each barrier layer.

In the present embodiment, P-side guide layer 106 is an undoped $In_{Xp}G_{1-Xp}N$ layer having a thickness of 280 nm. More specifically, P-side guide layer 106 has a composition represented by $In_{0.04}Ga_{0.96}N$ at and in the vicinity of the interface on the side close to active layer 105, and has a composition represented by GaN at and in the vicinity of the interface on the side far from active layer 105. In composition ratio Xp of P-side guide layer 106 decreases at a certain rate of change with an increase in distance from active layer 105.

Intermediate layer 108 is provided above active layer 105. In the present embodiment, intermediate layer 108 is provided between P-side guide layer 106 and electron barrier layer 109, and having bandgap energy less than the bandgap energy of electron barrier layer 109 and greater than or equal to the bandgap energy of P-side guide layer 106. Intermediate layer 108 decreases a stress generated due to a difference in lattice constant between P-side guide layer 106 and electron barrier layer 109. Accordingly, the occurrence of crystal defect in nitride-based semiconductor light-emitting element 100 can be reduced. In the present embodiment, intermediate layer 108 is an undoped GaN layer having a thickness of 20 nm.

Electron barrier layer 109 is a nitride-based semiconductor layer that is provided above active layer 105 and includes at least Al. In the present embodiment, electron barrier layer 109 is provided between intermediate layer 108 and P-type cladding layer 110. Electron barrier layer 109 is a P-type $Al_{0.36}Ga_{0.64}N$ layer having a thickness of 5 nm. Electron barrier layer 109 is doped with Mg having a concentration of $1\times10^{19}$ $cm^{-3}$, as an impurity. Electron barrier layer 109 can prevent leakage of electrons from active layer 105 to P-type cladding layer 110.

P-type cladding layer 110 is provided above active layer 105. In the present embodiment, P-type cladding layer 110 is provided between electron barrier layer 109 and contact layer 111. P-type cladding layer 110 has a smaller refractive index and greater band gap energy than those of active layer 105. P-type cladding layer 110 may have a thickness less than or equal to 460 nm. Accordingly, the electrical resistance of nitride-based semiconductor light-emitting element 100 can be decreased. Thus, the operating voltage of nitride-based semiconductor light-emitting element 100 can be lowered. Since self-heating of nitride-based semiconductor light-emitting element 100 during operation can be reduced, temperature characteristics of nitride-based semiconductor light-emitting element 100 can be enhanced. Thus, nitride-based semiconductor light-emitting element 100 can perform high-power operation. Note that in nitride-based semiconductor light-emitting element 100 according to the present embodiment, the thickness of P-type cladding layer 110 may be preferably greater than or equal to 200 nm, in order to sufficiently exhibit functionality of P-type cladding layer 110 as a cladding layer. The thickness of P-type cladding layer 110 may be greater than or equal to 250 nm. In the present embodiment, P-type cladding layer 110 is a P-type $Al_{0.026}Ga_{0.974}N$ layer having a thickness of 450 nm. P-type cladding layer 110 is doped with Mg as an impurity. An impurity concentration at an edge portion of P-type cladding layer 110 on the side close to active layer 105 is lower than the impurity concentration at an edge portion of P-type cladding layer 110 on the side far from active layer 105. Specifically, P-type cladding layer 110 includes a P-type $Al_{0.026}Ga_{0.974}N$ layer that is provided on the side close to active layer 105, doped with Mg having a concentration of $2\times10^{18}$ $cm^{-3}$, and has a thickness of 150 nm, and a P-type $Al_{0.026}Ga_{0.974}N$ layer that is provided on the side far from active layer 105, doped with Mg having a concentration of $1\times10^{19}$ $cm^{-3}$, and has a thickness of 300 nm.

Ridge 110R is formed in P-type cladding layer 110 of nitride-based semiconductor light-emitting element 100. Further, two grooves 110T are formed in P-type cladding layer 110, which are provided along ridge 110R and extend in the Y-axis direction. In the present embodiment, ridge width W is about 30 μm. As illustrated in FIG. 2A, dp denotes a distance between active layer 105 and a lower edge of ridge 110R (that is, the bottoms of grooves 110T). Further, dc denotes the thickness of P-type cladding layer 110 at the lower edge of ridge 110R (that is, a distance between the lower edge of ridge 110R and the interface between P-type cladding layer 110 and electron barrier layer 109).

Contact layer 111 is provided above P-type cladding layer 110, and is in ohmic contact with P-side electrode 113. In the present embodiment, contact layer 111 is a P-type GaN layer having a thickness of 60 nm. Contact layer 111 is doped with Mg having a concentration of $1\times10^{20}$ $cm^{-3}$, as an impurity.

Current block layer 112 is an insulating layer provided above P-type cladding layer 110 and having transmissivity for light from active layer 105. Current block layer 112 is provided in a region above an upper surface of P-type cladding layer 110 except an upper surface of ridge 110R. In the present embodiment, current block layer 112 is an $SiO_2$ layer.

P-side electrode 113 is a conductive layer provided above contact layer 111. In the present embodiment, P-side electrode 113 is provided above contact layer 111 and current block layer 112. P-side electrode 113 is a single-layer film or is a multi-layer film formed using at least one of Cr, Ti, Ni, Pd, Pt, or Au, for example.

N-side electrode 114 is a conductive layer provided below substrate 101 (that is, on a principal surface of substrate 101 on the side different from the principal surface above which N-type first cladding layer 102, for instance, is provided). N-side electrode 114 is a single-layer film or is a multi-layer film formed using at least one of Cr, Ti, Ni, Pd, Pt, or Au, for example.

Since nitride-based semiconductor light-emitting element 100 has such a configuration as above, effective refractive index difference ΔN is generated between a portion below ridge 110R and portions below grooves 110T, as illustrated in FIG. 2A. Accordingly, light generated in the portion of active layer 105 below ridge 110R can be confined in the horizontal direction (that is, the X-axis direction).

1-2. Light Intensity Distribution and Stability of Light Output

Next, a light intensity distribution and stability of light output of nitride-based semiconductor light-emitting element 100 according to the present embodiment is to be described.

Figure 3:
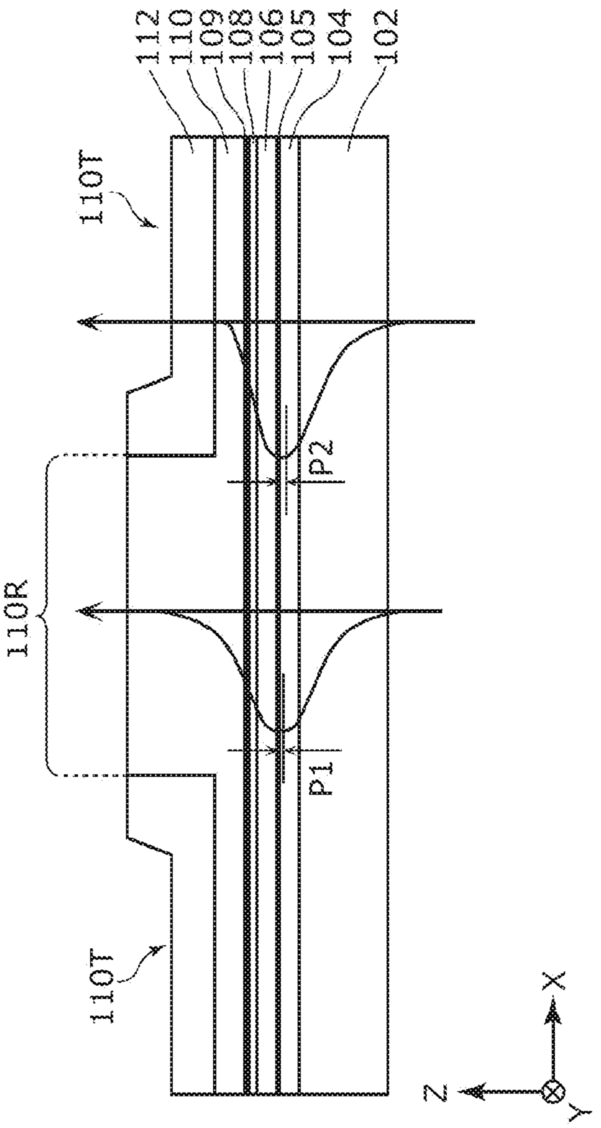
FIG. 3 is a schematic diagram illustrating, in a simplified manner, a light intensity distribution in a stack direction of the nitride-based semiconductor light-emitting element according to Embodiment 1.

First, a light intensity distribution in the stack direction (the Z-axis direction in the drawings) of nitride-based semiconductor light-emitting element 100 according to the present embodiment is to be described with reference to FIG. 3. FIG. 3 is a schematic diagram illustrating, in a simplified manner, a light intensity distribution in the stack direction of nitride-based semiconductor light-emitting element 100 according to the present embodiment. FIG. 3 illustrates a schematic cross sectional view of nitride-based semiconductor light-emitting element 100, and a graph showing, in a simplified manner, a light intensity distribution in the stack direction at positions corresponding to ridge 110R and grooves 110T.

Figure 4:
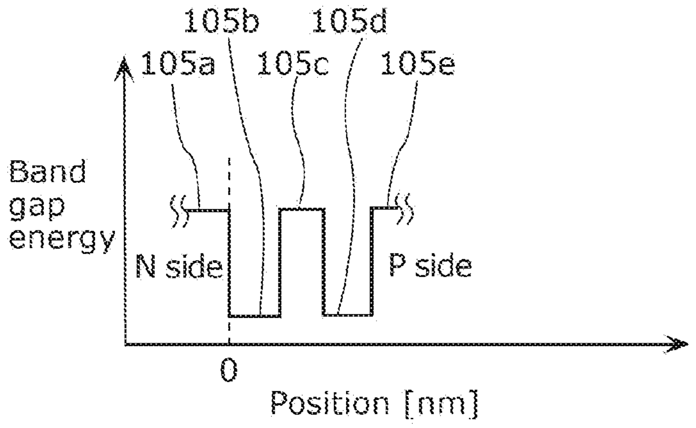
FIG. 4 is a graph showing coordinates at positions in the stack direction of the nitride-based semiconductor light-emitting element according to Embodiment 1.

Generally, in a nitride-based semiconductor light-emitting element, light is generated in an active layer, yet a light intensity distribution in the stack direction relies on the stack structure, and a peak of the light intensity distribution is not necessarily located in the active layer. The stack structure of nitride-based semiconductor light-emitting element 100 according to the present embodiment differs in the portion below ridge 110R and portions below grooves 110T, and thus the light intensity distribution also differs in the portion below ridge 110R and the portions below grooves 110T. As illustrated in FIG. 3, P1 denotes a peak position of the light intensity distribution in the stack direction in the center of the horizontal direction (that is, the X-axis direction) in the portion below ridge 110R. P2 denotes a peak position of the light intensity distribution in the stack direction in the portion below groove 110T. Here, positions P1 and P2 are to be described with reference to FIG. 4. FIG. 4 is a graph showing coordinates at positions in the stack direction of nitride-based semiconductor light-emitting element 100 according to the present embodiment. As illustrated in FIG. 4, coordinates of a position of an N-side edge surface of well layer 105*b* of active layer 105, that is, coordinates of a position in the stack direction of the edge surface of well layer 105*b* on the side close to N-side guide layer 104 are set to zero, a downward direction (a direction toward N-side guide layer 104) is a negative direction in the coordinate system, and an upward direction (a direction toward P-side guide layer 106) is a positive direction in the coordinate system. An absolute value of a difference between position P1 and position P2 is difference ΔP at a peak position.

Figure 5:
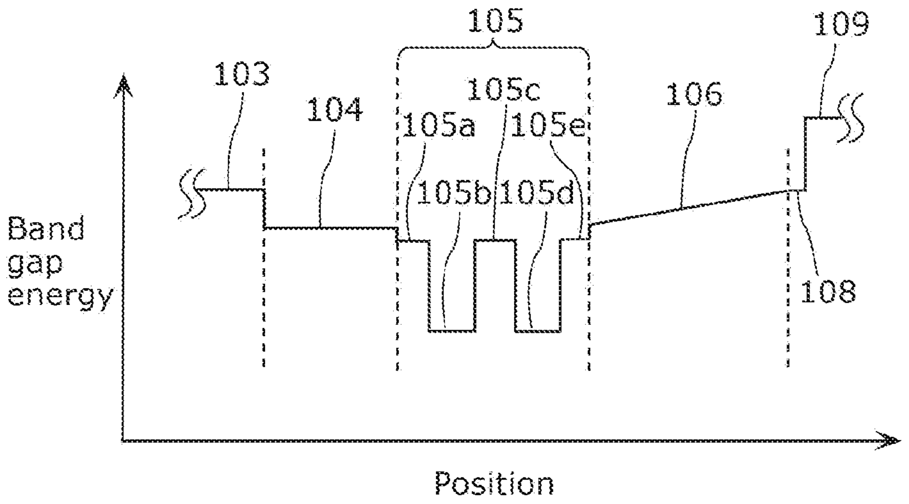
FIG. 5 is a schematic graph showing a distribution of band gap energy in the active layer and layers in the vicinity thereof in the nitride-based semiconductor light-emitting element according to Embodiment 1.

In the following, a light intensity distribution in the stack direction of nitride-based semiconductor light-emitting element 100 according to the present embodiment is to be described with reference to FIG. 5. FIG. 5 is a schematic graph showing a distribution of band gap energy in active layer 105 and layers in the vicinity thereof in nitride-based semiconductor light-emitting element 100 according to the present embodiment.

In nitride-based semiconductor light-emitting element 100 according to the present embodiment, the thickness of P-type cladding layer 110 is set to be relatively thin, in order to lower the operating voltage. Along therewith, the height of ridge 110R (that is, a height of ridge 110R from the bottom surfaces of grooves 110T) is set to be relatively low. In a semiconductor light-emitting element having such a configuration, a peak position of the light intensity distribution in the stack direction shifts from active layer 105 toward N-type second cladding layer 103. Accordingly, a coefficient of confinement of light in the active layer decreases, and due to this, a heat saturation level of light output decreases. Thus, it is difficult for the semiconductor light-emitting element to perform high-power operation. In the present embodiment, average band gap energy of P-side guide layer 106 is greater than or equal to average band gap energy of N-side guide layer 104, as illustrated in FIG. 5. On the other hand, thickness Tp of P-side guide layer 106 is greater than thickness Tn of N-side guide layer 104 (see the inequality (1) above). In this manner, by increasing the thickness of P-side guide layer 106 having a greater refractive index than those of the cladding layers, a light intensity distribution can be shifted from active layer 105 toward P-side guide layer 106. Thus, according to nitride-based semiconductor light-emitting element 100 according to the present embodiment, a peak of the light intensity distribution in the stack direction can be controlled so that the peak is located in active layer 105.

Furthermore, in the present embodiment, P-side guide layer 106 includes a portion in which band gap energy continuously and monotonically increases with an increase in distance from active layer 105. Thus, P-side guide layer 106 has a portion in which a refractive index continuously and monotonically increases with a decrease in distance from active layer 105. In this manner, the refractive index of P-side guide layer 106 increases with a decrease in distance from active layer 105, and thus the peak of the light intensity distribution in the stack direction can be located closer to active layer 105.

In the present embodiment, barrier layers 105*a*, 105*c*, and 105*e* each consist essentially of $In_{Xb}Ga_{1-Xb}N$, and the relations as below are satisfied with regard to In composition ratios Xb, Xn, and Xp of the barrier layers, N-side guide layer 104, and P-side guide layer 106:

$$Xp \leq Xb \tag{2}$$

$$Xn \leq Xb \tag{3}$$

Accordingly, band gap energy of each barrier layer is less than or equal to the smallest value of band gap energy of N-side guide layer 104 and band gap energy of P-side guide layer 106. Thus, the refractive indices of the barrier layers can be made greater than or equal to the greatest values of the refractive indices of P-side guide layer 106 and N-side guide layer 104. Accordingly, a peak of the light intensity distribution in the stack direction can be brought close to active layer 105. Furthermore, the light intensity distribution can be prevented from excessively shifting from active layer 105 toward P-type cladding layer 110. The effects can be further enhanced by making the refractive indices of the barrier layers greater than the greatest values of the refractive indices of P-side guide layer 106 and N-side guide layer 104.

With the above configuration, in the present embodiment, position P1 of a peak of the light intensity distribution in the stack direction in the portion below ridge 110R can be placed at 1.3 nm. Thus, the peak of the light intensity distribution can be located in well layer 105*b* of active layer 105 (see FIG. 4). Further, ΔP can be reduced to 5.6 nm. Accordingly, a coefficient of confinement of light in active layer 105 can be increased to about 1.49%.

As described above, according to nitride-based semiconductor light-emitting element 100 according to the present embodiment, a peak of the light intensity distribution in the stack direction can be located in active layer 105. Note that the expression that a peak of a light intensity distribution in the stack direction is located in active layer 105 means a state in which a peak of a light intensity distribution in the stack direction is located in active layer 105 at at least one position in the horizontal direction of nitride-based semiconductor light-emitting element 100, and thus is not limited to a state in which a peak of a light intensity distribution in the stack direction is located in active layer 105 at all the positions in the horizontal direction.

As in the present embodiment, if a peak of a light intensity distribution in the stack direction is located in active layer 105, a proportion of a portion of light located in P-type cladding layer 110 can be increased as compared with the case where the peak of the light intensity distribution is located in N-side guide layer 104. Here, P-type cladding layer 110 includes impurities having a concentration higher than those of N-type first cladding layer 102 and N-type second cladding layer 103, and thus if the proportion of a portion of light located in P-type cladding layer 110 increases, an increase in loss of free carrier in P-type cladding layer 110 is concerned. However, in the present embodiment, P-side guide layer 106 is an undoped layer, and thickness Tp of P-side guide layer 106 is made relatively great, which can increase a proportion of a portion of a light intensity distribution located in the undoped layer. Thus, an increase in free carrier loss can be reduced. Specifically, in the present embodiment, waveguide loss can be reduced to about 3.2 $cm^{-1}$.

In nitride-based semiconductor light-emitting element 100 according to the present embodiment, in order to decrease the divergence angle of emitted light in the horizontal direction (that is, the X-axis direction), effective refractive index difference ΔN between the portion below ridge 110R and the portions below grooves 110T is set to a relatively small value. Specifically, effective refractive index difference ΔN is determined by adjusting distance dp (see FIG. 2A) between current block layer 112 and active layer 105. Here, effective refractive index difference ΔN decreases with an increase in distance dp. In the present embodiment, effective refractive index difference ΔN is about $2.1\times10^{-3}$. Thus, in the present embodiment, the number of high-order modes (that is, high-order transverse modes) that can propagate within a waveguide formed by ridge 110R is less than in the case where effective refractive index difference ΔN is greater than $2.1\times10^{-3}$. Accordingly, a proportion of the high-order modes is relatively high, out of all the transverse modes included in light emitted from nitride-based semiconductor light-emitting element 100. Thus, an amount of change in a coefficient of confinement of light in active layer 105 due to increase/decrease in the number of modes and mode coupling is relatively great. Accordingly, when the number of modes increases or decreases and modes are coupled in nitride-based semiconductor light-emitting element 100, linearity of characteristics (so-called IL characteristics) of light output relative to a supplied current decreases. Stated differently, a portion that is not linear (so called a kink) is generated in a graph showing IL characteristics. Along therewith, stability of light output of nitride-based semiconductor light-emitting element 100 may decrease.

A decrease in stability of light output as stated above is to be described in the following. In nitride-based semiconductor light-emitting element 100, a basic mode (that is, a zero-order mode) is dominant in the light intensity distribution in the portion below ridge 110R, whereas a high-order mode is dominant in the light intensity distribution in the portion below groove 110T. Accordingly, when nitride-based semiconductor light-emitting element 100 has great difference ΔP between position P1 of a peak of the light intensity distribution in the stack direction in the portion below ridge 110R and position P2 of a peak of the light intensity distribution in the stack direction in the portion below groove 110T, if the number of modes increases or decreases and modes are coupled, a coefficient of confinement of light in active layer 105 changes and thus stability of light output decreases.

For example, when the number of high-order modes decreases, a peak of a light intensity distribution resulting from adding the light intensity distributions in the portions below both ridge 110R and groove 110T shifts to a position close to position P1. Accordingly, as difference ΔP between position P1 and position P2 is greater, a change in coefficient of confinement of light in active layer 105 when the number of modes changes is greater. Thus, stability of light output decreases.

Nitride-based semiconductor light-emitting element 100 according to the present embodiment includes N-side guide layer 104 and P-side guide layer 106 having configurations as stated above, and thus the peaks of the light intensity distributions in both the portion below ridge 110R and the portion below groove 110T can be located in active layer 105. Thus, difference ΔP between position P1 and position P2 of the light intensity distributions can be decreased. Accordingly, even if the number of modes increases or decreases or modes are coupled, a shift in the stack direction of the position of a peak of a light intensity distribution resulting from adding the light intensity distributions in the portions below both ridge 110R and groove 110T can be decreased. Thus, stability of light output can be enhanced.

Note that as described above, in order to set effective refractive index difference ΔN to a relatively small value, distance dp is set to a relatively large value. When distance dp is determined, if the lower edge of ridge 110R (that is, the bottom of groove 110T) is determined to be positioned below electron barrier layer 109, since electron barrier layer 109 has great band gap energy, holes injected from contact layer 111 readily leak out of ridge 110R from the side wall of ridge 110R when passing through electron barrier layer 109. As a result, holes flow to a position below groove 110T. Along therewith, since a light distribution intensity is low in active layer 105 below groove 110T, a probability of radiative recombination of electrons and holes injected to active layer 105 decreases, and nonradiative recombination increases. Nitride-based semiconductor light-emitting element 100 tends to deteriorate due to an increase in such non-radiative recombination. In order to reduce such deterioration, the lower edge of ridge 110R is set to be positioned above electron barrier layer 109. If distance dc (see FIG. 2A) between the lower edge of ridge 110R and electron barrier layer 109 is excessively long, holes flow from ridge 110R into a position between groove 110T and electron barrier layer 109 to cause a leakage current. In order to reduce an increase in such a leakage current, distance dc is set to a value as small as possible. Distance dc is in a range from 10 nm to 70 nm, for example.

1-3. Effects

[1-3-1. Guide Layers]

Figure 6:
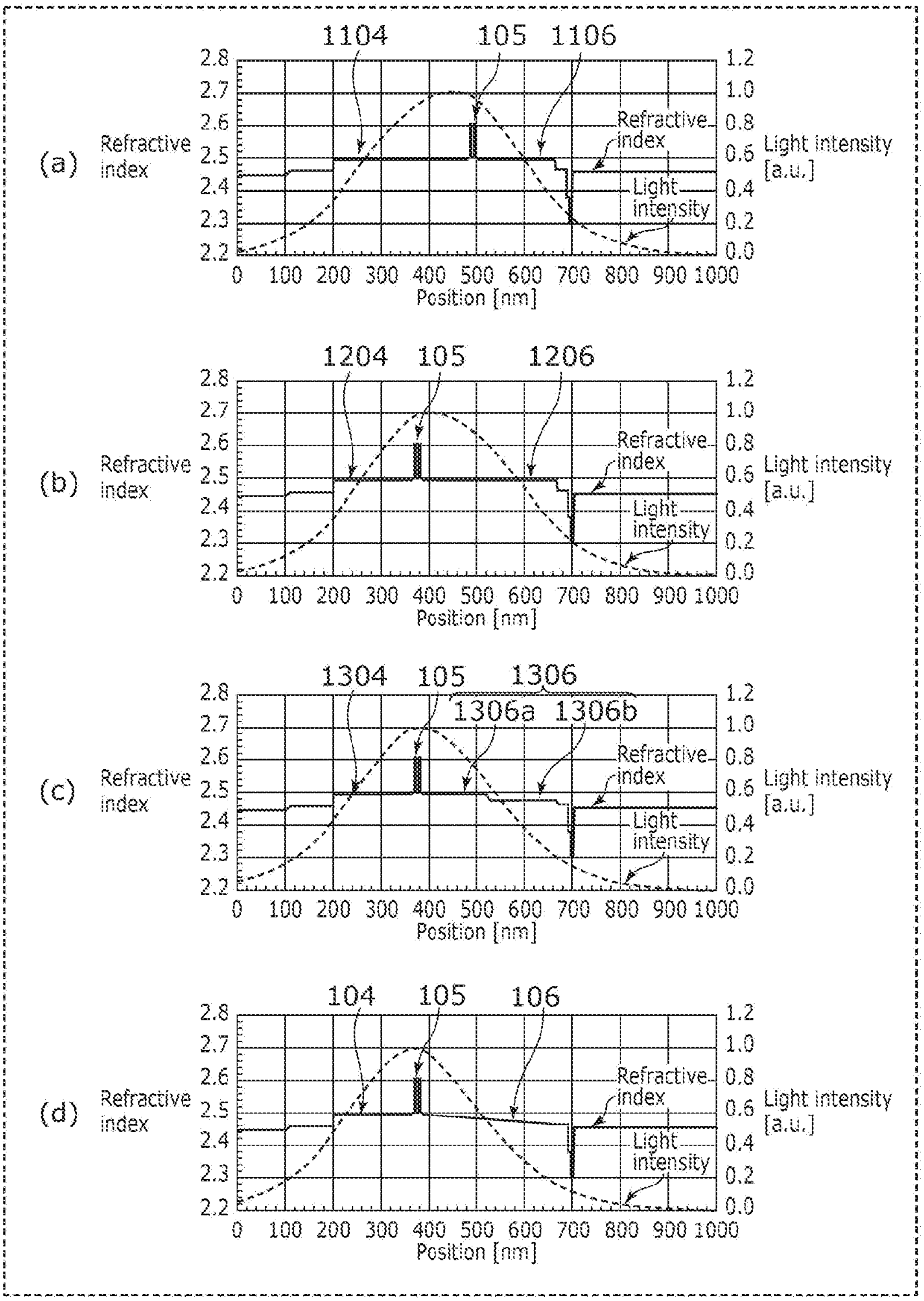
FIG. 6 illustrates graphs showing refractive index distributions and light intensity distributions in the stack direction of nitride-based semiconductor light-emitting elements according to Comparative Examples 1 to 3 and the nitride-based semiconductor light-emitting element according to Embodiment 1.
Figure 7:
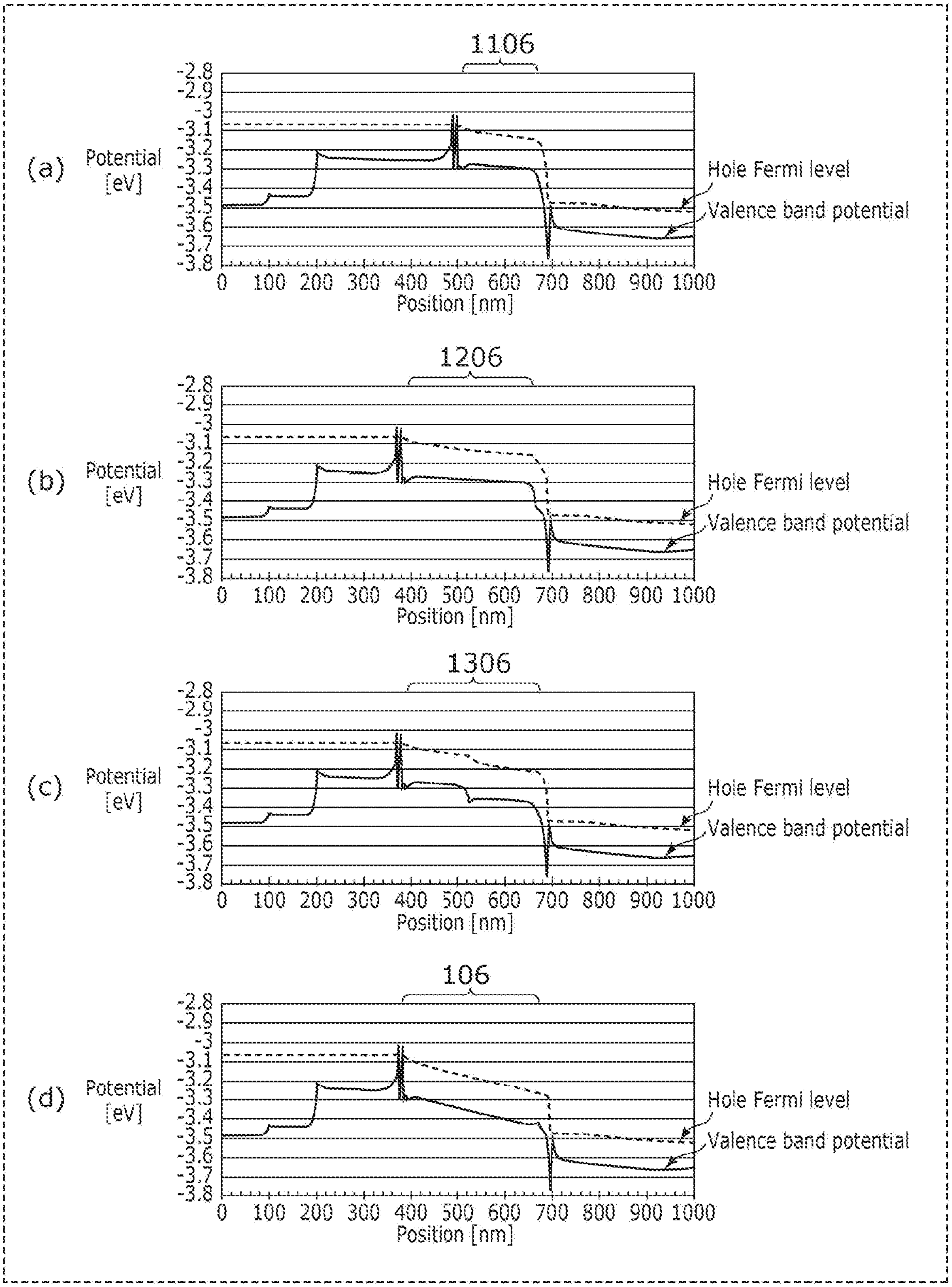
FIG. 7 illustrates graphs showing simulation results of distributions of valence band potentials and hole Fermi levels in the stack direction of the nitride-based semiconductor light-emitting elements according to Comparative Examples 1 to 3 and the nitride-based semiconductor light-emitting element according to Embodiment 1.
Figure 8:
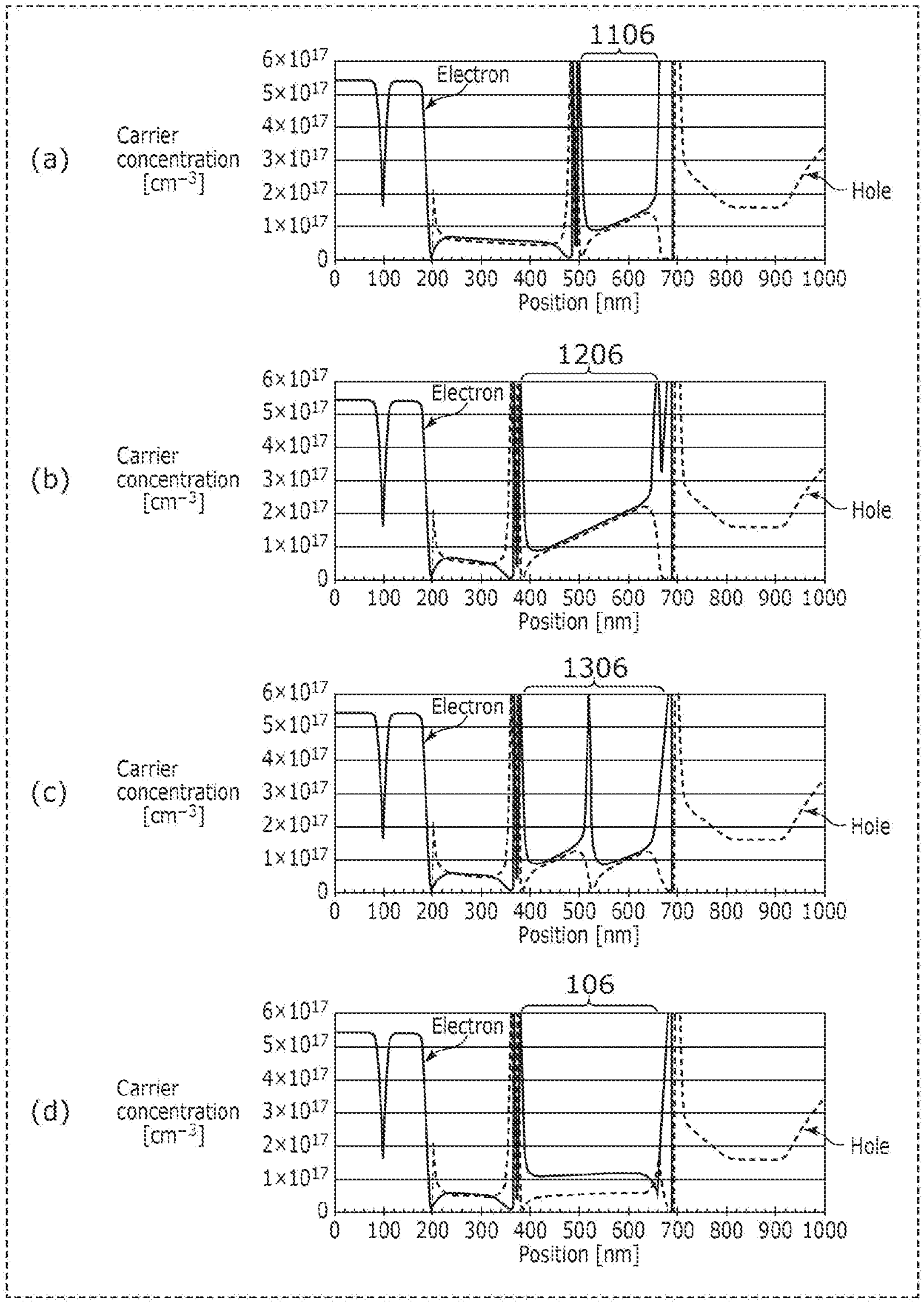
FIG. 8 illustrates graphs showing simulation results of distributions of carrier concentrations in the stack direction of the nitride-based semiconductor light-emitting elements according to Comparative Examples 1 to 3 and the nitride-based semiconductor light-emitting element according to Embodiment 1.

Effects of the above-described guide layers of nitride-based semiconductor light-emitting element 100 according to the present embodiment are to be described in comparison with nitride-based semiconductor light-emitting elements according to comparative examples, with reference to FIG. 6 to FIG. 8. FIG. 6 illustrates graphs showing refractive index distributions and light intensity distributions in the stack direction of the nitride-based semiconductor light-emitting elements according to Comparative Examples 1 to 3 and nitride-based semiconductor light-emitting element 100 according to the present embodiment. Graphs (a), (b), and (c) in FIG. 6 illustrate refractive index distributions and light intensity distributions of the nitride-based semiconductor light-emitting elements according to Comparative Examples 1, 2, and 3, respectively. Graph (d) in FIG. 6 illustrates a refractive index distribution and a light intensity distribution of nitride-based semiconductor light-emitting element 100 according to the present embodiment. The graphs in FIG. 6 show refractive index distributions with solid lines and light intensity distributions with broken lines.

FIG. 7 illustrates graphs showing simulation results of distributions of valence band potentials and hole Fermi levels in the stack direction of the nitride-based semiconductor light-emitting elements according to Comparative Examples 1 to 3 and nitride-based semiconductor light-emitting element 100 according to the present embodiment. Graphs (a), (b), and (c) in FIG. 7 illustrate distributions of valence band potentials and hole Fermi levels of the nitride-based semiconductor light-emitting elements according to Comparative Examples 1, 2, and 3, respectively. Graph (d) in FIG. 7 illustrates distributions of a valence band potential and a hole Fermi level of nitride-based semiconductor light-emitting element 100 according to the present embodiment. The graphs in FIG. 7 show valence band potentials with solid lines and hole Fermi levels with broken lines.

FIG. 8 illustrates graphs showing simulation results of distributions of carrier concentrations in the stack direction of the nitride-based semiconductor light-emitting elements according to Comparative Examples 1 to 3 and nitride-based semiconductor light-emitting element 100 according to the present embodiment. Graphs (a), (b), and (c) in FIG. 8 illustrate distributions of carrier concentrations of the nitride-based semiconductor light-emitting elements according to Comparative Examples 1, 2, and 3, respectively. Graph (d) in FIG. 8 illustrates distributions of carrier concentrations of nitride-based semiconductor light-emitting element 100 according to the present embodiment. The graphs in FIG. 8 show electron concentration distributions with solid lines and hole concentration distributions with broken lines.

The nitride-based semiconductor light-emitting elements according to Comparative Examples 1 to 3 are different from nitride-based semiconductor light-emitting element 100 according to the present embodiment in the configurations of the N-side guide layer and the P-side guide layer. The nitride-based semiconductor light-emitting element according to Comparative Example 1 illustrated in graph (a) in FIG. 6 includes N-side guide layer 1104 that is an undoped $In_{0.04}Ga_{0.96}N$ layer having a thickness of 280 nm, and P-side guide layer 1106 that is an undoped $In_{0.04}Ga_{0.96}N$ layer having a thickness of 160 nm. The nitride-based semiconductor light-emitting element according to Comparative Example 2 illustrated in graph (b) in FIG. 6 includes N-side guide layer 1204 that is an undoped $In_{0.04}Ga_{0.96}N$ layer having a thickness of 160 nm, and P-side guide layer 1206 that is an undoped $In_{0.04}Ga_{0.96}N$ layer having a thickness of 280 nm. The nitride-based semiconductor light-emitting element according to Comparative Example 3 illustrated in graph (c) in FIG. 6 includes N-side guide layer 1304 that is an undoped $In_{0.04}Ga_{0.96}N$ layer having a thickness of 160 nm, and P-side guide layer 1306 having a thickness of 280 nm. P-side guide layer 1306 of the nitride-based semiconductor light-emitting element according to Comparative Example 3 includes P-side first guide layer **1306*a* that is an undoped $In_{0.04}Ga_{0.96}N$ layer provided above active layer 105 and having a thickness of 140 nm, and P-side second guide layer 1306*b* that is an undoped $In_{0.02}Ga_{0.98}N$ layer provided above P-side first guide layer 1306*a*** and having a thickness of 140 nm.

In the nitride-based semiconductor light-emitting element according to Comparative Example 1, N-side guide layer 1104 and P-side guide layer 1106 have the same composition, and N-side guide layer 1104 has a thickness greater than that of P-side guide layer 1106. Thus, in the nitride-based semiconductor light-emitting element according to Comparative Example 1, a peak of the light intensity distribution in the stack direction is located in N-side guide layer 1104, as illustrated in graph (a) in FIG. 6. Accordingly, a light confinement coefficient of the nitride-based semiconductor light-emitting element according to Comparative Example 1 is 1.33%, which is a small value. As illustrated in graph (a) in FIG. 7, in P-side guide layer 1106, the hole Fermi level increases from the interface of P-side guide layer 1106 on the side far from active layer 105 to the interface thereof on the side close to active layer 105, in order to conduct holes from P-side guide layer 1106 to active layer 105. On the other hand, the valence band potential is substantially constant in the stack direction in P-side guide layer 1106. Accordingly, a difference between the hole Fermi level and the valence band potential in P-side guide layer 1106 is greater with a decrease in distance from active layer 105. Accordingly, as illustrated in graph (a) in FIG. 8, concentrations of holes and electrons of P-side guide layer 1106 in the stack direction, that is, a free carrier concentration increases with an increase in distance from active layer 105. In this manner, in the nitride-based semiconductor light-emitting element according to Comparative Example 1, the free carrier concentration of P-side guide layer 1106 in the stack direction cannot be reduced, and thus free carrier loss and a probability of non-radiative recombination cannot be reduced. In the nitride-based semiconductor light-emitting element according to Comparative Example 1, effective refractive index difference $\Delta N$ is $3.6\times10^{-3}$, positions P1 and P2 of light intensity distributions are −34.1 nm and −75.6 nm, respectively, and difference $\Delta P$ is 41.5 nm. Further, waveguide loss is 4.5 $cm^{-1}$, and free carrier loss (hereinafter, also referred to as "guide-layer free carrier loss") in each of N-side guide layer 1104 and P-side guide layer 1106 is 2.8 $cm^{-1}$.

In the nitride-based semiconductor light-emitting element according to Comparative Example 2, the thickness of P-side guide layer 1206 is greater than the thickness of N-side guide layer 1204, and thus as illustrated in graph (b) in FIG. 6, a peak of a light intensity distribution in the stack direction is closer to active layer 105 than that in the nitride-based semiconductor light-emitting element according to Comparative Example 1. Accordingly, in the nitride-based semiconductor light-emitting element according to Comparative Example 2, the light confinement coefficient is 1.37%, and is slightly improved as compared with the nitride-based semiconductor light-emitting element according to Comparative Example 1. However, as illustrated in graph (b) in FIG. 7, a difference between the hole Fermi level and the valence band potential in P-side guide layer 1206 increases with a decrease in distance from active layer 105, similarly to Comparative Example 1. Accordingly, as illustrated in graph (b) in FIG. 8, concentrations of holes and electrons, that is, a free carrier concentration of P-side guide layer 1206 in the stack direction increases with an increase in distance from active layer 105. In this manner, in the nitride-based semiconductor light-emitting element according to Comparative Example 2, the free carrier concentration of P-side guide layer 1206 in the stack direction cannot be reduced, and thus free carrier loss and a probability of non-radiative recombination cannot be reduced. In the nitride-based semiconductor light-emitting element according to Comparative Example 2, effective refractive index difference $\Delta N$ is $3.3\times10^{-3}$, positions P1 and P2 of light intensity distributions are 31.3 nm and 10.8 nm, respectively, and difference $\Delta P$ is 20.5 nm. Further, waveguide loss is 5.2 $cm^{-1}$, and guide-layer free carrier loss is 3.6 $cm^{-1}$.

In the nitride-based semiconductor light-emitting element according to Comparative Example 3, a refractive index of P-side second guide layer **1306*b* that is a region farther from active layer 105 is made smaller than the refractive index of P-side first guide layer 1306*a* that is a region closer to active layer 105. Accordingly, as illustrated in graph (c) in FIG. 6, a peak of a light intensity distribution in the stack direction is still closer to active layer 105 than the nitride-based semiconductor light-emitting element according to Comparative Example 2. Accordingly, in the nitride-based semiconductor light-emitting element according to Comparative Example 3, the light confinement coefficient is 1.47%, and is further improved as compared with the nitride-based semiconductor light-emitting element according to Comparative Example 2. However, in a hetero barrier at a boundary surface between P-side first guide layer 1306_a_ and P-side second guide layer 1306_b_, a region in a spike shape is generated in a distribution of a valence band potential due to piezoelectric polarization charge, as illustrated in graph (c) in FIG. 7. Accordingly, as illustrated in graph (c) in FIG. 8, an electron concentration of P-side guide layer 1306 in the stack direction increases in a spiking manner in a portion in which a valence band potential discontinuously changes. A concentration of holes in P-side guide layer 1306 also exceeds $1\times10^{17}$ $cm^{-3}$. In this manner, in the nitride-based semiconductor light-emitting element according to Comparative Example 3, the free carrier concentration of P-side guide layer 1306** in the stack direction cannot be reduced, and thus free carrier loss and a probability of non-radiative recombination cannot be reduced. In the nitride-based semiconductor light-emitting element according to Comparative Example 3, effective refractive index difference ΔN is $2.5\times10^{-3}$, positions P1 and P2 of light intensity distributions are 10.7 nm and 4.4 nm, respectively, and difference ΔP is 6.3 nm. Further, waveguide loss is 3.93 $cm^{-1}$, and guide-layer free carrier loss is 2.56 $cm^{-1}$.

In nitride-based semiconductor light-emitting element 100 according to the present embodiment, as illustrated in graph (d) in FIG. 6, the refractive index of P-side guide layer 106 increases with a decrease in distance from active layer 105, and thus the peak of the light intensity distribution in the stack direction can be brought close to active layer 105. Accordingly, in nitride-based semiconductor light-emitting element 100 according to the present embodiment, the light confinement coefficient is 1.49%, and is further improved as compared with the nitride-based semiconductor light-emitting element according to Comparative Example 3. Since the band gap energy of P-side guide layer 106 continuously and monotonically increases with an increase in distance from active layer 105, and thus as illustrated in graph (d) in FIG. 7, a valence band potential continuously decreases with an increase in distance from active layer 105. Accordingly, a difference between the hole Fermi level and the valence band potential can be made substantially constant in P-side guide layer 106. In this manner, as illustrated in graph (d) in FIG. 8, concentrations of holes and electrons of P-side guide layer 106 in the stack direction can be decreased and made substantially constant. Here, an amount of increase (ΔEgp) in band gap energy of P-side guide layer 106 in the stack direction is small, effects thereof are small, and thus ΔEgp may be preferably greater than or equal to 100 meV. On the contrary, if ΔEgp is excessively increased, band gap energy at an edge of P-side guide layer 106 on the side close to active layer 105 may be small, out of the band gap energy of P-side guide layer 106. In this case, a valence band potential of P-side guide layer 106 has an excessively great slope, and thus holes injected to active layer 105 leak to N-side guide layer 104 so that a leakage current is generated. Accordingly, ΔEgp may be less than or equal to 400 meV.

In this manner, in nitride-based semiconductor light-emitting element 100 according to the present embodiment, the free carrier concentration of P-side guide layer 106 in the stack direction can be reduced, and thus free carrier loss and a probability of non-radiative recombination can be reduced. In nitride-based semiconductor light-emitting element 100 according to the present embodiment, effective refractive index difference ΔN is $2.1\times10^{-3}$, positions P1 and P2 of light intensity distributions are 1.3 nm and −4.3 nm, respectively, and difference ΔP is 5.6 nm. In this manner, in the present embodiment, position P1 and difference ΔP can be reduced, and thus a nonlinear portion is not readily generated in the graph showing IL characteristics. Further, waveguide loss is 3.20 $cm^{-1}$, and a guide-layer free carrier loss is 1.8 $cm^{-1}$. Accordingly, in the present embodiment, waveguide loss and free carrier loss can be reduced, as compared with the comparative examples.

Figure 9:
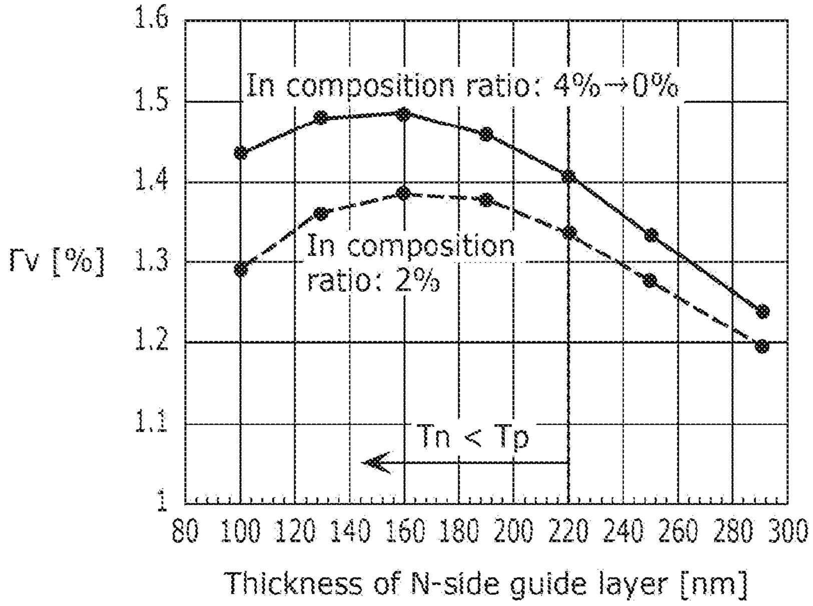
FIG. 9 is a graph showing simulation results of a relation between the thickness of an N-side guide layer according to Embodiment 1 and a light confinement coefficient.
Figure 10:
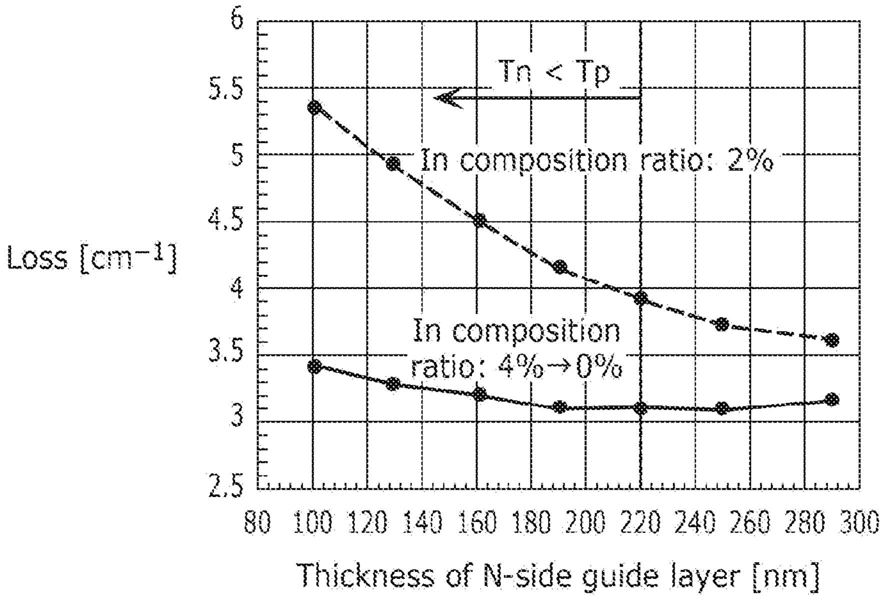
FIG. 10 is a graph showing simulation results of a relation between the thickness of the N-side guide layer according to Embodiment 1 and waveguide loss.
Figure 11:
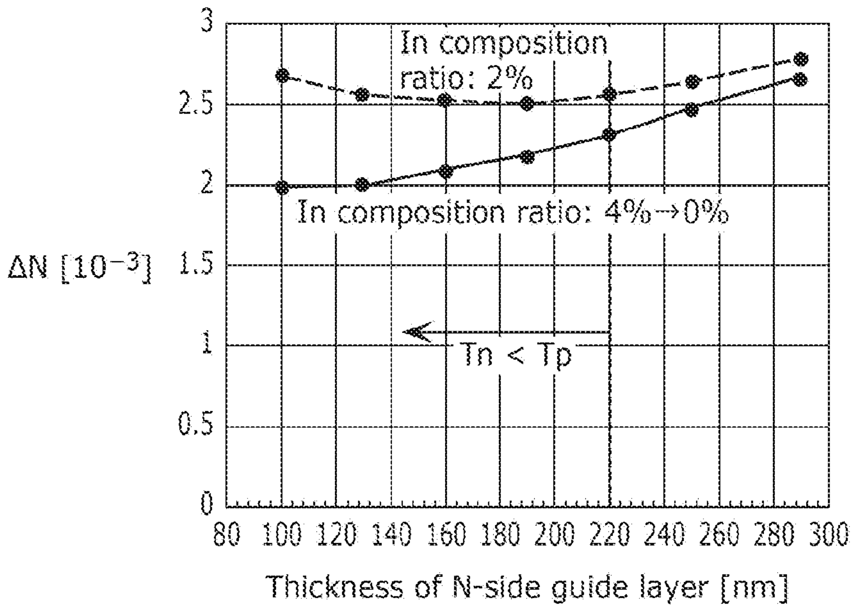
FIG. 11 is a graph showing simulation results of a relation between the thickness of the N-side guide layer according to Embodiment 1 and an effective refractive index difference.
Figure 12:
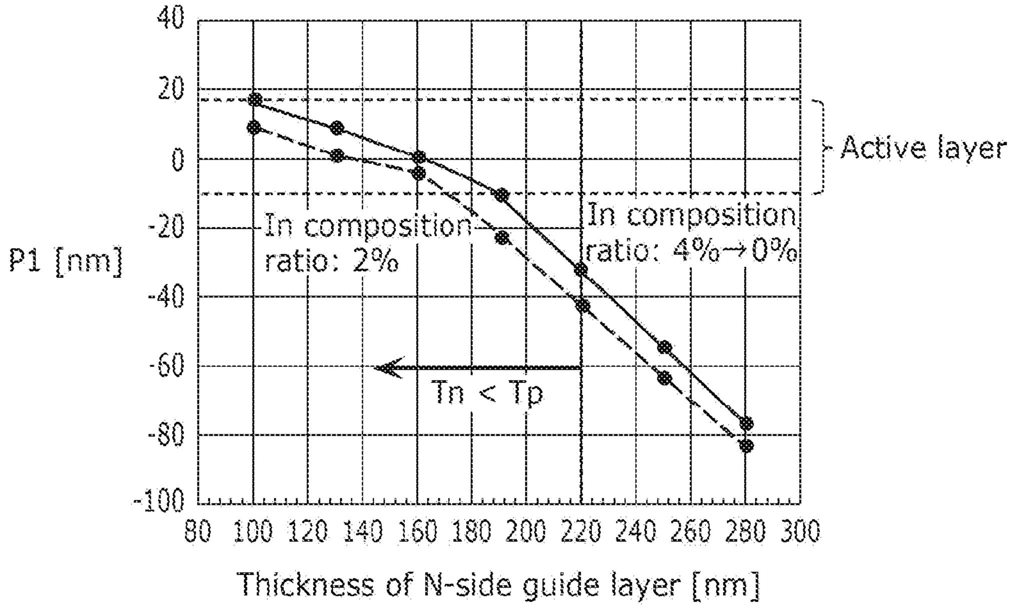
FIG. 12 is a graph showing simulation results of a relation between the thickness of the N-side guide layer according to Embodiment 1 and position P1.
Figure 13:
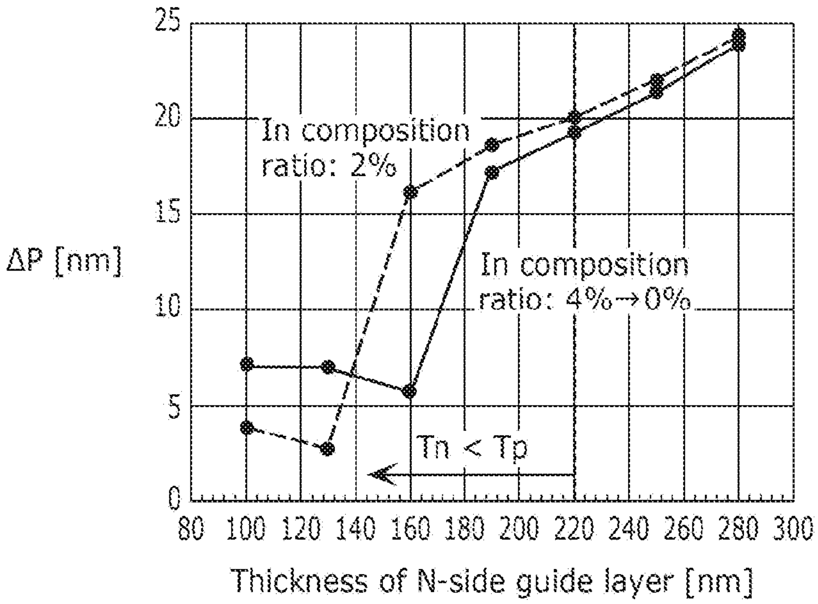
FIG. 13 is a graph showing simulation results of a relation between the thickness of the N-side guide layer according to Embodiment 1 and difference ΔP.

Next, effects of a relation between the thicknesses of N-side guide layer 104 and P-side guide layer 106 according to the present embodiment are to be described with reference to FIG. 9 to FIG. 13. FIG. 9 is a graph showing simulation results of a relation between the thickness of N-side guide layer 104 according to the present embodiment and a light confinement coefficient (Γv). FIG. 10 is a graph showing simulation results of a relation between the thickness of N-side guide layer 104 according to the present embodiment and waveguide loss. FIG. 11 is a graph showing simulation results of a relation between the thickness of N-side guide layer 104 according to the present embodiment and effective refractive index difference ΔN. FIG. 12 is a graph showing simulation results of a relation between the thickness of N-side guide layer 104 according to the present embodiment and position P1. FIG. 13 is a graph showing simulation results of a relation between the thickness of N-side guide layer 104 according to the present embodiment and difference ΔP. In the simulations as shown by FIG. 9 to FIG. 13, the thicknesses of N-side guide layer 104 and P-side guide layer 106 are changed while a total of the thicknesses of N-side guide layer 104 and P-side guide layer 106 is maintained constant at 440 nm. The In composition ratio of N-side guide layer 104 is 4%, whereas the In composition ratio of P-side guide layer 106 is 4% at and in the vicinity of the interface on the side close to active layer 105 and is 0% at and in the vicinity of the interface on the side far from active layer 105. The In composition ratio of P-side guide layer 106 is changed at a certain rate of change in the stack direction. FIG. 9 to FIG. 13 also illustrate simulation results in an example in which the In composition ratio of a P-side guide layer is 2% as a comparative example, using broken lines.

As illustrated in FIG. 9, the light confinement coefficient can be increased by setting thickness Tn of N-side guide layer 104 to a thickness less than 220 nm, or stated differently, by making thickness Tn smaller than thickness Tp of P-side guide layer 106. Note that thickness Tn of N-side guide layer 104 may be greater than or equal to 100 nm. In this manner, an excessive shift of a light intensity distribution from active layer 105 to P-side guide layer 106 due to thickness Tn of N-side guide layer 104 being excessively thin can be reduced. As illustrated in FIG. 9, also when the In composition ratio of P-side guide layer 106 is maintained constant at 2%, the light confinement coefficient can be increased by making the thickness of N-side guide layer 104 smaller than the thickness of P-side guide layer 106. But nevertheless, the light confinement coefficient can be further increased by continuously and monotonically decreasing the In composition ratio with an increase in distance from active layer 105, as with P-side guide layer 106 according to the present embodiment.

As illustrated in FIG. 10, as with P-side guide layer 106 according to the present embodiment, waveguide loss can be more decreased in the case where the In composition ratio is continuously and monotonically decreased with an increase in distance from active layer 105 than in the case where the In composition ratio is maintained constant at 2%. In the present embodiment, even if the thickness of N-side guide layer 104 is changed, waveguide loss can be maintained substantially constant at 3.5 $cm^{-1}$ or less.

As illustrated in FIG. 11, effective refractive index difference ΔN can be decreased by setting thickness Tn of N-side guide layer 104 to a thickness less than 220 nm, or stated differently, by making thickness Tn smaller than thickness Tp of P-side guide layer 106. As illustrated in FIG. 11, as with P-side guide layer 106 according to the present embodiment, effective refractive index difference ΔN can be more decreased in the case where the In composition ratio is continuously and monotonically decreased with an increase in distance from active layer 105 than in the case where the In composition ratio is maintained constant at 2%.

As illustrated in FIG. 12, the absolute value of position P1 can be decreased by setting thickness Tn of N-side guide layer 104 to a thickness less than 220 nm, or stated differently, by making thickness Tn smaller than thickness Tp of P-side guide layer 106. Note that thickness Tn of N-side guide layer 104 may be in a range from 100 nm to 190 nm. Stated differently, the thickness of N-side guide layer 104 may be set to a value in a range from 23% to 43% of a total of the thicknesses of N-side guide layer 104 and P-side guide layer 106. In this manner, position P1 can be placed at a position in a range from −7 nm to 18 nm, that is a peak of a light intensity distribution can be located within active layer 105. When the thickness of N-side guide layer 104 is set to a value in a range from 23% to 43% of a total of the thicknesses of N-side guide layer 104 and P-side guide layer 106 and distance dc is set to 40 nm, effective refractive index difference ΔN can be maintained in a range from $2\times10^{-3}$ to $2.2\times10^{-3}$, as illustrated in FIG. 11.

As illustrated in FIG. 12, also when the In composition ratio of P-side guide layer 106 is maintained constant at 2%, the absolute value of position P1 can be decreased by making the thickness of N-side guide layer 104 smaller than the thickness of P-side guide layer 106. But nevertheless, the absolute value of position P1 can be further decreased by continuously and monotonically decreasing the In composition ratio with an increase in distance from active layer 105 as with P-side guide layer 106 according to the present embodiment, when the thickness of N-side guide layer 104 is greater than or equal to 160 nm.

As illustrated in FIG. 13, difference ΔP can be decreased by setting thickness Tn of N-side guide layer 104 to a thickness less than 220 nm, or stated differently, by making thickness Tn smaller than thickness Tp of P-side guide layer 106. In particular, difference ΔP can be made 20 nm or less by setting the thickness of N-side guide layer 104 to a value in a range from 23% to 43% of a total of the thicknesses of N-side guide layer 104 and P-side guide layer 106. As illustrated in FIG. 13, also when the In composition ratio of P-side guide layer 106 is maintained constant at 2%, difference ΔP can be decreased by making the thickness of N-side guide layer 104 smaller than the thickness of P-side guide layer 106. But nevertheless, difference ΔP can be further decreased by continuously and monotonically decreasing the In composition ratio with an increase in distance from active layer 105, as with P-side guide layer 106 according to the present embodiment, when the thickness of N-side guide layer 104 is greater than or equal to 160 nm.

[1-3-2. Barrier Layers]

Next, effects of the configurations of the barrier layers of active layer 105 according to the present embodiment are to be described in comparison with a comparative example. In the present embodiment, as described above, band gap energy of each barrier layer is less than or equal to the smallest value of band gap energy of N-side guide layer 104 and P-side guide layer 106. Here, as a comparative example, a simulation result of a nitride-based semiconductor light-emitting element according to Comparative Example 4 is shown in which the composition of the barrier layers is undoped GaN, band gap energy of each barrier layer is made greater than or equal to the smallest value of band gap energy of N-side guide layer 104 and P-side guide layer 106, and the other configuration is the same as that of nitride-based semiconductor light-emitting element 100 according to the present embodiment. In the nitride-based semiconductor light-emitting element according to Comparative Example 4, a light confinement coefficient is 1.39%, effective refractive index difference ΔN is $2.3\times10^{-3}$, positions P1 and P2 of light intensity distributions are 0.35 nm and −21.9 nm, respectively, and difference ΔP is 22.3 nm. Further, waveguide loss is 3.4 $cm^{-1}$, and free carrier loss of the N-side guide layer and the P-side guide layer is 1.84 $cm^{-1}$. Accordingly, in the nitride-based semiconductor light-emitting element according to Comparative Example 4, band gap energy of the barrier layers is great, or stated differently, the refractive indices of the barrier layers are small, and thus a light confinement coefficient is smaller than that of nitride-based semiconductor light-emitting element 100 according to the present embodiment. Along with this, other evaluation indices of the nitride-based semiconductor light-emitting element according to Comparative Example 4 are not as good as those of nitride-based semiconductor light-emitting element 100 according to the present embodiment, except position P1.

As described above, in nitride-based semiconductor light-emitting element 100 according to the present embodiment, the light confinement coefficient can be increased by setting band gap energy of the barrier layers to a value less than or equal to the smallest value of band gap energy of N-side guide layer 104 and P-side guide layer 106. Along with this, since difference ΔP can be decreased, a nonlinear portion is not readily generated in a graph showing IL characteristics.

[1-3-3. P-Type Cladding Layer]

Figure 14:
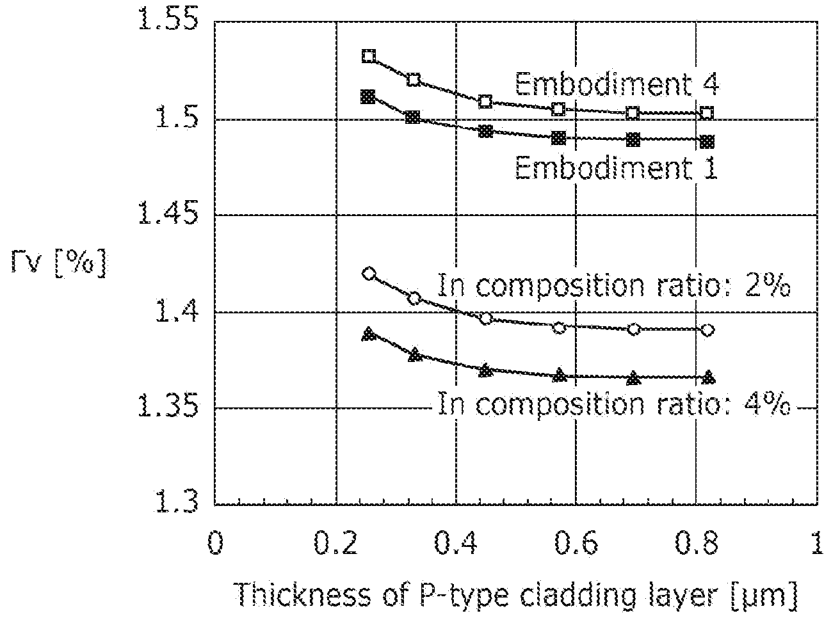
FIG. 14 is a graph showing simulation results of a relation between the thickness of a P-type cladding layer according to Embodiment 1 and a light confinement coefficient.
Figure 15:
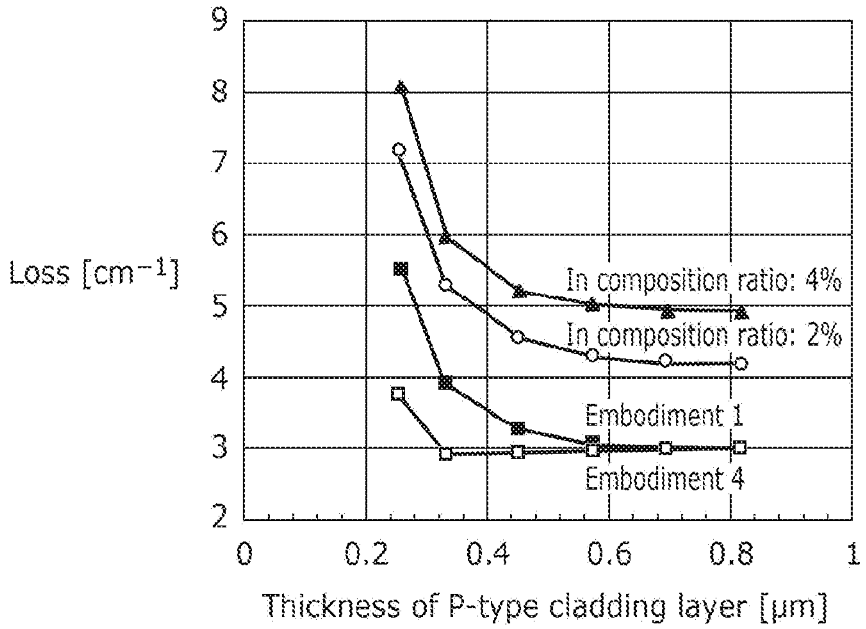
FIG. 15 is a graph showing simulation results of a relation between the thickness of the P-type cladding layer according to Embodiment 1 and waveguide loss.
Figure 16:
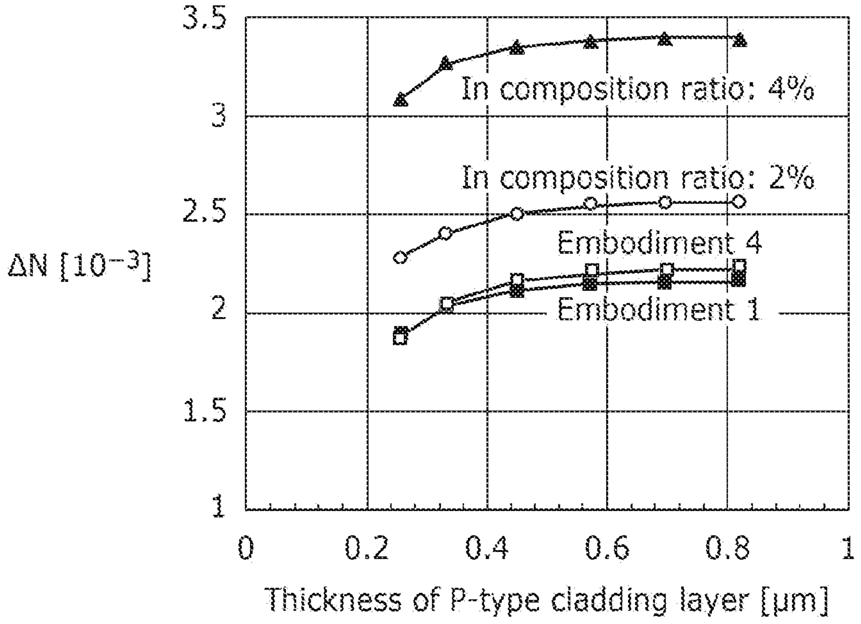
FIG. 16 is a graph showing simulation results of a relation between the thickness of the P-type cladding layer according to Embodiment 1 and an effective refractive index difference.
Figure 17:
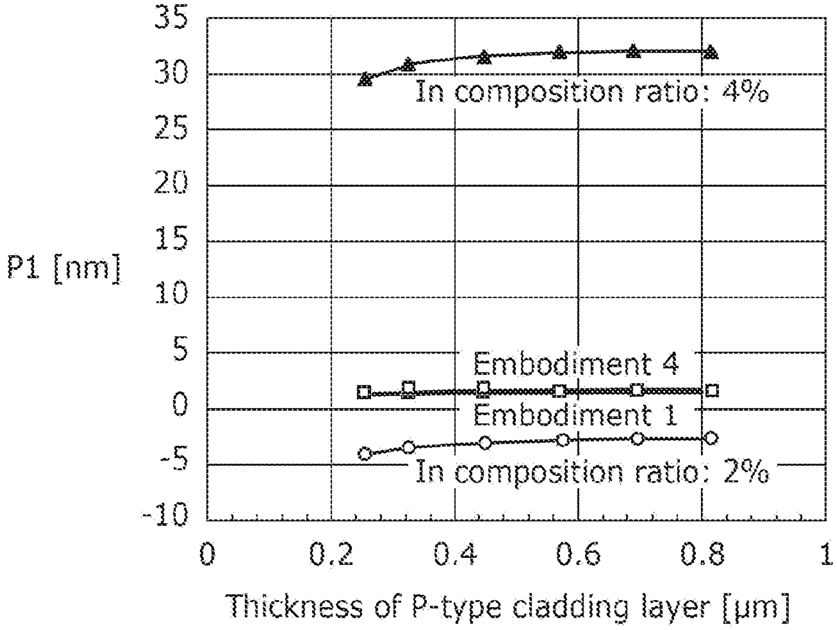
FIG. 17 is a graph showing simulation results of a relation between the thickness of the P-type cladding layer according to Embodiment 1 and position P1.
Figure 18:
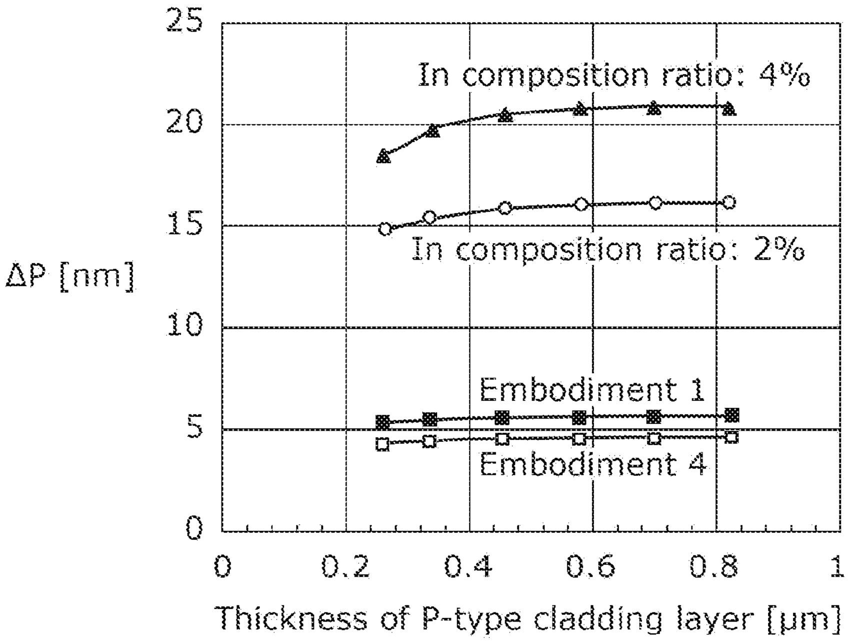
FIG. 18 is a graph showing simulation results of a relation between the thickness of the P-type cladding layer according to Embodiment 1 and difference ΔP.

Next, the thickness of P-type cladding layer 110 according to the present embodiment is to be described with reference to FIG. 14 to FIG. 18. FIG. 14 is a graph showing simulation results of a relation between the thickness of P-type cladding layer 110 according to the present embodiment and a light confinement coefficient (Γv). FIG. 15 is a graph showing simulation results of a relation between the thickness of P-type cladding layer 110 according to the present embodiment and waveguide loss. FIG. 16 is a graph showing simulation results of a relation between the thickness of P-type cladding layer 110 according to the present embodiment and effective refractive index difference ΔN. FIG. 17 is a graph showing simulation results of a relation between the thickness of P-type cladding layer 110 according to the present embodiment and position P1. FIG. 18 is a graph showing simulation results of a relation between the thickness of P-type cladding layer 110 according to the present embodiment and difference ΔP. FIG. 14 to FIG. 18 also illustrate simulation results of two comparative examples in which the In composition ratios of the P-side guide layer are maintained constant at 2% and 4%, as comparative examples. FIG. 14 to FIG. 18 also illustrate simulation results of nitride-based semiconductor light-emitting element 400 according to Embodiment 4 described later.

As illustrated in FIG. 14, in nitride-based semiconductor light-emitting element 100 according to the present embodiment, a light confinement coefficient can be made greater than those of the nitride-based semiconductor light-emitting elements according to the comparative examples. In the present embodiment, owing to the configurations of the guide layers and the barrier layers described above, the light confinement coefficient does not decrease even if the thickness of P-type cladding layer 110 is decreased to 250 nm.

As illustrated in FIG. 15, in nitride-based semiconductor light-emitting element 100 according to the present embodiment, waveguide loss can be made smaller than that of the nitride-based semiconductor light-emitting elements in the comparative example. In nitride-based semiconductor light-emitting element 100 according to the present embodiment, a great increase in waveguide loss can be reduced even when the thickness of P-type cladding layer 110 is decreased to about 300 nm.

As illustrated in FIG. 16, in nitride-based semiconductor light-emitting element 100 according to the present embodiment, effective refractive index difference ΔN can be made smaller than that of the nitride-based semiconductor light-emitting elements in the comparative examples.

As illustrated in FIG. 17 and FIG. 18, in nitride-based semiconductor light-emitting element 100 according to the present embodiment, the absolute value of position P1 and difference ΔP can be made smaller than those of the nitride-based semiconductor light-emitting elements in the comparative examples.

As described above, in nitride-based semiconductor light-emitting element 100 according to the present embodiment, the thickness of P-type cladding layer 110 can be decreased, and thus the operating voltage can be lowered.

Embodiment 2

A nitride-based semiconductor light-emitting element according to Embodiment 2 is to be described. The nitride-based semiconductor light-emitting element according to the present embodiment is different from nitride-based semiconductor light-emitting element 100 according to Embodiment 1 in the band gap energy distribution of the P-side guide layer. The following mainly describes differences of the nitride-based semiconductor light-emitting element according to the present embodiment from nitride-based semiconductor light-emitting element 100 according to Embodiment 1.

2-1. Overall Configuration

Figure 19:
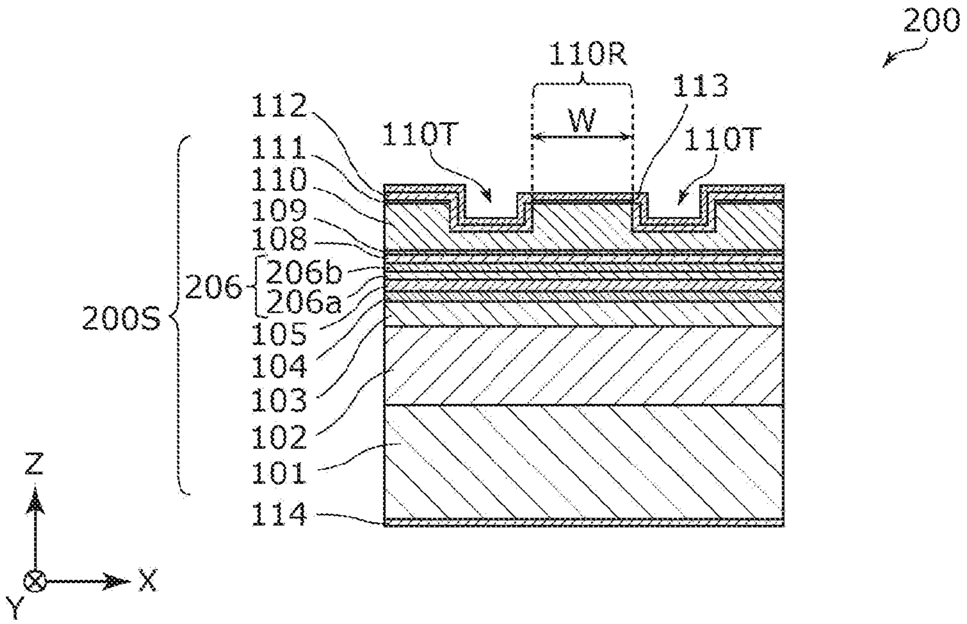
FIG. 19 is a schematic cross sectional view illustrating an overall configuration of a nitride-based semiconductor light-emitting element according to Embodiment 2.
Figure 20:
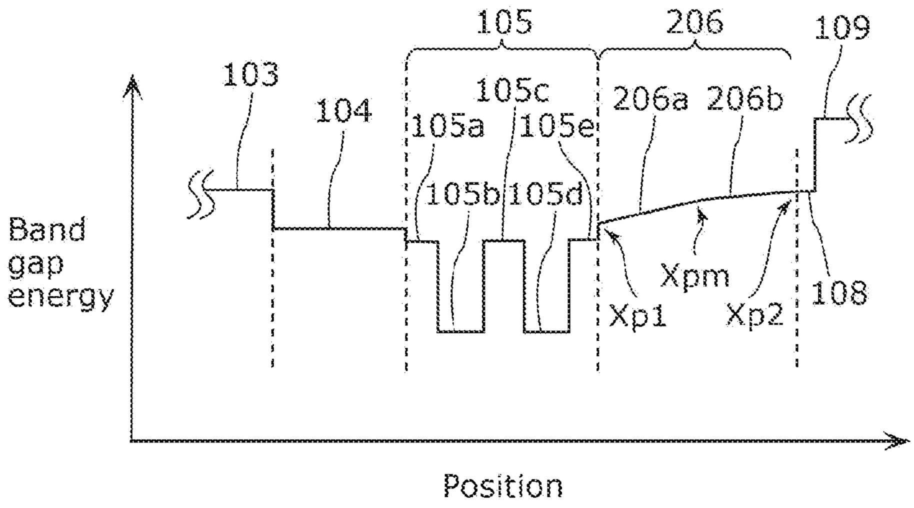
FIG. 20 is a schematic graph showing a distribution of band gap energy in an active layer and layers in the vicinity thereof in the nitride-based semiconductor light-emitting element according to Embodiment 2.

First, an overall configuration of the nitride-based semiconductor light-emitting element according to the present embodiment is to be described with reference to FIG. 19 and FIG. 20. FIG. 19 is a schematic cross sectional view illustrating an overall configuration of nitride-based semiconductor light-emitting element 200 according to the present embodiment. FIG. 20 is a schematic graph showing a distribution of band gap energy in active layer 105 and layers in the vicinity thereof in nitride-based semiconductor light-emitting element 200 according to the present embodiment.

As illustrated in FIG. 19, nitride-based semiconductor light-emitting element 200 according to the present embodiment includes semiconductor stack body 200S, current block layer 112, P-side electrode 113, and N-side electrode 114. Semiconductor stack body 200S includes substrate 101, N-type first cladding layer 102, N-type second cladding layer 103, N-side guide layer 104, active layer 105, P-side guide layer 206, intermediate layer 108, electron barrier layer 109, P-type cladding layer 110, and contact layer 111.

In P-side guide layer 206, similarly to P-side guide layer 106 according to Embodiment 1, band gap energy of P-side guide layer 206 monotonically increases with an increase in distance from active layer 105. P-side guide layer 206 includes a portion in which band gap energy continuously increases with an increase in distance from active layer 105. In the present embodiment, P-side guide layer 206 is an undoped $In_{Xp}G_{1-Xp}N$ layer, and an average rate of change in the In composition ratio of P-side guide layer 206 in the stack direction in a region from the interface on the side close to active layer 105 to a center portion in the stack direction is greater than an average rate of change in the In composition ratio of P-side guide layer 206 in the stack direction in a region from the center portion to the interface on the side close to P-type cladding layer 110. Stated differently, a curve showing a relation between a position in the stack direction and the In composition ratio of P-side guide layer 206 has a downward convex shape. Further stated differently, a curve showing a relation between a position in the stack direction and band gap energy of P-side guide layer 206 has an upward convex shape (see FIG. 20).

In the present embodiment, P-side guide layer 206 includes P-side first guide layer **206*a* and P-side second guide layer 206*b*. P-side first guide layer 206*a* is an undoped $In_{Xp}G_{1-Xp}N$ layer having a thickness of 140 nm. More specifically, P-side first guide layer 206*a* has a composition represented by $In_{Xp1}Ga_{1-Xp1}N$ at and in the vicinity of the interface on the side close to active layer 105, and has a composition represented by $In_{Xpm}Ga_{1-Xpm}N$ at and in the vicinity of the interface on the side far from active layer 105. In composition ratio Xp of P-side first guide layer 206*a* decreases at a certain rate of change with an increase in distance from active layer 105. P-side second guide layer 206*b* is an undoped $In_{Xp}G_{1-Xp}N$ layer having a thickness of 140 nm. More specifically, P-side second guide layer 206*b* has a composition represented by $In_{Xpm}Ga_{1-Xpm}N$ at and in the vicinity of the interface on the side close to active layer 105, and has a composition represented by $In_{Xp2}Ga_{1-Xp2}N$ at and in the vicinity of the interface on the side far from active layer 105. In composition ratio Xp of P-side second guide layer 206*b* decreases at a certain rate of change with an increase in distance from active layer 105**. In the present embodiment, Xp1=0.04, Xpm=0.02, and Xp2=0.

2-2. Effects

[2-2-1. Free Carrier Loss]

Figure 21:
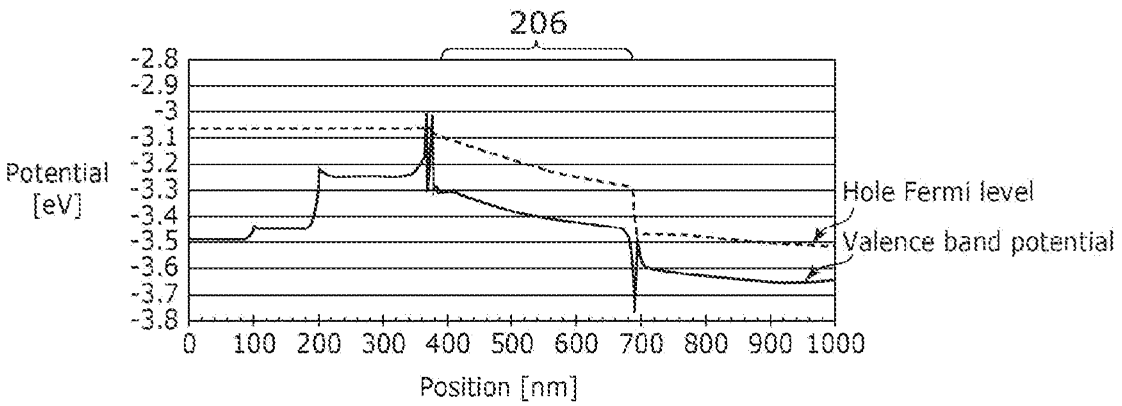
FIG. 21 is a graph showing simulation results of distributions of a valence band potential and a hole Fermi level in the stack direction of the nitride-based semiconductor light-emitting element according to Embodiment 2.
Figure 22:
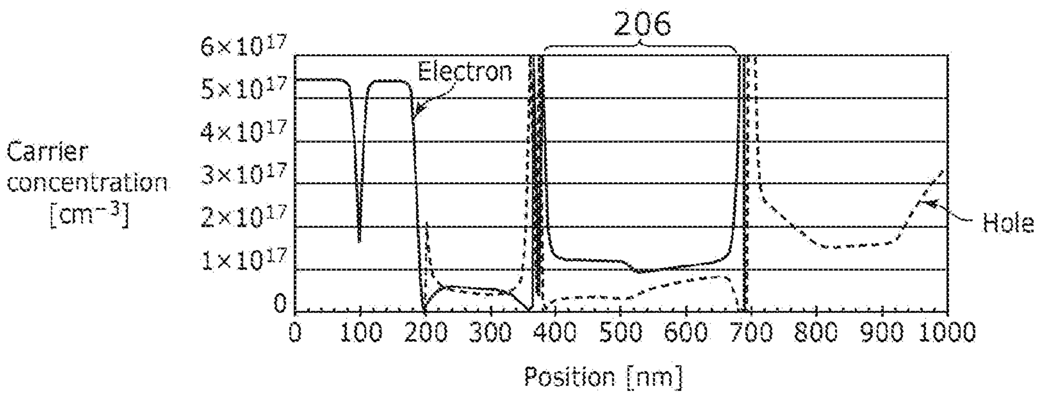
FIG. 22 is a graph showing simulation results of distributions of carrier concentrations in the stack direction of the nitride-based semiconductor light-emitting element according to Embodiment 2.

Next, effects on reduction in free carrier loss, which are yielded by nitride-based semiconductor light-emitting element 200 according to the present embodiment, are to be described with reference to FIG. 21 and FIG. 22. FIG. 21 is a graph showing simulation results of distributions of a valence band potential and a hole Fermi level in the stack direction of nitride-based semiconductor light-emitting element 200 according to the present embodiment. FIG. 22 is a graph showing simulation results of distributions of carrier concentrations in the stack direction of nitride-based semiconductor light-emitting element 200 according to the present embodiment.

As illustrated in FIG. 21, in nitride-based semiconductor light-emitting element 200 according to the present embodiment, a curve showing a valence band potential in P-side guide layer 206 has a downward convex shape. Here, a curve showing a hole Fermi level in P-side guide layer 206 has a downward convex shape. Accordingly, since a curve showing a valence band potential in P-side guide layer 206 is given a downward convex shape, a difference between a hole Fermi level and a valence band potential in P-side guide layer 206 can be maintained more uniform than that in P-side guide layer 106 according to Embodiment 1. Thus, as illustrated in FIG. 22, a concentration of holes particularly in a region of P-side guide layer 206 close to active layer 105 can be reduced. In this manner, free carrier loss in P-side guide layer 206 can be still further reduced. Specifically, in the present embodiment, guide-layer free carrier loss can be reduced down to 1.7 $cm^{-1}$, and waveguide loss can be reduced down to 3.1 $cm^{-1}$.

In nitride-based semiconductor light-emitting element 200 according to the present embodiment, effective refractive index difference ΔN is $1.9\times10^{-3}$, positions P1 and P2 of light intensity distributions are −3.8 nm and −15.8 nm, respectively, and difference ΔP is 12 nm. In this manner, in the present embodiment, position P1 and difference ΔP can be reduced, and thus a nonlinear portion is not readily generated in the graph showing IL characteristics.

[2-2-2. In Composition Ratio Distribution]

Figure 23:
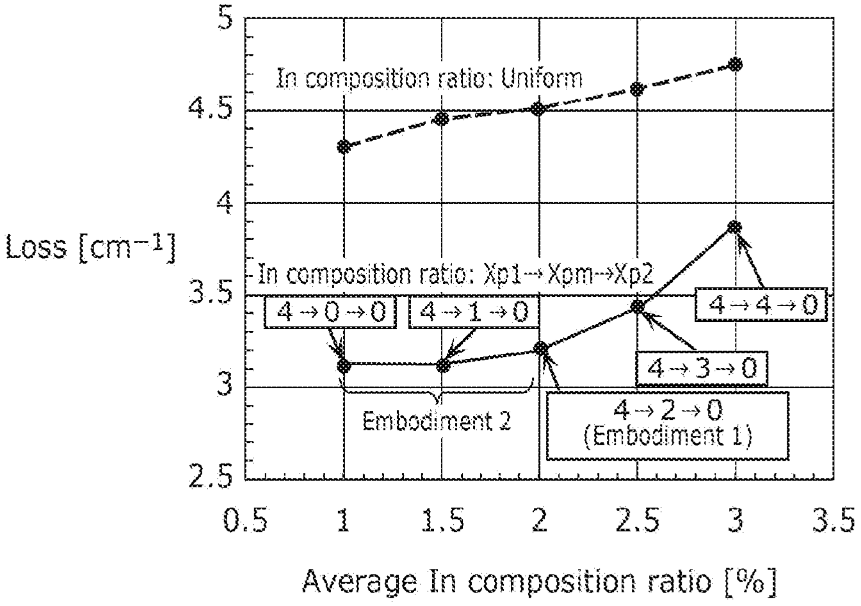
FIG. 23 is a graph showing simulation results of a relation between an average In composition ratio of a P-side guide layer 206 according to Embodiment 2 and waveguide loss.
Figure 24:
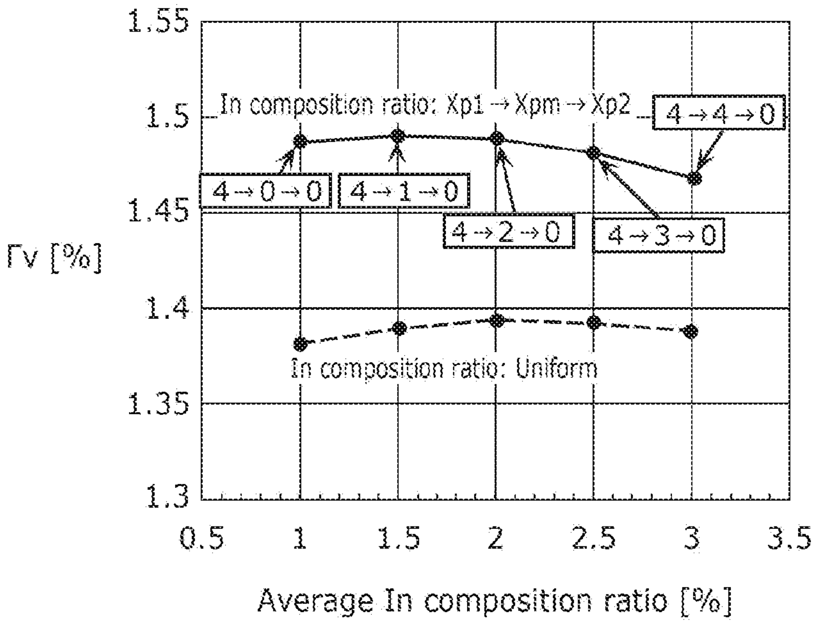
FIG. 24 is a graph showing simulation results of a relation between an average In composition ratio of the P-side guide layer according to Embodiment 2 and a light confinement coefficient.

Next, effects of the In composition ratio distribution in P-side guide layer 206 of nitride-based semiconductor light-emitting element 200 according to the present embodiment are to be described with reference to FIG. 23 and FIG. 24. FIG. 23 and FIG. 24 are graphs showing simulation results of a relation between (i) an average In composition ratio of P-side guide layer 206 according to the present embodiment and (ii) waveguide loss and a light confinement coefficient (Γv), respectively. FIG. 23 and FIG. 24 illustrate waveguide loss and a light confinement coefficient, respectively, when In composition ratio Xp1 of P-side guide layer 206 at and in the vicinity of the interface on the side close to active layer 105 is 4%, In composition ratio Xp2 of P-side guide layer 206 at and in the vicinity of the interface on the side far from active layer 105 is 0%, and the In composition ratio is continuously and monotonically decreased with an increase in distance from active layer 105. More specifically, FIG. 23 and FIG. 24 illustrate waveguide loss and a light confinement coefficient, respectively, when the average In composition ratio of P-side guide layer 206 is changed by changing In composition ratio Xpm in a center portion of P-side guide layer 206 in the stack direction. In the examples illustrated in FIG. 23 and FIG. 24, when the average In composition ratio is less than 2%, a curve showing a relation between the position of P-side guide layer 206 in the stack direction and the In composition ratio has a downward convex shape. For example, the case where the average In composition ratio is 1.5% corresponds to nitride-based semiconductor light-emitting element 200 according to the present embodiment, and the case where the average In composition ratio is 2% corresponds to nitride-based semiconductor light-emitting element 100 according to Embodiment 1. FIG. 23 and FIG. 24 also illustrate simulation results when the In composition ratio of the P-side guide layer is uniform, using broken lines.

As illustrated in FIG. 23 and FIG. 24, waveguide loss can be more decreased and a light confinement coefficient can be more increased in the case where the In composition ratio of P-side guide layer 206 is continuously and monotonically decreased with an increase in distance from active layer 105 than in the case where the In composition ratio of P-side guide layer 206 is uniform. When the average In composition ratio is less than 2%, waveguide loss can be still more decreased, and the light confinement coefficient can be still more increased.

[2-2-3. Relation of Thicknesses of Guide Layers]

Figure 25:
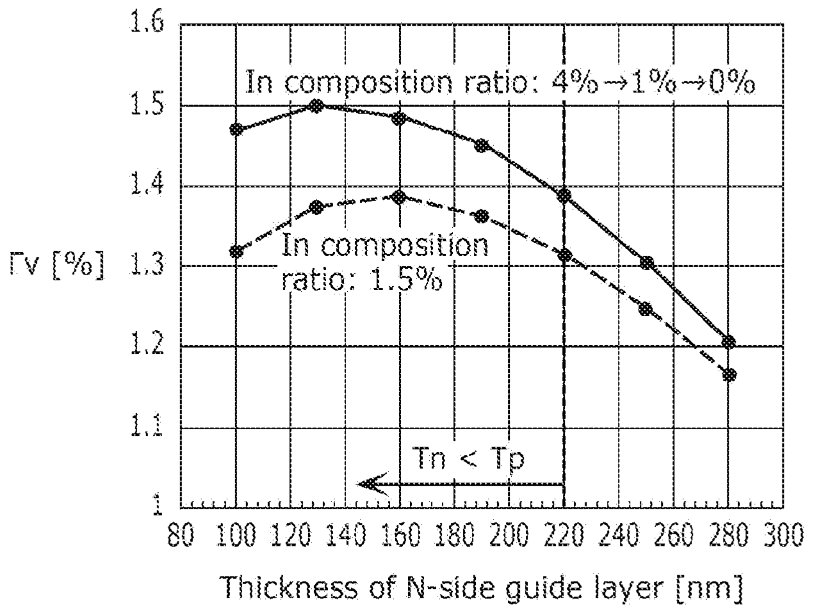
FIG. 25 is a graph showing simulation results of a relation between the thickness of an N-side guide layer according to Embodiment 2 and a light confinement coefficient.
Figure 26:
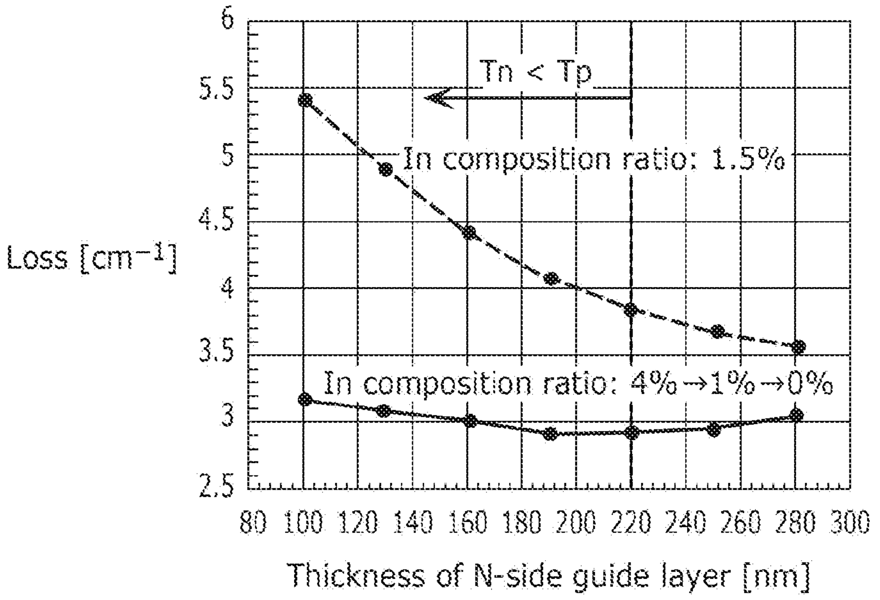
FIG. 26 is a graph showing simulation results of a relation between the thickness of the N-side guide layer according to Embodiment 2 and waveguide loss.
Figure 27:
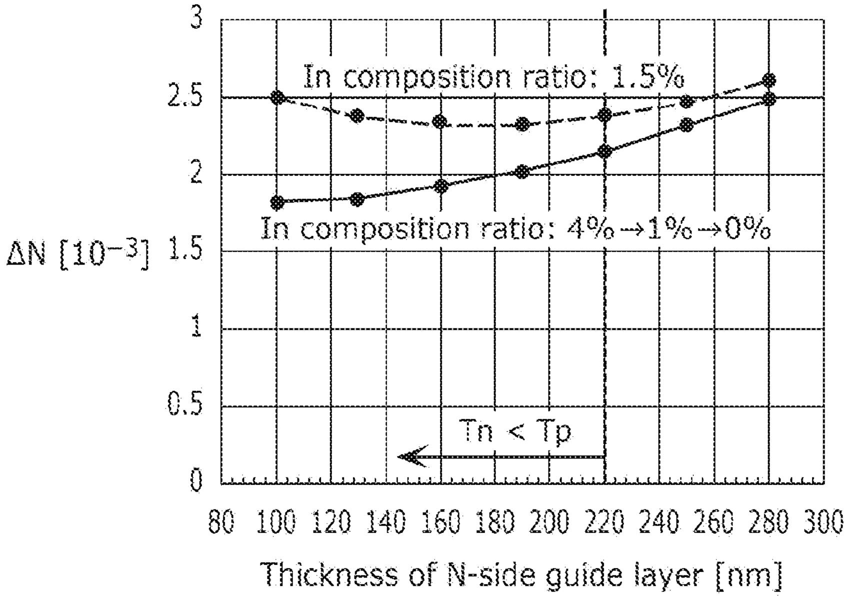
FIG. 27 is a graph showing simulation results of a relation between the thickness of the N-side guide layer according to Embodiment 2 and an effective refractive index difference.
Figure 28:
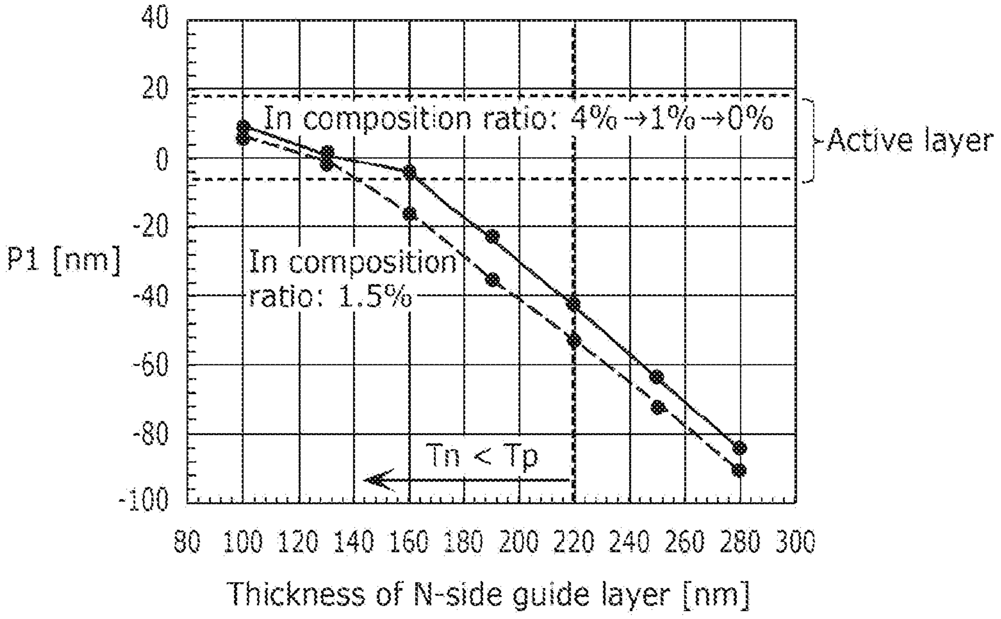
FIG. 28 is a graph showing simulation results of a relation between the thickness of the N-side guide layer according to Embodiment 2 and position P1.
Figure 29:
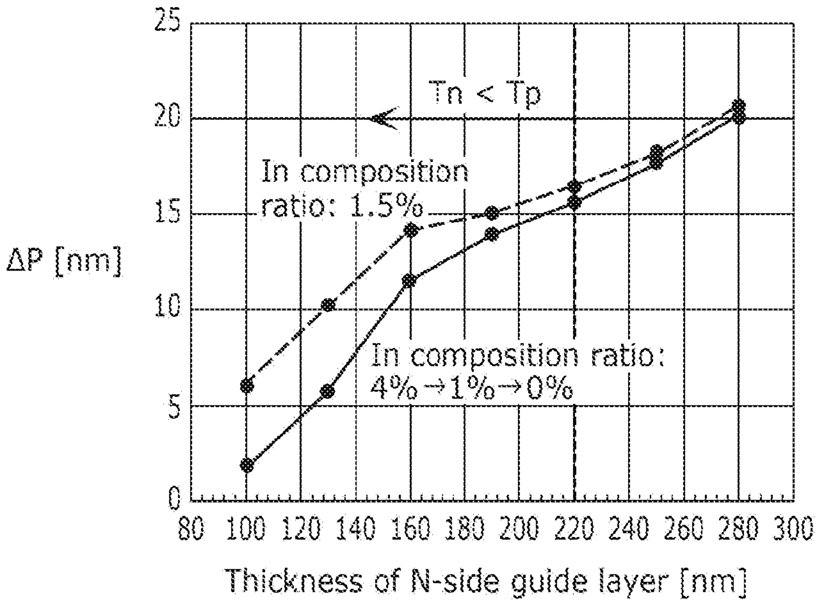
FIG. 29 is a graph showing simulation results of a relation between the thickness of the N-side guide layer according to Embodiment 2 and difference ΔP.

Next, effects of a relation between the thicknesses of N-side guide layer 104 and P-side guide layer 206 according to the present embodiment are to be described with reference to FIG. 25 to FIG. 29. FIG. 25 is a graph showing simulation results of a relation between the thickness of N-side guide layer 104 according to the present embodiment and a light confinement coefficient (Γv). FIG. 26 is a graph showing simulation results of a relation between the thickness of N-side guide layer 104 according to the present embodiment and waveguide loss. FIG. 27 is a graph showing simulation results of a relation between the thickness of N-side guide layer 104 according to the present embodiment and effective refractive index difference ΔN. FIG. 28 is a graph showing simulation results of a relation between the thickness of N-side guide layer 104 according to the present embodiment and position P1. FIG. 29 is a graph showing simulation results of a relation between the thickness of N-side guide layer 104 according to the present embodiment and difference ΔP. In the simulations as shown by FIG. 25 to FIG. 29, the thicknesses of N-side guide layer 104 and P-side guide layer 206 are changed while a total of the thicknesses of N-side guide layer 104 and P-side guide layer 206 is maintained constant at 440 nm. The In composition ratio of N-side guide layer 104 is 4%, whereas the In composition ratio of P-side guide layer 106 is 4% at and in the vicinity of the interface on the side close to active layer 105, is 0% at and in the vicinity of the interface on the side far from active layer 105, and is 1% in a center portion of P-side guide layer 206 in the stack direction. FIG. 25 to FIG. 29 also illustrate simulation results in an example in which the In composition ratio of the P-side guide layer is constant at 1.5% as a comparative example, using broken lines.

As illustrated in FIG. 25, the light confinement coefficient can be increased by setting thickness Tn of N-side guide layer 104 to a thickness less than 220 nm, or stated differently, by making thickness Tn smaller than thickness Tp of P-side guide layer 206. Note that thickness Tn of N-side guide layer 104 may be greater than or equal to 100 nm. In this manner, an excessive shift of a light intensity distribution from active layer 105 toward P-side guide layer 206 due to thickness Tn of N-side guide layer 104 being excessively thin can be reduced. As illustrated in FIG. 25, also when the In composition ratio of P-side guide layer 206 is maintained constant at 1.5%, the light confinement coefficient can be increased by making the thickness of N-side guide layer 104 smaller than the thickness of P-side guide layer 206. But nevertheless, the light confinement coefficient can be further increased by continuously and monotonically decreasing the In composition ratio with an increase in distance from active layer 105 as with P-side guide layer 206 according to the present embodiment.

As illustrated in FIG. 26, as with P-side guide layer 206 according to the present embodiment, waveguide loss can be more decreased in the case where the In composition ratio is continuously and monotonically decreased with an increase in distance from active layer 105 than in the case where the In composition ratio is maintained constant at 1.5%. In the present embodiment, even if the thickness of N-side guide layer 104 is changed, waveguide loss can be maintained substantially constant at 3.2 $cm^{-1}$ or less.

As illustrated in FIG. 27, effective refractive index difference ΔN can be decreased by setting thickness Tn of N-side guide layer 104 to a thickness less than 220 nm, or stated differently, by making thickness Tn smaller than thickness Tp of P-side guide layer 206. As illustrated in FIG. 27, as with P-side guide layer 206 according to the present embodiment, effective refractive index difference ΔN can be more decreased in the case where the In composition ratio is continuously and monotonically decreased with an increase in distance from active layer 105 than in the case where the In composition ratio is maintained constant at 1.5%.

As illustrated in FIG. 28, the absolute value of position P1 can be decreased by setting thickness Tn of N-side guide layer 104 to a thickness less than 220 nm, or stated differently, by making thickness Tn smaller than thickness Tp of P-side guide layer 206. Note that thickness Tn of N-side guide layer 104 may be in a range from 100 nm to 165 nm. Stated differently, the thickness of N-side guide layer 104 may be set to a value in a range from 23% to 38% of a total of the thicknesses of N-side guide layer 104 and P-side guide layer 206. In this manner, position P1 can be placed at a position in a range from −7 nm to 18 nm, that is, a peak of a light intensity distribution can be located within active layer 105. When the thickness of N-side guide layer 104 is set to a value in a range from 23% to 38% of a total of the thicknesses of N-side guide layer 104 and P-side guide layer 206 and distance dc is set to 40 nm, effective refractive index difference ΔN can be maintained in a range from $1.85\times10^{-3}$ to $2.0\times10^{-3}$, as illustrated in FIG. 27.

As illustrated in FIG. 28, also when the In composition ratio of P-side guide layer 206 is maintained constant at 1.5%, the absolute value of position P1 can be decreased by making the thickness of N-side guide layer 104 smaller than the thickness of P-side guide layer 206. But nevertheless, the absolute value of position P1 can be further decreased by continuously and monotonically decreasing the In composition ratio with an increase in distance from active layer 105, as with P-side guide layer 206 according to the present embodiment, when the thickness of N-side guide layer 104 is greater than or equal to 160 nm.

As illustrated in FIG. 29, difference ΔP can be decreased by setting thickness Tn of N-side guide layer 104 to a thickness less than 220 nm, or stated differently, by making thickness Tn smaller than thickness Tp of P-side guide layer 206. In particular, the thickness of N-side guide layer 104 is set to a value in a range from 23% to 38% of a total of the thicknesses of N-side guide layer 104 and the P-side guide layer 206, thus making difference ΔP 13 nm or less. As illustrated in FIG. 29, also when the In composition ratio of P-side guide layer 206 is maintained constant at 1.5%, difference ΔP can be decreased by making the thickness of N-side guide layer 104 smaller than the thickness of P-side guide layer 206. But nevertheless, difference ΔP can be further decreased by continuously and monotonically decreasing the In composition ratio with an increase in distance from active layer 105, as with P-side guide layer 206 according to the present embodiment.

[2-2-4. Barrier Layer]

Next, effects of the configurations of the barrier layers of active layer 105 according to the present embodiment are to be described in comparison with a comparative example. In the present embodiment, band gap energy of each barrier layer is less than or equal to the smallest value of band gap energy of N-side guide layer 104 and P-side guide layer 206. Here, as a comparative example, a simulation result of a nitride-based semiconductor light-emitting element according to Comparative Example 5 is shown in which the composition of the barrier layers is undoped GaN, band gap energy of the barrier layers is made greater than or equal to the smallest value of the band gap energy of N-side guide layer 104 and P-side guide layer 206, and the other configuration is the same as that of nitride-based semiconductor light-emitting element 200 according to the present embodiment. In the nitride-based semiconductor light-emitting element according to Comparative Example 5, a light confinement coefficient is 1.37%, effective refractive index difference ΔN is $2.7\times10^{-3}$, positions P1 and P2 of light intensity distributions are 28.1 nm and 9.2 nm, respectively, and difference ΔP is 18.9 nm. Further, waveguide loss is 4 $cm^{-1}$, and free carrier loss of the N-side guide layer and the P-side guide layer is 2.5 $cm^{-1}$. Accordingly, in the nitride-based semiconductor light-emitting element according to Comparative Example 5, band gap energy of the barrier layers is great, or stated differently, the refractive indices of the barrier layers are small, and thus a light confinement coefficient is smaller than that of nitride-based semiconductor light-emitting element 200 according to the present embodiment. Along with this, other evaluation indices of the nitride-based semiconductor light-emitting element according to Comparative Example 5 are not as good as those of nitride-based semiconductor light-emitting element 200 according to the present embodiment, except position P2.

As described above, in nitride-based semiconductor light-emitting element 200 according to the present embodiment, the light confinement coefficient can be increased by setting band gap energy of the barrier layers to a value less than or equal to the smallest value of band gap energy of N-side guide layer 104 and P-side guide layer 206. Along with this, since difference ΔP can be decreased, a nonlinear portion is not readily generated in a graph showing IL characteristics.

Embodiment 3

A nitride-based semiconductor light-emitting element according to Embodiment 3 is to be described. The nitride-based semiconductor light-emitting element according to the present embodiment is different from nitride-based semiconductor light-emitting element 100 according to Embodiment 1 in the relation between the Al composition ratios of the N-type first cladding layer and the P-type cladding layer and the configuration of the electron barrier layer. The following mainly describes differences of the nitride-based semiconductor light-emitting element according to the present embodiment from nitride-based semiconductor light-emitting element 100 according to Embodiment 1, with reference to FIG. 30.

Figure 30:
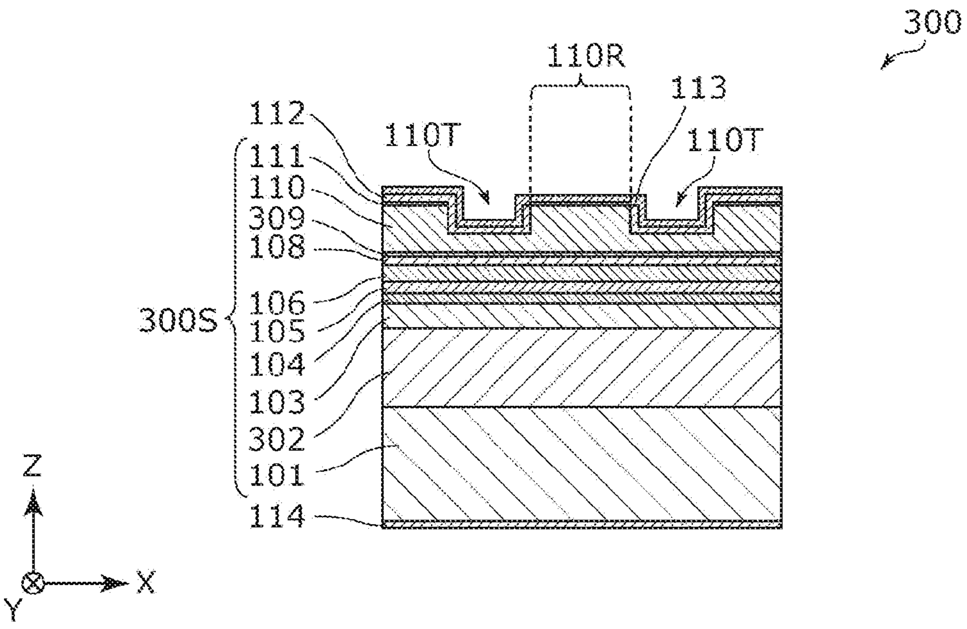
FIG. 30 is a schematic cross sectional view illustrating an overall configuration of a nitride-based semiconductor light-emitting element according to Embodiment 3.

FIG. 30 is a schematic cross sectional view illustrating an overall configuration of nitride-based semiconductor light-emitting element 300 according to the present embodiment.

As illustrated in FIG. 30, nitride-based semiconductor light-emitting element 300 according to the present embodiment includes semiconductor stack body 300S, current block layer 112, P-side electrode 113, and N-side electrode 114. Semiconductor stack body 300S includes substrate 101, N-type first cladding layer 302, N-type second cladding layer 103, N-side guide layer 104, active layer 105, P-side guide layer 106, intermediate layer 108, electron barrier layer 309, P-type cladding layer 110, and contact layer 111.

N-type first cladding layer 302 according to the present embodiment is an N-type $Al_{0.036}Ga_{0.964}N$ layer having a thickness of 1200 nm. N-type first cladding layer 302 is doped with Si having a concentration of $1\times10^{18}$ $cm^{-3}$, as an impurity.

P-type cladding layer 110 according to the present embodiment is a P-type $Al_{0.026}Ga_{0.974}N$ layer having a thickness of 450 nm, as stated above.

In the present embodiment, N-type first cladding layer 302 and P-type cladding layer 110 each include Al, and the following relation is satisfied, where Tnc denotes the Al composition ratio of N-type first cladding layer 302, and Ypc denotes the Al composition ratio of P-type cladding layer 110: Ync>Ypc (4)

Here, at least one of N-type first cladding layer 302 or P-type cladding layer 110 has a superlattice structure, composition ratios Ync and Ypc each show an average Al composition ratio. For example, when N-type first cladding layer 302 includes a plurality of GaN layers each having a thickness of 2 nm, a plurality of AlGaN layers each having a thickness of 2 nm and an Al composition ratio of 0.07, and the GaN layers and the AlGaN layers are alternately stacked, Ync is 0.035 that is an average Al composition ratio of entire N-type first cladding layer 302. When P-type cladding layer 110 includes a plurality of GaN layers each having a thickness of 2 nm, a plurality of AlGaN layers each having a thickness of 2 nm and an Al composition ratio of 0.07, and the GaN layers and the AlGaN layers are alternately stacked, Ypc is 0.035 that is an average Al composition ratio of entire P-type cladding layer 110.

Accordingly, the refractive index of N-type first cladding layer 302 can be made smaller than the refractive index of P-type cladding layer 110. Thus, even if the thickness of P-type cladding layer 110 is reduced in order to lower the operating voltage of nitride-based semiconductor light-emitting element 300, the refractive index of N-type first cladding layer 302 is smaller than the refractive index of P-type cladding layer 110, and thus a shift of a peak of a light intensity distribution in the stack direction from active layer 105 toward N-type first cladding layer 302 can be decreased.

Electron barrier layer 309 is a nitride-based semiconductor layer that is provided above active layer 105 and includes at least Al. In the present embodiment, electron barrier layer 309 is provided between intermediate layer 108 and P-type cladding layer 110. Electron barrier layer 309 is a P-type AlGaN layer having a thickness of 5 nm. Electron barrier layer 309 includes an Al composition ratio increasing region in which the Al composition ratio monotonically increases with a decrease in distance from P-type cladding layer 110. Here, a configuration in which the Al composition ratio monotonically increases includes a configuration that includes a region in which the Al composition ratio is constant in the stack direction. For example, the configuration in which the Al composition ratio monotonically increases also includes a configuration in which the Al composition ratio increases stepwise. In electron barrier layer 309 according to the present embodiment, entire electron barrier layer 309 is the Al composition ratio increasing region, and has an Al composition ratio that increases at a certain rate of change in the stack direction. Specifically, electron barrier layer 309 has a composition represented by $Al_{0.02}Ga_{0.98}N$ at and in the vicinity of the interface thereof with intermediate layer 108. The Al composition ratio of electron barrier layer 309 monotonically increases with a decrease in distance from P-type cladding layer 110. Electron barrier layer 309 has a composition represented by $Al_{0.36}Ga_{0.64}N$, at and in the vicinity of the interface thereof with P-type cladding layer 110. Electron barrier layer 309 is doped with Mg having a concentration of $1\times10^{19}$ $cm^{-3}$, as an impurity.

Electron barrier layer 309 can prevent leakage of electrons from active layer 105 to P-type cladding layer 110. Further, electron barrier layer 309 has the Al composition ratio increasing region in which the Al composition ratio monotonically increases, and thus a potential barrier in a valence band of electron barrier layer 309 can be decreased. Accordingly, holes readily flow from P-type cladding layer 110 to active layer 105. Thus, as in the present embodiment, also when P-side guide layer 106 that is an undoped layer has a great thickness, an increase in electrical resistance of nitride-based semiconductor light-emitting element 300 can be reduced. In this manner, the operating voltage of nitride-based semiconductor light-emitting element 300 can be lowered. Since self-heating of nitride-based semiconductor light-emitting element 300 during operation can be reduced, temperature characteristics of nitride-based semiconductor light-emitting element 300 can be enhanced. Thus, nitride-based semiconductor light-emitting element 300 can perform high-power operation.

According to the present embodiment, nitride-based semiconductor light-emitting element 300 can be produced, in which effective refractive index difference $\Delta N$ is $1.9\times10^{-3}$, position P1 is 5.3 nm, difference $\Delta P$ is 4.2 nm, a coefficient of confinement of light in active layer 105 is 1.55%, waveguide loss is 3.6 $cm^{-1}$, and guide-layer free carrier loss is 2.4 $cm^{-1}$.

Embodiment 4

A nitride-based semiconductor light-emitting element according to Embodiment 4 is to be described. The nitride-based semiconductor light-emitting element according to the present embodiment is different from nitride-based semiconductor light-emitting element 300 according to Embodiment 3 mainly in that a light-transmitting conductive film is provided above a contact layer at a ridge. The following mainly describes differences of the nitride-based semiconductor light-emitting element according to the present embodiment from nitride-based semiconductor light-emitting element 300 according to Embodiment 3, with reference to FIG. 31.

Figure 31:
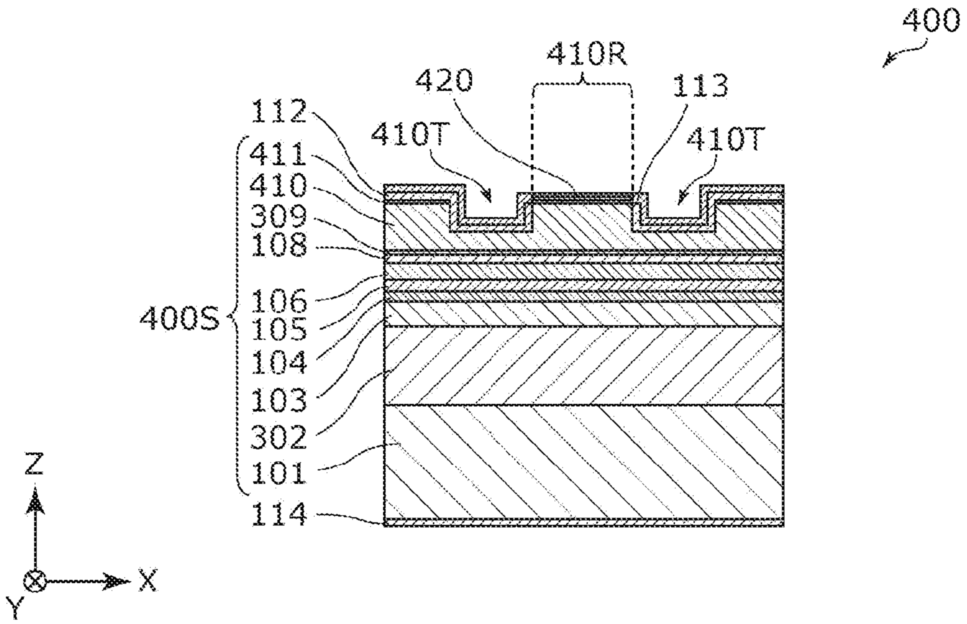
FIG. 31 is a schematic cross sectional view illustrating an overall configuration of a nitride-based semiconductor light-emitting element according to Embodiment 4.

FIG. 31 is a schematic cross sectional view illustrating an overall configuration of nitride-based semiconductor light-emitting element 400 according to the present embodiment. As illustrated in FIG. 31, nitride-based semiconductor light-emitting element 400 according to the present embodiment includes semiconductor stack body 400S, current block layer 112, P-side electrode 113, N-side electrode 114, and light-transmitting conductive film 420. Semiconductor stack body 400S includes substrate 101, N-type first cladding layer 302, N-type second cladding layer 103, N-side guide layer 104, active layer 105, P-side guide layer 106, intermediate layer 108, electron barrier layer 309, P-type cladding layer 410, and contact layer 411.

P-type cladding layer 410 according to the present embodiment is provided between electron barrier layer 309 and contact layer 411. P-type cladding layer 410 has a smaller refractive index and greater band gap energy than active layer 105. In the present embodiment, P-type cladding layer 410 is a P-type $Al_{0.026}Ga_{0.974}N$ layer having a thickness of 330 nm. P-type cladding layer 410 is doped with Mg as an impurity. An impurity concentration at an edge portion of P-type cladding layer 410 on the side close to active layer 105 is lower than the impurity concentration at an edge portion of P-type cladding layer 410 on the side far from active layer 105. Specifically, P-type cladding layer 410 includes a P-type $Al_{0.026}Ga_{0.974}N$ layer provided on the side close to active layer 105, doped with Mg having a concentration of $2\times10^{18}$ $cm^{-3}$, and having a thickness of 150 nm, and a P-type $Al_{0.026}Ga_{0.974}N$ layer provided on the side far from active layer 105, doped with Mg having a concentration of $1\times10^{19}$ $cm^{-3}$, and having a thickness of 180 nm.

Similarly to nitride-based semiconductor light-emitting element 300 according to Embodiment 3, ridge 410R is formed in P-type cladding layer 410. Further, two grooves 410T are formed in P-type cladding layer 410, which are provided along ridge 410R and extend in the Y-axis direction.

Contact layer 411 is provided above P-type cladding layer 410, and is in ohmic contact with P-side electrode 113. In the present embodiment, contact layer 411 is a P-type GaN layer having a thickness of 10 nm. Contact layer 411 is doped with Mg having a concentration of $1\times10^{20}$ $cm^{-3}$, as an impurity.

Light-transmitting conductive film 420 according to the present embodiment is a conductive film that is provided above P-type cladding layer 410, and transmits at least a portion of light generated in nitride-based semiconductor light-emitting element 400. As light-transmitting conductive film 420, for example, an oxide film can be used which has visible light transmissivity and low-resistance electrical conductivity, such as a tin-doped indium oxide (ITO) layer, a Ga-doped zinc oxide layer, an Al-doped zinc oxide layer, or an In- and Ga-doped zinc oxide layer.

It is sufficient if light-transmitting conductive film 420 is formed above at least P-type cladding layer 410, and light-transmitting conductive film 420 may be formed between current block layer 112 and P-side electrode 113.

Nitride-based semiconductor light-emitting element 400 according to the present embodiment also yields equivalent effects to those yielded by nitride-based semiconductor light-emitting element 100 according to Embodiment 1, as illustrated in FIG. 14 to FIG. 18 described above.

Furthermore, also in the present embodiment, light-transmitting conductive film 420 provided above P-type cladding layer 410 is included, and thus loss of light that propagates above P-type cladding layer 410 can be decreased. As illustrated in FIG. 15, this effect is noticeable particularly when P-type cladding layer 410 has a small thickness. A great increase in waveguide loss can be reduced even if the thickness of P-type cladding layer 410 is reduced down to 0.32 μm. Furthermore, even if the thickness of P-type cladding layer 410 is reduced down to 0.25 μm, an amount of increase in waveguide loss can be reduced to at most 0.8 $cm^{-1}$, as compared with the case where P-type cladding layer 410 has a thickness of 0.6 μm. It can be seen that this amount of increase is reduced to at most a half of an amount of increase in waveguide loss of nitride-based semiconductor light-emitting element 100 according to Embodiment 1 in which light-transmitting conductive film 420 is not used. Furthermore, the thickness of P-type cladding layer 410 can be still further decreased, and thus electrical resistance of nitride-based semiconductor light-emitting element 400 can be still further decreased. As a result, slope efficiency of nitride-based semiconductor light-emitting element 400 can be increased, and furthermore the operating voltage thereof can be lowered.

According to the present embodiment, nitride-based semiconductor light-emitting element 400 can be produced, in which effective refractive index difference ΔN is $2.0\times10^{-3}$, position P1 is 1.4 nm, difference ΔP is 4.0 nm, a coefficient of confinement of light in active layer 105 is 1.51%, waveguide loss is 3.8 $cm^{-1}$, and free carrier loss is 1.9 $cm^{-1}$.

Embodiment 5

A nitride-based semiconductor light-emitting element according to Embodiment 5 is to be described. The nitride-based semiconductor light-emitting element according to the present embodiment is different from nitride-based semiconductor light-emitting element 300 according to Embodiment 3 in the configuration of the active layer. The following mainly describes differences of the nitride-based semiconductor light-emitting element according to the present embodiment from nitride-based semiconductor light-emitting element 300 according to Embodiment 3, with reference to FIG. 32A and FIG. 32B.

Figure 32A:
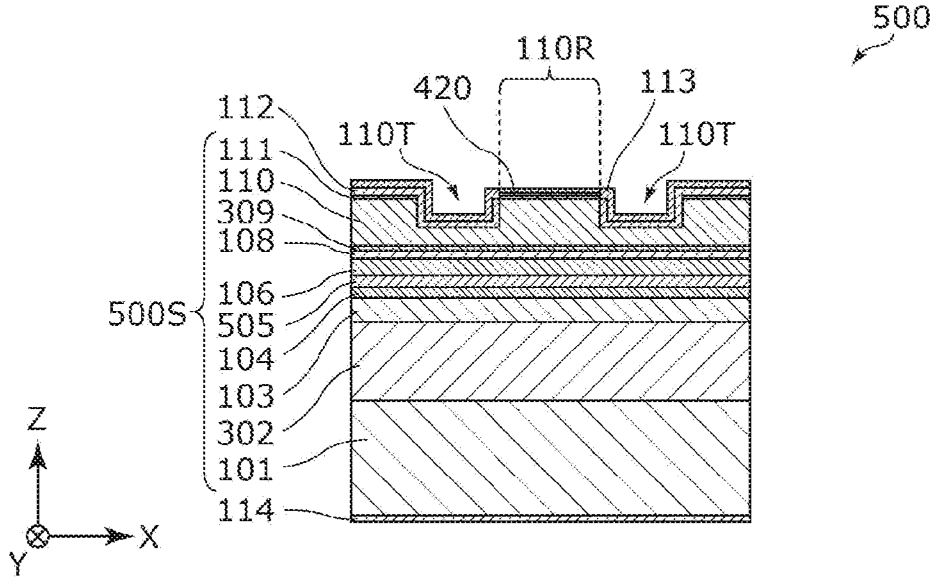
FIG. 32A is a schematic cross sectional view illustrating an overall configuration of a nitride-based semiconductor light-emitting element according to Embodiment 5.
Figure 32B:
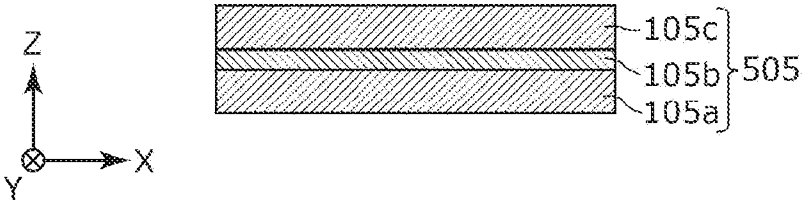
FIG. 32B is a cross sectional view illustrating a configuration of an active layer included in the nitride-based semiconductor light-emitting element according to Embodiment 5.

FIG. 32A is a schematic cross sectional view illustrating an overall configuration of nitride-based semiconductor light-emitting element 500 according to the present embodiment. FIG. 32B is a cross sectional view illustrating a configuration of active layer 505 included in nitride-based semiconductor light-emitting element 500 according to the present embodiment.

As illustrated in FIG. 32A, nitride-based semiconductor light-emitting element 500 according to the present embodiment includes semiconductor stack body 500S, current block layer 112, P-side electrode 113, N-side electrode 114, and light-transmitting conductive film 420. Semiconductor stack body 500S includes substrate 101, N-type first cladding layer 302, N-type second cladding layer 103, N-side guide layer 104, active layer 505, P-side guide layer 106, intermediate layer 108, electron barrier layer 309, P-type cladding layer 110, and contact layer 111.

Active layer 505 according to the present embodiment has a single quantum well structure, and includes single well layer **105*b*, and barrier layers 105*a* and 105*c* between which well layer 105*b* is provided, as illustrated in FIG. 32B. Well layer 105*b* has the same configuration as that of well layer 105*b* according to Embodiment 1, and barrier layers 105*a* and 105*c* have the same configuration as that of barrier layers 105*a* and 105*c*** according to Embodiment 1.

Nitride-based semiconductor light-emitting element 500 according to the present embodiment also yields equivalent effects to those yielded by nitride-based semiconductor light-emitting element 300 according to Embodiment 3. In particular, in nitride-based semiconductor light-emitting element 500 having such a single quantum well structure as stated above, active layer 505 includes single well layer **105*b*. In this manner, also in nitride-based semiconductor light-emitting element 500 that includes a less number of well layer 105*b* having a great refractive index, a peak of a light intensity distribution in the stack direction can be located in active layer 505 or in the vicinity thereof, owing to the configurations of N-side guide layer 104 and P-side guide layer 106**, for instance. Thus, a light confinement coefficient can be increased.

According to the present embodiment, nitride-based semiconductor light-emitting element 500 can be produced, in which effective refractive index difference ΔN is $2.1\times10^{-3}$, position P1 is 1.1 nm, difference ΔP is 6.0 nm, a coefficient of confinement of light in active layer 505 is 0.75%, waveguide loss is 3.8 $cm^{-1}$, and guide-layer free carrier loss is 2.4 $cm^{-1}$. Note that in the present embodiment, a total thickness of active layer 505 is smaller than active layer 105 according to Embodiment 3 by 8 nm, and thus the light confinement coefficient is smaller than that in Embodiment 3.

Embodiment 6

A nitride-based semiconductor light-emitting element according to Embodiment 6 is to be described. The nitride-based semiconductor light-emitting element according to the present embodiment is different from nitride-based semiconductor light-emitting element 100 according to Embodiment 1 mainly in the configuration of the N-side guide layer. The following mainly describes differences of the nitride-based semiconductor light-emitting element according to the present embodiment from nitride-based semiconductor light-emitting element 100 according to Embodiment 1.

6-1. Overall Configuration

Figure 33:
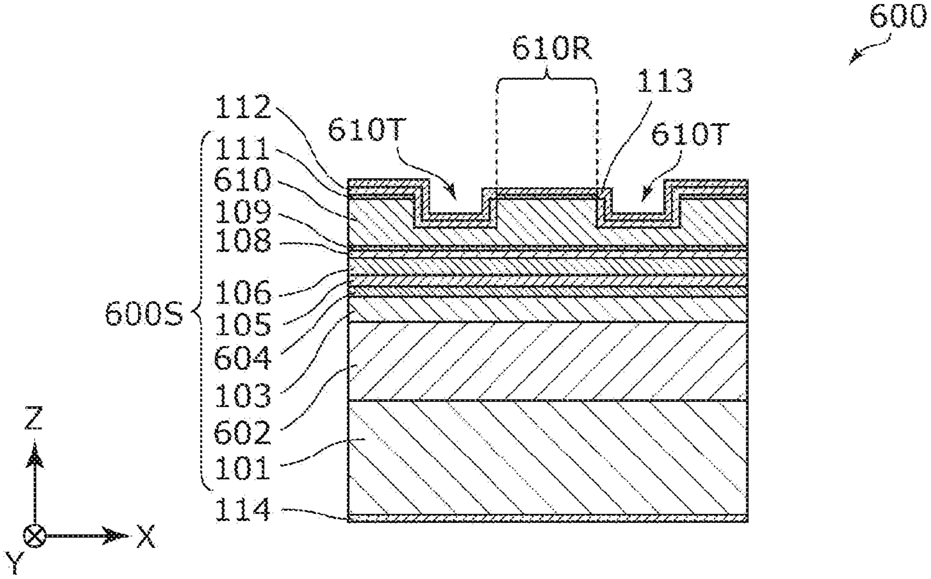
FIG. 33 is a schematic cross sectional view illustrating an overall configuration of a nitride-based semiconductor light-emitting element according to Embodiment 6.
Figure 34:
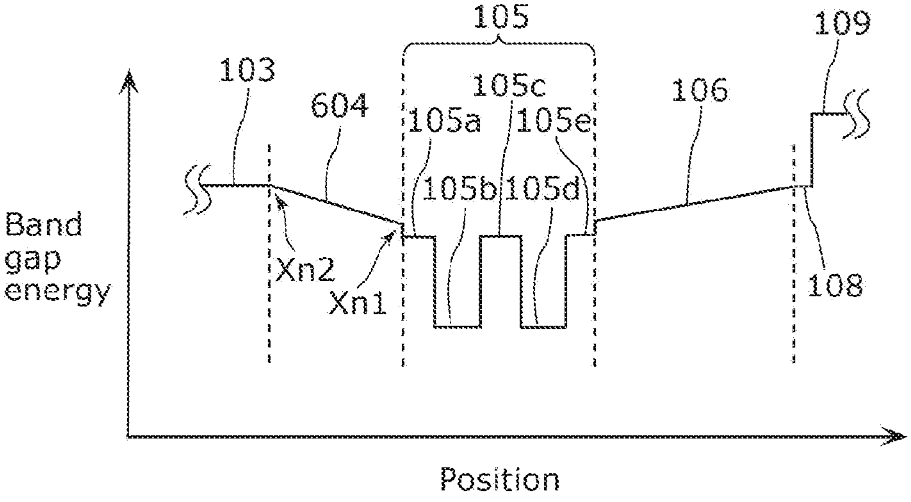
FIG. 34 is a schematic graph showing a distribution of band gap energy in an active layer and layers in the vicinity thereof in the nitride-based semiconductor light-emitting element according to Embodiment 6.

First, an overall configuration of the nitride-based semiconductor light-emitting element according to the present embodiment is to be described with reference to FIG. 33 and FIG. 34. FIG. 33 is a schematic cross sectional view illustrating an overall configuration of nitride-based semiconductor light-emitting element 600 according to the present embodiment. FIG. 34 is a schematic graph showing a distribution of band gap energy in active layer 105 and layers in the vicinity thereof in nitride-based semiconductor light-emitting element 600 according to the present embodiment.

As illustrated in FIG. 33, nitride-based semiconductor light-emitting element 600 according to the present embodiment includes semiconductor stack body 600S, current block layer 112, P-side electrode 113, and N-side electrode 114. Semiconductor stack body 600S includes substrate 101, N-type first cladding layer 602, N-type second cladding layer 103, N-side guide layer 604, active layer 105, P-side guide layer 106, intermediate layer 108, electron barrier layer 109, P-type cladding layer 610, and contact layer 111.

N-type first cladding layer 602 according to the present embodiment is an N-type $Al_{0.035}Ga_{0.965}N$ layer having a thickness of 1200 nm. N-type first cladding layer 602 is doped with Si having a concentration of $1\times10^{18}$ $cm^{-3}$, as an impurity.

P-type cladding layer 610 according to the present embodiment is provided between electron barrier layer 109 and contact layer 111. P-type cladding layer 610 has a smaller refractive index and greater band gap energy than those of active layer 105. In the present embodiment, P-type cladding layer 610 is a P-type $Al_{0.035}Ga_{0.965}N$ layer having a thickness of 450 nm. P-type cladding layer 610 is doped with Mg as an impurity. An impurity concentration at an edge portion of P-type cladding layer 610 on the side close to active layer 105 is lower than an impurity concentration of P-type cladding layer 610 at an edge portion on the side far from active layer 105. Specifically, P-type cladding layer 610 includes a P-type $Al_{0.035}Ga_{0.965}N$ layer provided on the side close to active layer 105, doped with Mg having a concentration of $2\times10^{18}$ $cm^{-3}$, and having a thickness of 150 nm, and a P-type $Al_{0.035}Ga_{0.965}N$ layer provided on the side far from active layer 105, doped with Mg having a concentration of $1\times10^{19}$ $cm^{-3}$, and having a thickness of 300 nm.

Similarly to nitride-based semiconductor light-emitting element 100 according to Embodiment 1, ridge 610R is formed in P-type cladding layer 610. Further, two grooves 610T are formed in P-type cladding layer 610, which are provided along ridge 610R and extend in the Y-axis direction.

N-side guide layer 604 according to the present embodiment is a light guide layer provided above N-type second cladding layer 103. N-side guide layer 604 has a greater refractive index and less band gap energy than those of N-type first cladding layer 602 and N-type second cladding layer 103. As illustrated in FIG. 34, the band gap energy of N-side guide layer 604 continuously and monotonically increases with an increase in distance from active layer 105.

When N-side guide layer 604 consists essentially of $In_{Xn}Ga_{1-Xn}N$, In composition ratio Xn of N-side guide layer 604 may continuously and monotonically decrease with an increase in distance from active layer 105. Accordingly, band gap energy of N-side guide layer 604 continuously and monotonically increases with an increase in distance from active layer 105.

N-side guide layer 604 is an N-type $In_{Xn}Ga_{1-Xn}N$ layer having a thickness of 160 nm. More specifically, N-side guide layer 604 has a composition represented by $In_{Xn1}Ga_{1-Xn1}N$ at and in the vicinity of the interface on the side close to active layer 105, and has a composition represented by $In_{Xn2}Ga_{1-Xn2}N$ at and in the vicinity of the interface on the side far from active layer 105. In the present embodiment, In composition ratio Xn1 of N-side guide layer 604 at and in the vicinity of the interface on the side close to active layer 105 is 4%, and In composition ratio Xn2 thereof at and in the vicinity of the interface on the side far from active layer 105 is 0%. In composition ratio Xn of N-side guide layer 604 decreases at a certain rate of change with an increase in distance from active layer 105.

6-2. Effects

[6-2-1. In Composition Ratio Distribution]

Figure 35:
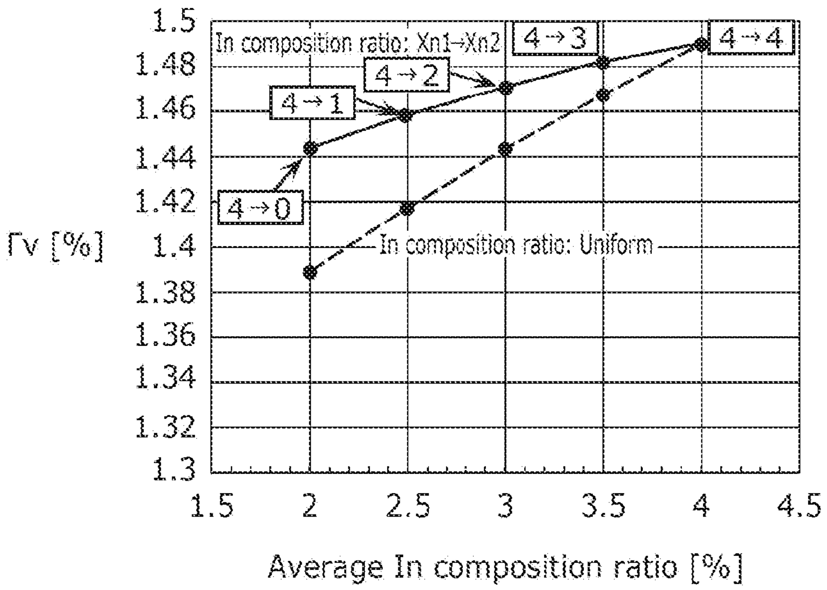
FIG. 35 is a graph showing simulation results of a relation between an average In composition ratio of an N-side guide layer according to Embodiment 6 and a light confinement coefficient.
Figure 36:
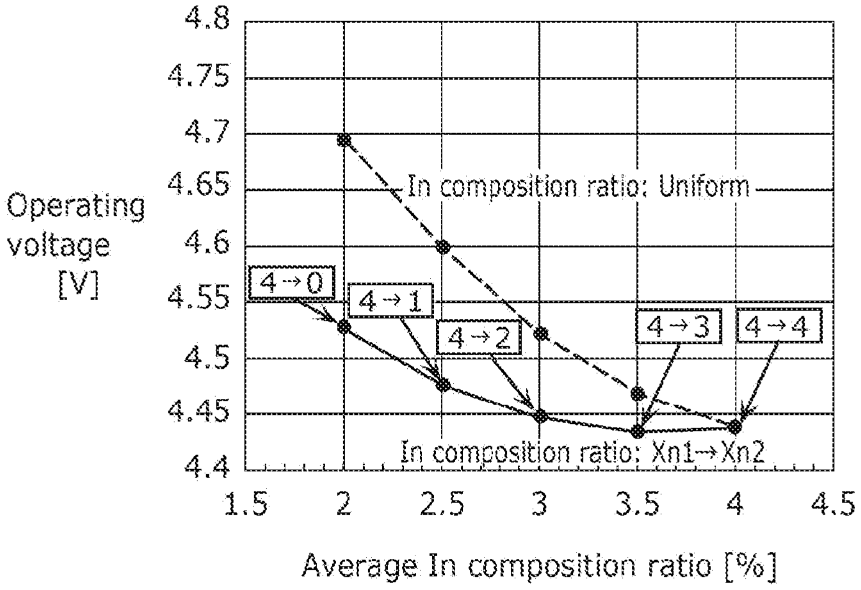
FIG. 36 is a graph showing simulation results of a relation between an average In composition ratio of the N-side guide layer according to Embodiment 6 and an operating voltage.

Next, effects of the In composition ratio distribution in N-side guide layer 604 of nitride-based semiconductor light-emitting element 600 according to the present embodiment are to be described with reference to FIG. 35 and FIG. 36. FIG. 35 and FIG. 36 are graphs showing simulation results of relations between (i) an average In composition ratio of N-side guide layer 604 according to the present embodiment and (ii) a light confinement coefficient (Γv) and an operating voltage, respectively.

FIG. 35 and FIG. 36 illustrate a light confinement coefficient and an operating voltage, respectively, when In composition ratio Xn1 of N-side guide layer 604 at and in the vicinity of the interface on the side close to active layer 105 is 4%, In composition ratio Xn2 thereof at and in the vicinity of the interface on the side far from active layer 105 is 0%, 1%, 2%, 3%, and 4%, and the In composition ratio is decreased at a certain rate of change with an increase in distance from active layer 105. Note that the drawings illustrate the operating voltage when the supply current amount is 3 A. FIG. 35 and FIG. 36 also illustrate simulation results when the In composition ratio of the N-side guide layer is uniform, using broken lines.

As illustrated in FIG. 35 and FIG. 36, a high refractive index region of N-side guide layer 604 can be located closer to active layer 105 in the case where the In composition ratio of N-side guide layer 604 is continuously and monotonically decreased with an increase in distance from active layer 105 than in the case where the In composition ratio of N-side guide layer 604 is uniform, and thus a light confinement coefficient can be more increased and an operating voltage can be lowered. When the average In composition ratio is less than 2%, waveguide loss can be still more decreased, and the light confinement coefficient can be still more increased.

Figure 37:
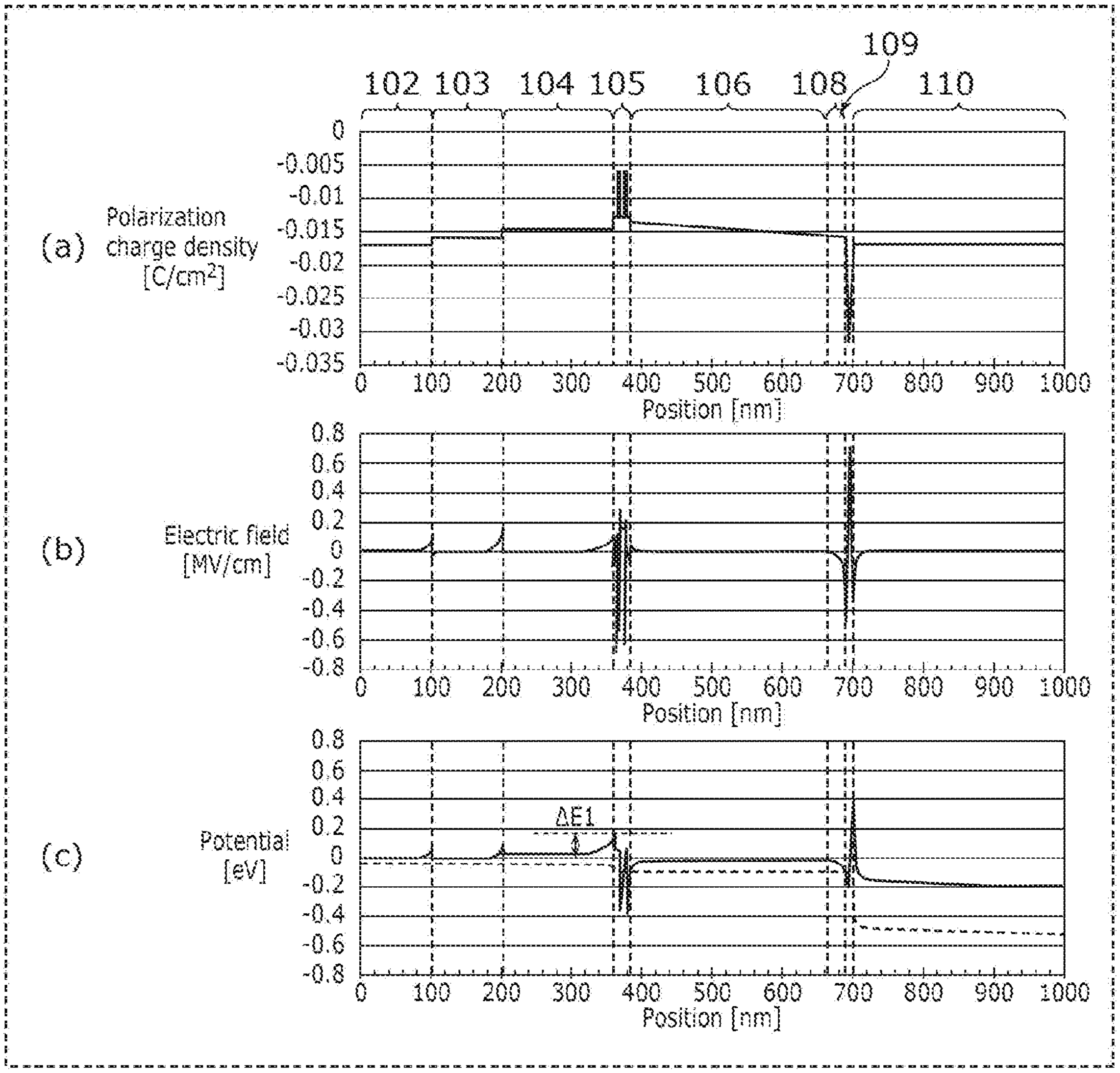
FIG. 37 illustrates graphs showing relations of a position in the stack direction of the nitride-based semiconductor light-emitting element according to Embodiment 1 with a piezo polarization charge density, a piezo polarization electric field, and a conduction band potential.
Figure 38:
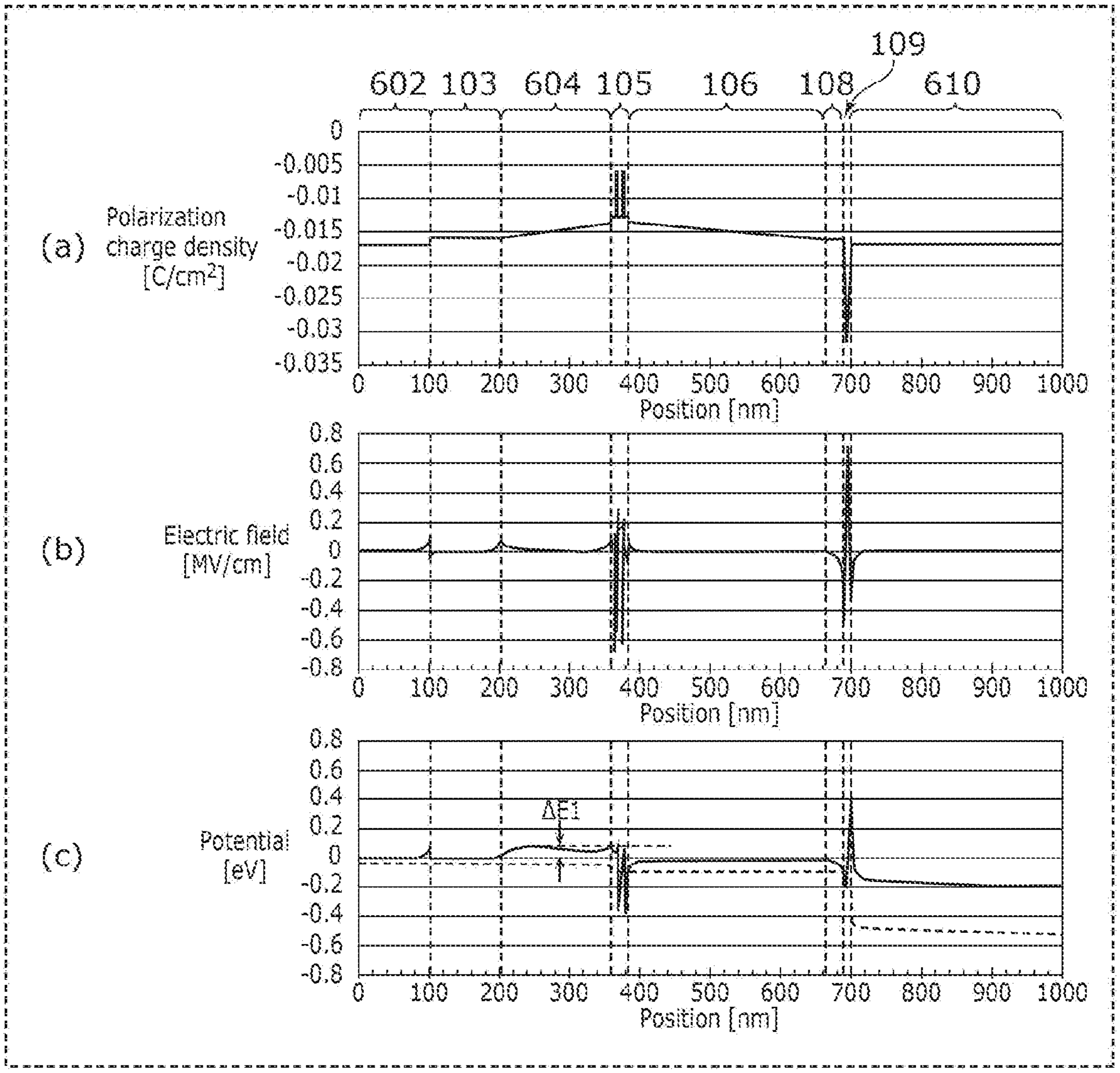
FIG. 38 illustrates graphs showing relations of a position in the stack direction of the nitride-based semiconductor light-emitting element according to Embodiment 6 with a piezo polarization charge density, a piezo polarization electric field, and a conduction band potential.

Next, effects on reduction in the operating voltage of nitride-based semiconductor light-emitting element 600 according to the present embodiment are to be described with reference to FIG. 37 and FIG. 38, in comparison with nitride-based semiconductor light-emitting element 100 according to Embodiment 1. FIG. 37 illustrates graphs showing relations of a position in the stack direction of nitride-based semiconductor light-emitting element 100 according to Embodiment 1 with a piezo polarization charge density, a piezo polarization electric field, and a conduction band potential. FIG. 38 illustrates graphs showing relations of a position in the stack direction of nitride-based semiconductor light-emitting element 600 according to the present embodiment with a piezo polarization charge density, a piezo polarization electric field, and a conduction band potential. Graphs (a), (b), and (c) in FIG. 37 and FIG. 38 each show a relation of a position in the stack direction of the nitride-based semiconductor light-emitting element with a piezo polarization charge density, a piezo polarization electric field, and a conduction band potential, respectively. Note that graphs (c) in FIG. 37 and FIG. 38 each also show a hole Fermi level using a broken line.

As illustrated in graph (a) in FIG. 37, a piezo polarization charge density of N-side guide layer 104 in nitride-based semiconductor light-emitting element 100 according to Embodiment 1 is constant in the stack direction. Accordingly, there are great differences in piezo polarization charge density at an interface between N-side guide layer 104 and N-type second cladding layer 103 and an interface between N-side guide layer 104 and active layer 105. Due to this, piezo polarization charge is locally formed at an interface between N-side guide layer 104 and N-type second cladding layer 103 and an interface between N-side guide layer 104 and active layer 105. Accordingly, great piezo polarization electric fields are generated. Thus, as illustrated in graph (b) in FIG. 37, a piezo polarization electric field having a spiking shape is generated at each of the interface between N-side guide layer 104 and N-type second cladding layer 103 and the interface between N-side guide layer 104 and active layer 105. As a result, holes are attracted to and in the vicinity of the interface between N-side guide layer 104 and N-type second cladding layer 103 and the interface between N-side guide layer 104 and active layer 105, and conduction band potentials at the interfaces increase (see $\Delta E1$ shown in graph (c) in FIG. 37).

On the other hand, as illustrated in graph (a) in FIG. 38, the polarization charge density of N-side guide layer 604 of nitride-based semiconductor light-emitting element 600 according to the present embodiment monotonically decreases as approaching from the interface on the side close to active layer 105 to the interface on the side far from active layer 105. Accordingly, differences in piezo polarization charge density at the interface between N-side guide layer 604 and N-type second cladding layer 103 and the interface between N-side guide layer 604 and active layer 105 are reduced. Accordingly, piezo polarization charge is dispersed in the stack direction in N-side guide layer 604. Thus, as illustrated in graph (b) in FIG. 38, a piezo polarization electric field can be reduced at each of the interface between N-side guide layer 604 and N-type second cladding layer 103 and the interface between N-side guide layer 604 and active layer 105. As a result, as illustrated in graph (c) in FIG. 38, an increase in conduction band potential (see $\Delta E1$ shown in graph (c) in FIG. 38) due to holes being attracted can be reduced at the interface between N-side guide layer 604 and N-type second cladding layer 103 and the interface between N-side guide layer 604 and active layer 105. Accordingly, in nitride-based semiconductor light-emitting element 600 according to the present embodiment, conductivity of electrons that flow from N-type second cladding layer 103 toward active layer 105 can be increased, and thus an operating voltage can be lowered.

[6-2-2. Impurity in N-Side Guide Layer]

Figure 39:
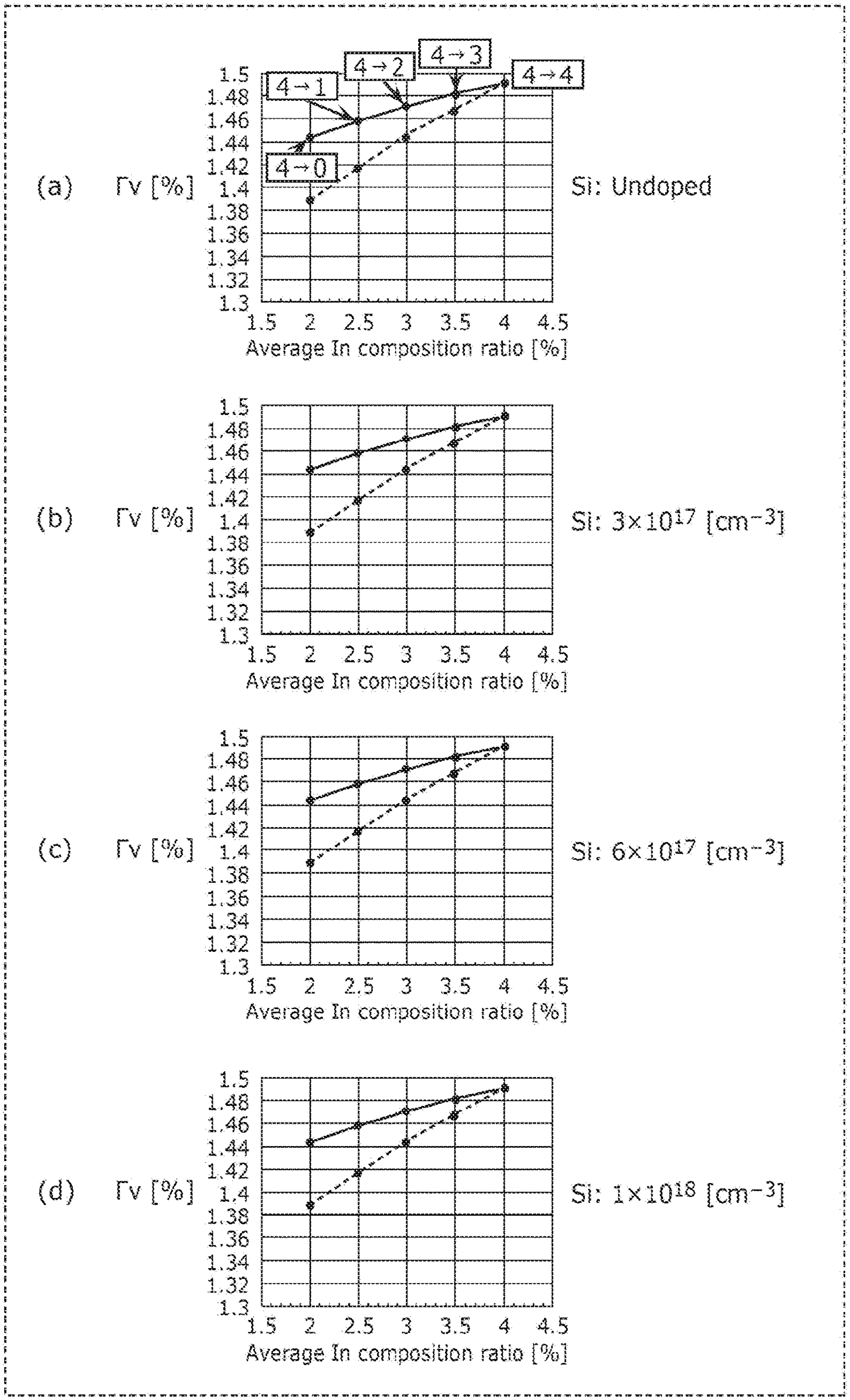
FIG. 39 illustrates graphs showing simulation results of a relation between an average In composition ratio of the N-side guide layer in the nitride-based semiconductor light-emitting element according to Embodiment 6 and a light confinement coefficient.
Figure 40:
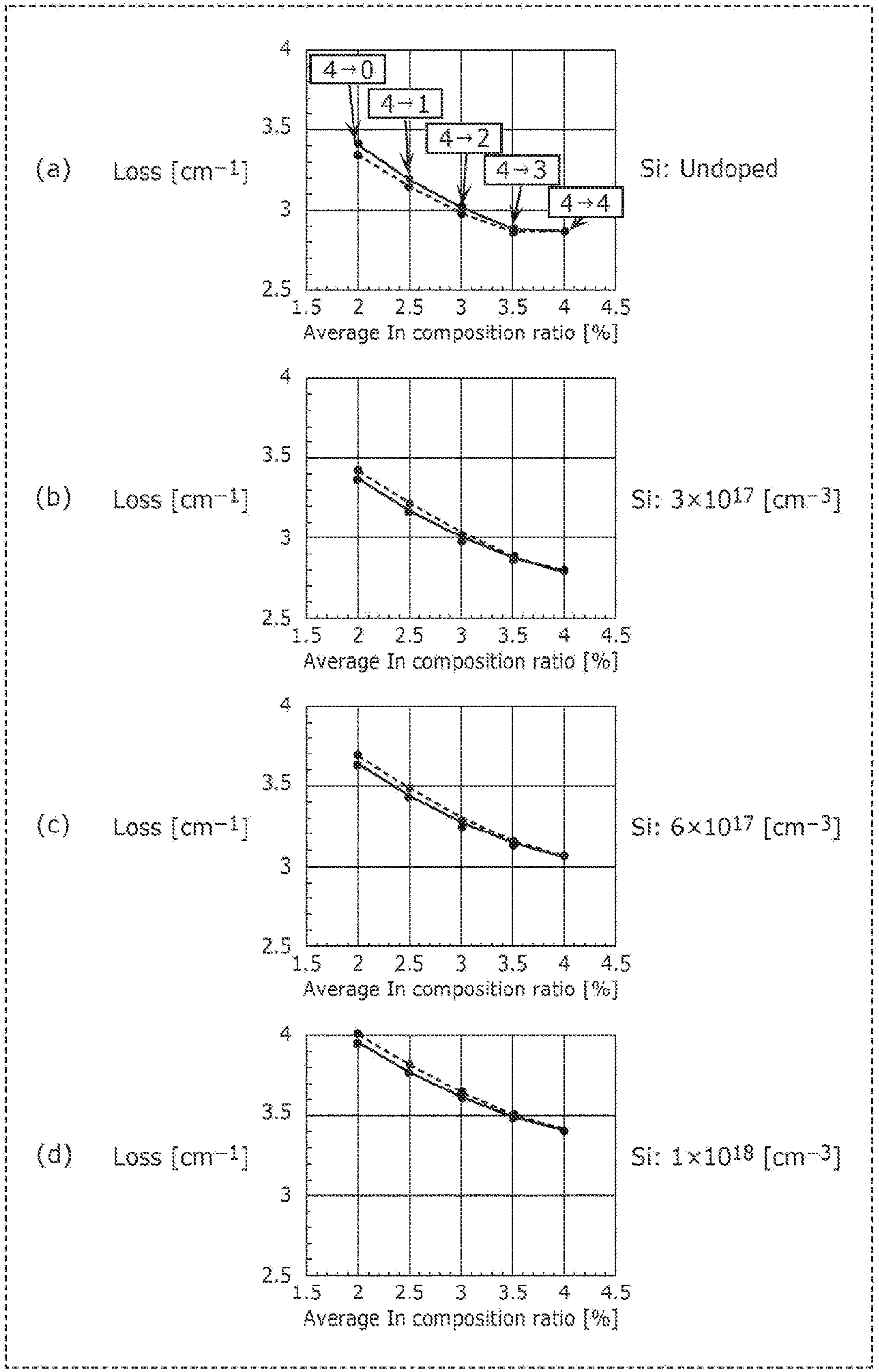
FIG. 40 illustrates graphs showing simulation results of a relation between an average In composition ratio of the N-side guide layer in the nitride-based semiconductor light-emitting element according to Embodiment 6 and waveguide loss.
Figure 41:
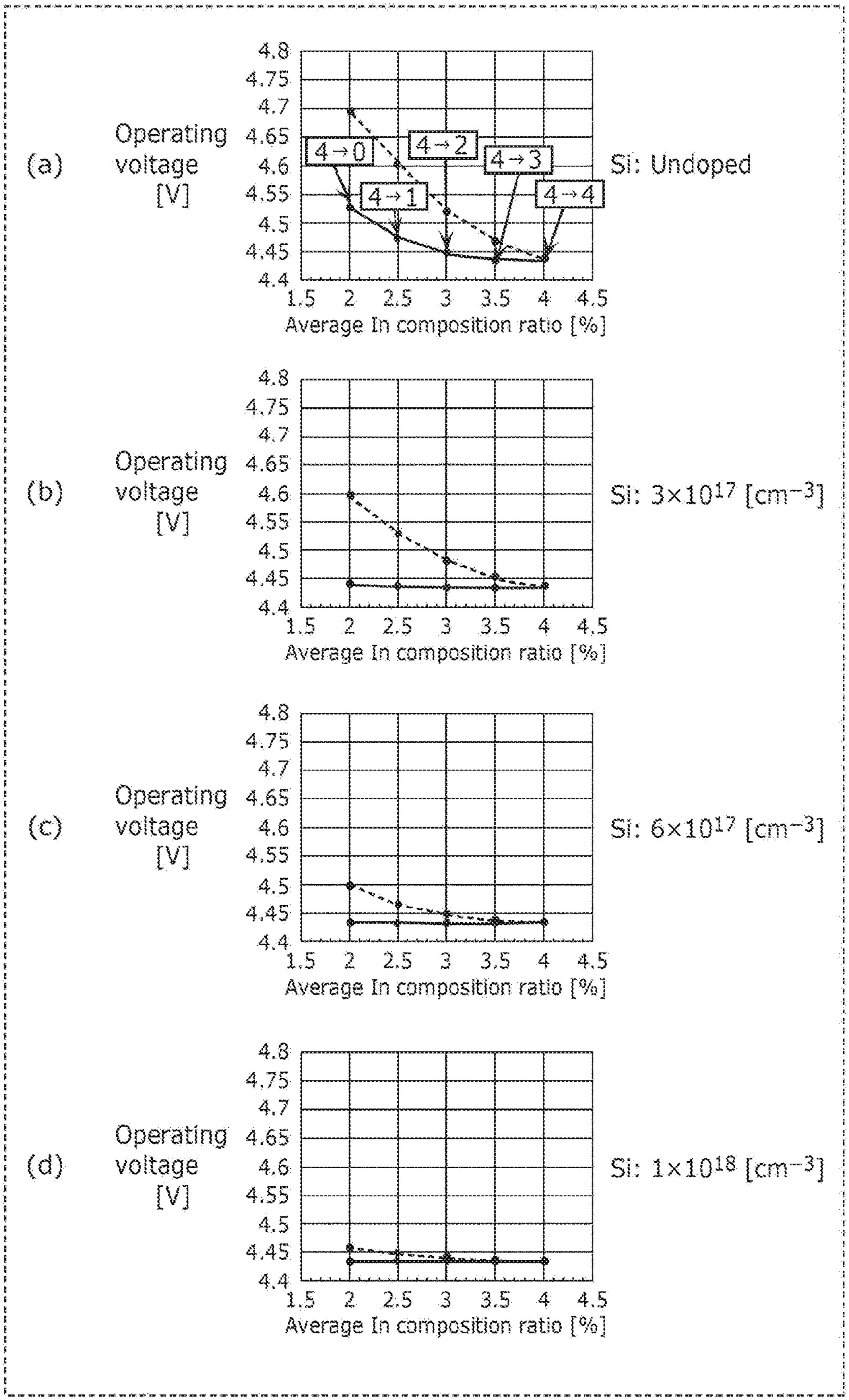
FIG. 41 illustrates graphs showing simulation results of a relation between an average In composition ratio of the N-side guide layer in the nitride-based semiconductor light-emitting element according to Embodiment 6 and an operating voltage.

Next, effects of impurities in N-side guide layer 604 according to the present embodiment are to be described with reference to FIG. 39 to FIG. 41. FIG. 39, FIG. 40, and FIG. 41 illustrate graphs showing simulation results of a relation between (i) an average In composition ratio of N-side guide layer 604 in nitride-based semiconductor light-emitting element 600 according to the present embodiment and (ii) a light confinement coefficient ($\Gamma v$), waveguide loss, and an operating voltage, respectively. Graphs (a), (b), (c), and (d) in FIG. 39 to FIG. 41 show simulation results when the concentrations of an impurity (Si) in N-side guide layer 604 are 0 (that is, undoped), $3\times10^{17}$ cm$^{-3}$, $6\times10^{17}$ cm$^{-3}$, and $1\times10^{18}$ cm$^{-3}$, respectively. Note that FIG. 41 illustrates the operating voltage when the supply current amount is 3 A.

FIG. 39 and FIG. 41 illustrate a light confinement coefficient and an operating voltage, respectively, when In composition ratio Xn1 of N-side guide layer 604 at and in the vicinity of the interface on the side close to active layer 105 is 4%, In composition ratio Xn2 thereof at and in the vicinity of the interface on the side far from active layer 105 is 0%, 1%, 2%, 3%, and 4%, and the In composition ratio is decreased at a certain rate of change with an increase in distance from active layer 105. FIG. 39 and FIG. 41 also illustrate simulation results when the In composition ratio of N-side guide layer 604 is uniform, using broken lines.

As illustrated in FIG. 39, in nitride-based semiconductor light-emitting element 600 according to the present embodiment, a light confinement coefficient can be made greater than that of the nitride-based semiconductor light-emitting element according to the comparative example in which the In composition ratio of the N-side guide layer is uniform. Furthermore, FIG. 39 also shows that the light confinement coefficient hardly depends on an impurity concentration, in nitride-based semiconductor light-emitting element 600 according to the present embodiment.

As illustrated in FIG. 40, in nitride-based semiconductor light-emitting element 600 according to the present embodiment, waveguide loss can be reduced more than that of the nitride-based semiconductor light-emitting element according to the comparative example in which the In composition ratio of the N-side guide layer is uniform, except when an impurity is not added. This is considered to be caused by a decrease in hole concentration due to an energy band gap distribution in N-side guide layer 604 in the stack direction although an electron concentration is increased by the addition of an impurity.

As illustrated in FIG. 41, in nitride-based semiconductor light-emitting element 600 according to the present embodiment, an operating voltage can be made lower than that of the nitride-based semiconductor light-emitting element according to the comparative example in which the In composition ratio of the N-side guide layer is uniform. An electron concentration in N-side guide layer 604 can be increased by increasing a concentration of an impurity added to nitride-based semiconductor light-emitting element 600, and thus an operating voltage can be still further lowered.

As shown in FIG. 40 and FIG. 41, in nitride-based semiconductor light-emitting element 600 according to the present embodiment, a great increase in waveguide loss can be reduced and an operating voltage can be lowered, by setting the impurity concentration in N-side guide layer 604 to a value in a range from $1\times10^{17}$ cm$^{-3}$ to $6\times10^{17}$ cm$^{-3}$.

As described above, according to the present embodiment, nitride-based semiconductor light-emitting element 600 can be produced, in which effective refractive index difference $\Delta N$ is $2.9\times10^{-3}$, position P1 is 15.9 nm, difference $\Delta P$ is 6.2 nm, a coefficient of confinement of light in active layer 105 is 1.44%, waveguide loss is 3.4 cm$^{-1}$, and guide-layer free carrier loss is 1.45 cm$^{-1}$.

Embodiment 7

A nitride-based semiconductor light-emitting element according to Embodiment 7 is to be described. The nitride-based semiconductor light-emitting element according to the present embodiment is different from nitride-based semiconductor light-emitting element 100 according to Embodiment 1 mainly in the configuration of the P-type cladding layer. The following mainly describes differences of the nitride-based semiconductor light-emitting element according to the present embodiment from nitride-based semiconductor light-emitting element 100 according to Embodiment 1, with reference to FIG. 42.

Figure 42:
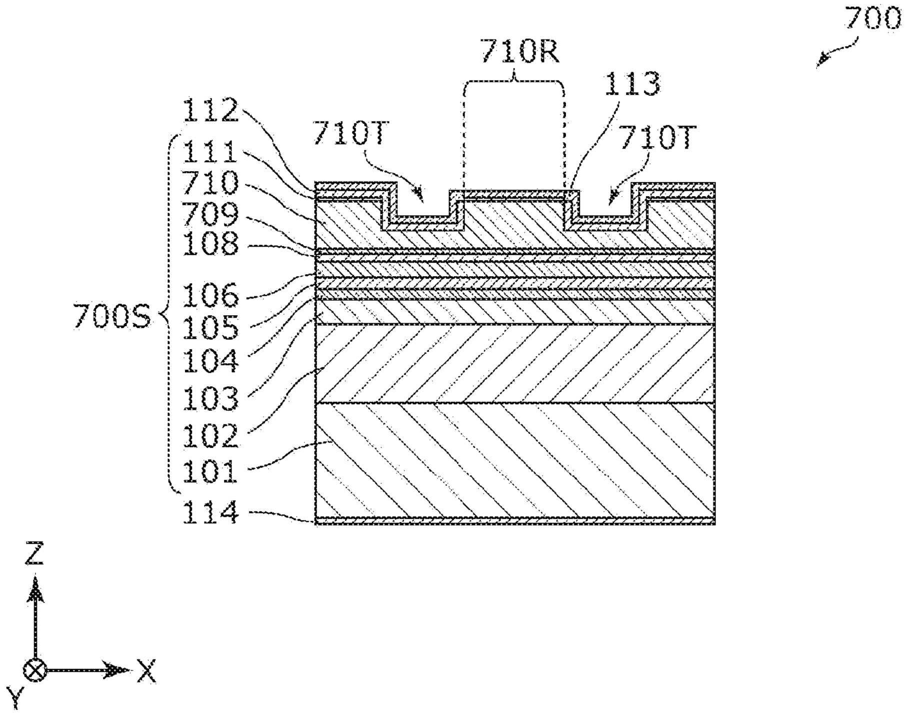
FIG. 42 is a schematic cross sectional view illustrating an overall configuration of a nitride-based semiconductor light-emitting element according to Embodiment 7.

FIG. 42 is a schematic cross sectional view illustrating an overall configuration of nitride-based semiconductor light-emitting element 700 according to the present embodiment. As illustrated in FIG. 42, nitride-based semiconductor light-emitting element 700 according to the present embodiment includes semiconductor stack body 700S, current block layer 112, P-side electrode 113, and N-side electrode 114. Semiconductor stack body 700S includes substrate 101, N-type first cladding layer 102, N-type second cladding layer 103, N-side guide layer 104, active layer 105, P-side guide layer 106, intermediate layer 108, electron barrier layer 709, P-type cladding layer 710, and contact layer 111.

Electron barrier layer 709 according to the present embodiment is a P-type $Al_{0.36}Ga_{0.64}N$ layer having a thickness of 1.6 nm. Electron barrier layer 709 is doped with Mg having a concentration of $1.5\times10^{19}$ $cm^{-3}$, as an impurity.

P-type cladding layer 710 according to the present embodiment is provided between electron barrier layer 709 and contact layer 111. P-type cladding layer 710 has a smaller refractive index and greater band gap energy than active layer 105. Similarly to P-type cladding layer 110 according to Embodiment 1, ridge 710R is formed in P-type cladding layer 710. Further, two grooves 710T are formed in P-type cladding layer 710, which are provided along ridge 710R and extend in the Y-axis direction.

P-type cladding layer 710 is a P-type $Al_{0.026}Ga_{0.974}N$ layer having a thickness of 450 nm. P-type cladding layer 710 is doped with Mg as an impurity. In the present embodiment, an impurity concentration at an edge portion of P-type cladding layer 710 on the side close to active layer 105 is lower than the impurity concentration at an edge portion on the side far from active layer 105. An impurity concentration of P-type cladding layer 710 includes a region in which the concentration monotonically increases with an increase in distance from active layer 105. Here, the configuration in which an impurity concentration monotonically increases includes a configuration in which a region where an impurity concentration is constant in the stack direction is present. Specifically, P-type cladding layer 710 includes: a P-type $Al_{0.026}Ga_{0.974}N$ layer provided closest to active layer 105, doped with Mg having a concentration of $2\times10^{18}$ $cm^{-3}$, and having a thickness of 150 nm; a P-type $Al_{0.026}Ga_{0.974}N$ layer provided thereabove, doped with Mg having a concentration of $1\times10^{19}$ $cm^{-3}$, and having a thickness of 180 nm; and a P-type $Al_{0.026}Ga_{0.974}N$ layer provided thereabove, doped with Mg having a concentration of $1.3\times10^{19}$ $cm^{-3}$, and having a thickness of 120 nm. As described above, in the present embodiment, P-type cladding layer 710 includes a first layer closest to active layer 105, a second layer having an impurity concentration higher than that of the first layer, and a third layer having an impurity concentration higher than that of the second layer.

In the present embodiment, the thickness of P-side guide layer 106 is greater than the thickness of N-side guide layer 104. In this case, a peak of a light intensity distribution in the stack direction is located in a region of active layer 105 or in the vicinity thereof, and thus spread of light to P-type cladding layer 710 can be reduced. Thus, the light intensity in P-type cladding layer 710 is weak. Accordingly, an increase in waveguide loss can be reduced even if an Mg concentration of P-type cladding layer 710 in a region in the vicinity of contact layer 111 is increased. In addition, a series resistance of nitride-based semiconductor light-emitting element 700 (that is a resistance between P-side electrode 113 and N-side electrode 114) can be decreased by increasing an Mg concentration.

For example, when the thickness of P-side guide layer 106 is greater than or equal to 200 nm, a light intensity is sufficiently low so as to reduce an increase in waveguide loss even if an Mg concentration is increased to and above $1.3\times10^{19}$ $cm^{-3}$, in a region of P-type cladding layer 710 within a range of 0.15 μm from the interface with contact layer 111. In this manner, a series resistance of nitride-based semiconductor light-emitting element 700 can be decreased by increasing an Mg concentration of P-type cladding layer 710. Note that the Mg concentration of P-type cladding layer 710 may be less than or equal to $1.6\times10^{19}$ $cm^{-3}$. Accordingly, an increase in series resistance can be reduced since a decrease in mobility of carriers due to an excessive increase in Mg concentration can be reduced.

When a thickness of P-side guide layer 106 is greater than or equal to 250 nm, a light intensity of P-type cladding layer 710 is further decreased, and thus an increase in waveguide loss can be reduced even if the thickness of a low-concentration region of P-type cladding layer 710 in which the Mg concentration is the lowest is set to 20 nm or less.

The Mg concentration in P-type cladding layer 710 does not need to be changed stepwise, and may be changed continuously. For example, the Mg concentration in P-type cladding layer 710 may have a configuration as follows. The Mg concentration in P-type cladding layer 710 at the interface on the side close to active layer 105 is substantially the same as the Mg concentration of $1.5\times10^{19}$ $cm^{-3}$ in electron barrier layer 709. The Mg concentration may be decreased monotonically as an increase in distance from the interface so that the Mg concentration reaches a range from $1\times10^{18}$ $cm^{-3}$ to $3\times10^{18}$ $cm^{-3}$ in a region of P-type cladding layer 710 within a range of 100 nm from the interface. In this manner, P-type cladding layer 710 may include a concentration decreasing region in which an impurity concentration monotonically decreases with an increase in distance from active layer 105, in a region closest to active layer 105. Furthermore, P-type cladding layer 710 may include a low concentration region which is provided above the concentration decreasing region and in which a change in Mg concentration in the stack direction is small and the Mg concentration is the lowest in P-type cladding layer 710. In the low concentration region, for example, the Mg concentration is in a range from $1\times10^{18}$ $cm^{-3}$ to $3\times10^{18}$ $cm^{-3}$. Furthermore, P-type cladding layer 710 may include a concentration increasing region which is provided above the low concentration region and in which the Mg concentration monotonically increases with an increase in distance from active layer 105. In the concentration increasing region, for example, the Mg concentration monotonically increases from the range from $1\times10^{18}$ $cm^{-3}$ to $3\times10^{18}$ $cm^{-3}$ to reach $1.3\times10^{19}$ $cm^{-3}$.

The concentration increasing region may include a high increasing-rate region provided on the side close to active layer 105 and a low increasing-rate region provided above the high increasing-rate region. A rate of change in the Mg concentration in the stack direction in the high increasing-rate region is greater than a rate of change in the Mg concentration in the stack direction in the low increasing-rate region.

According to the present embodiment, nitride-based semiconductor light-emitting element 700 can be produced, in which effective refractive index difference ΔN is $1.9\times10^{-3}$, position P1 is 3.6 nm, difference ΔP is 2.8 nm, a coefficient of confinement of light in active layer 105 is 1.54%, waveguide loss is 3.6 $cm^{-1}$, and guide-layer free carrier loss is 2.4 $cm^{-1}$.

Embodiment 8

A nitride-based semiconductor light-emitting element according to Embodiment 8 is to be described. The nitride-based semiconductor light-emitting element according to the present embodiment is different from nitride-based semiconductor light-emitting element 700 according to Embodiment 7 in the configuration of the electron barrier layer. The following mainly describes differences of the nitride-based semiconductor light-emitting element according to the present embodiment from nitride-based semiconductor light-emitting element 700 according to Embodiment 7, with reference to FIG. 43 and FIG. 44.

Figure 43:
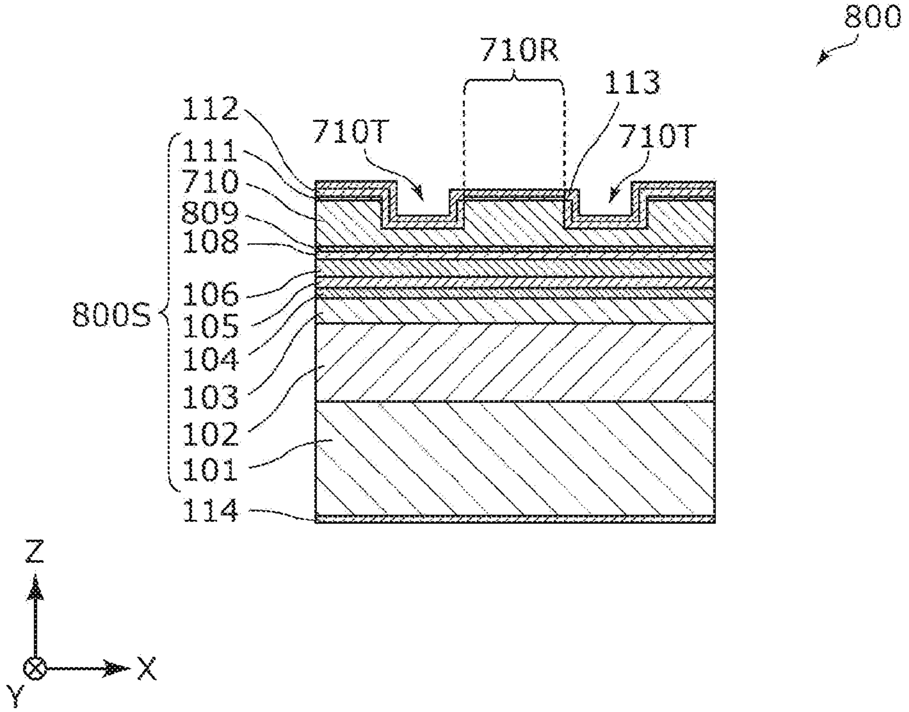
FIG. 43 is a schematic cross sectional view illustrating an overall configuration of a nitride-based semiconductor light-emitting element according to Embodiment 8.
Figure 44:
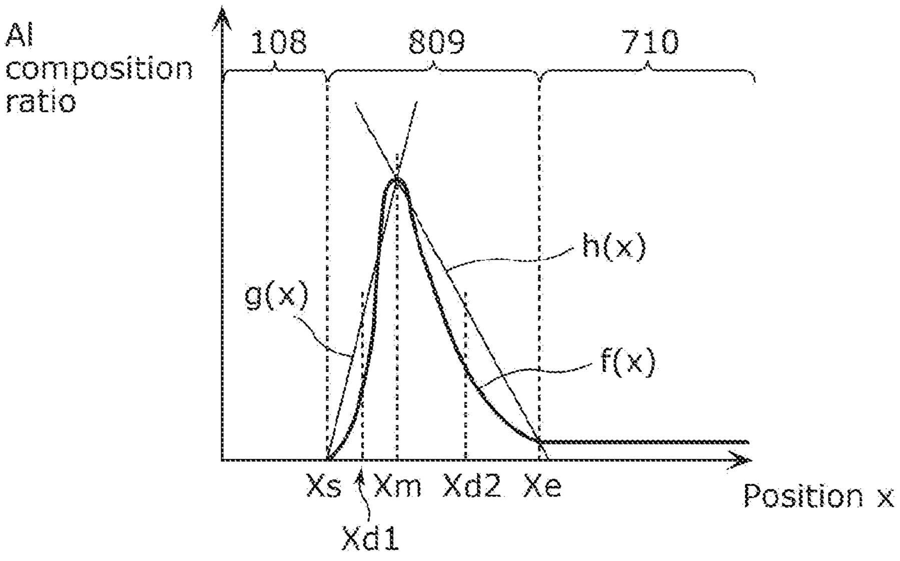
FIG. 44 is a graph showing a distribution of an Al composition ratio in the stack direction of an electron barrier layer according to Embodiment 8.

FIG. 43 is a schematic cross sectional view illustrating an overall configuration of nitride-based semiconductor light-emitting element 800 according to the present embodiment. FIG. 44 is a graph showing a distribution of an Al composition ratio in the stack direction of electron barrier layer 809 according to the present embodiment. The horizontal axis of the graph illustrated in FIG. 44 indicates position x in the stack direction, whereas the vertical axis thereof indicates an Al composition ratio. In FIG. 44, distributions of the Al composition ratio in a part of intermediate layer 108 and a part of P-type cladding layer 710, together with the distribution in electron barrier layer 809.

As illustrated in FIG. 43, nitride-based semiconductor light-emitting element 800 according to the present embodiment includes semiconductor stack body 800S, current block layer 112, P-side electrode 113, and N-side electrode 114. Semiconductor stack body 800S includes substrate 101, N-type first cladding layer 102, N-type second cladding layer 103, N-side guide layer 104, active layer 105, P-side guide layer 106, intermediate layer 108, electron barrier layer 809, P-type cladding layer 710, and contact layer 111.

Electron barrier layer 809 according to the present embodiment is a P-type AlGaN layer. Electron barrier layer 809 is doped with Mg having a concentration of $1.5\times10^{19}$ $cm^{-3}$, as an impurity. Electron barrier layer 809 includes an Al composition ratio increasing region in which the Al composition ratio monotonically increases with a decrease in distance from P-type cladding layer 110, and an Al composition ratio decreasing region which is provided above the Al composition ratio increasing region and in which the Al composition ratio monotonically decreases with a decrease in distance from P-type cladding layer 710. Here, the configuration in which the Al composition ratio monotonically decreases includes a configuration that includes a region in which the Al composition ratio is constant in the stack direction. For example, the configuration in which the Al composition ratio monotonically decreases also includes a configuration in which the Al composition ratio decreases stepwise. In the graph as illustrated in FIG. 44, position x=Xs indicates an interface of electron barrier layer 809 with intermediate layer 108, and position x=Xe indicates an interface of electron barrier layer 809 with P-type cladding layer 710. Note that position x=Xs may be defined by an edge portion of a region in which the Al composition ratio increases as a decrease in distance from P-type cladding layer 710. Position x=Xe may be defined by an edge portion of a region in which the Al composition ratio decreases with a decrease in distance from P-type cladding layer 710, or in other words, an edge portion of a region in which the Al composition ratio is constant in the stack direction. Position x=Xm is a position at which the Al composition ratio is the highest in electron barrier layer 809. A region from position x=Xs to position x=Xm is an Al composition ratio increasing region, and a region from position x=Xm to position x=Xe is an Al composition ratio decreasing region.

The thickness of electron barrier layer 809 is less than or equal to 5 nm. The thickness of the Al composition ratio increasing region is less than or equal to 2 nm. The thickness of the Al composition ratio decreasing region is greater than the thickness of the Al composition ratio increasing region. The thickness of a region of electron barrier layer 809 in which the Al composition ratio is the highest is less than or equal to 0.5 nm. Here, the region in which the Al ratio is the highest means a region in which the Al composition ratio is greater than or equal to 95% of the greatest value of the Al composition ratio of electron barrier layer 809.

The graph illustrated in FIG. 44 shows straight lines g(x) and h(x) together with curve f(x) showing a distribution of the Al composition ratio with respect to a position in electron barrier layer 809 in the stack direction. Straight line g(x) passes through a point on curve f(x) at position x=Xs and a point on curve f(x) at position x=Xm. Straight line h(x) passes through a point on curve f(x) at position x=Xm and a point on curve f(x) at position x=Xe. As illustrated in FIG. 44, curve f(x) is convex downward in a range from position x=Xs to position x=Xm. Curve f(x) is convex downward in a range from position x=Xm to position x=Xe. In other words, f(Xd1)<g(Xd1) at position x=Xd1 corresponding to an intermediate point between position x=Xs and position x=Xm. Further, f(Xd2)<h(Xd2) at position x=Xd2 corresponding to an intermediate point between position x=Xm and position x=Xe.

As described above, by tilting the Al composition ratio of electron barrier layer 809 on the side close to active layer 105, positive piezo-polarization charge formed at the interface of electron barrier layer 809 with intermediate layer 108 can be distributed in the Al composition ratio increasing region. Along with this, a concentration of electrons attracted by positive piezo-polarization charge is decreased at the interface of electron barrier layer 809 with intermediate layer 108. As a result, a decrease in potential energy in a valence band at the interface of electron barrier layer 809 with intermediate layer 108 can be reduced. Accordingly, a potential barrier against holes that flow from P-type cladding layer 710 to active layer 105 is reduced, so that the operating voltage is lowered.

By setting the thickness of a region in which the Al composition ratio is the highest to less than or equal to 0.5 nm, a potential barrier against holes in the valence band can be reduced, and the operating voltage can be lowered.

Further, by setting the thickness of electron barrier layer 809 to less than or equal to 5 nm, a width (that is, the thickness) of a potential barrier in the valence band, which is formed in electron barrier layer 809, can be decreased. As a result, a barrier against electrical conduction from P-type cladding layer 710 to active layer 105 by holes can be decreased, and thus the operating voltage is lowered. Here, if the thickness of electron barrier layer 809 is smaller than 2 nm, more electrons flow from active layer 105 to P-type cladding layer 710 over electron barrier layer 809, and thus the thickness of electron barrier layer 809 needs to be greater than or equal to 2 nm.

If the thickness of the Al composition ratio increasing region is less than or equal to 2 nm, generation of electrons that flow from active layer 105 to P-type cladding layer 710 over electron barrier layer 809 can be reduced by making the thickness of the Al composition ratio decreasing region of electron barrier layer 809 greater than the thickness of the Al composition ratio increasing region while maintaining the thickness of electron barrier layer 809 less than or equal to 5 nm.

More positive piezo-polarization charge formed at and in the vicinity of the interface of electron barrier layer 809 with intermediate layer 108 is found in a region in which a rate of change in Al composition ratio is relatively great than in a region in which a rate of change in Al composition ratio is relatively small and which is close to intermediate layer 108. By making the shape of curve f(x) in the Al ratio increasing region in electron barrier layer 809 downward convex, a rate of change in Al composition ratio at and in the vicinity of the interface of electron barrier layer 809 with intermediate layer 108 can be made small, and thus positive piezo polarization charge can be decreased at the interface. Thus, a concentration of electrons attracted by positive piezo-polarization charge is decreased at the interface. Along with this, a potential barrier against holes in the valence band at the interface of electron barrier layer 809 with intermediate layer 108 can be decreased.

Furthermore, since the shape of curve f(x) in the Al composition ratio decreasing region of electron barrier layer 809 is made downward convex, the thickness of a region in which the Al composition ratio is high at or in the vicinity of position x=Xm can be made thin, and the width of a potential barrier in the valence band, which is formed in electron barrier layer 809, can be further narrowed. As a result, a barrier against electrical conduction from P-type cladding layer 710 to active layer 105 by holes can be decreased, and the operating voltage can be lowered.

The Mg concentration in electron barrier layer 809 according to the present embodiment may be less than or equal to $1.5\times10^{19}$ $cm^{-3}$. Since the Al composition ratio tilts in a region (that is, the Al composition ratio increasing region) of electron barrier layer 809 on the side close to active layer 105, a potential barrier against holes in electron barrier layer 809 can be decreased even if the Mg concentration is set to $1.5\times10^{19}$ $cm^{-3}$ or less. Accordingly, even if the Al composition ratio of electron barrier layer 809 is increased to 30% or higher, an increase in the operating voltage can be reduced.

Furthermore, since the shape of curve f(x) in a region (that is, the Al composition ratio increasing region) of electron barrier layer 809 on the side close to active layer 105 is made downward convex, an effect on prevention of a potential barrier from being formed in the valence band is increased, and the Mg concentration can be set to $1\times10^{19}$ $cm^{-3}$ or less. Note that the Mg concentration may be set to $0.7\times10^{18}$ $cm^{-3}$ or more. Accordingly, an excessive decrease in potential of electron barrier layer 809 in the valence band can be reduced.

In the present embodiment, electron barrier layer 809 has a composition expressed by $Al_{0.02}Ga_{0.98}N$ at and in the vicinity of the interface with intermediate layer 108, and has an Al composition ratio that monotonically increases with a decrease in distance from P-type cladding layer 710. Electron barrier layer 809 has a composition expressed by $Al_{0.36}Ga_{0.64}N$ at position x=Xm distant from the interface of electron barrier layer 809 with intermediate layer 108 by 1 nm. The Al composition ratio of electron barrier layer 809 monotonically decreases with a decrease in distance from position x=Xm to P-type cladding layer 710. Electron barrier layer 809 has a composition expressed by $Al_{0.026}Ga_{0.974}N$ at and in the vicinity of the interface with P-type cladding layer 710.

According to the present embodiment, nitride-based semiconductor light-emitting element 800 can be produced, in which effective refractive index difference ΔN is $1.9\times10^{-3}$, position P1 is 3.6 nm, difference ΔP is 2.8 nm, a coefficient of light confinement in active layer 105 is 1.54%, waveguide loss is 3.6 $cm^{-1}$, and guide-layer free carrier loss is 2.4 $cm^{-1}$.

Embodiment 9

A nitride-based semiconductor light-emitting element according to Embodiment 9 is to be described. The nitride-based semiconductor light-emitting element according to the present embodiment is different from nitride-based semiconductor light-emitting element 100 according to Embodiment 1 mainly in the configuration of the ridge. The following mainly describes differences of the nitride-based semiconductor light-emitting element according to the present embodiment from nitride-based semiconductor light-emitting element 100 according to Embodiment 1, with reference to FIG. 45 and FIG. 46.

Figure 45:
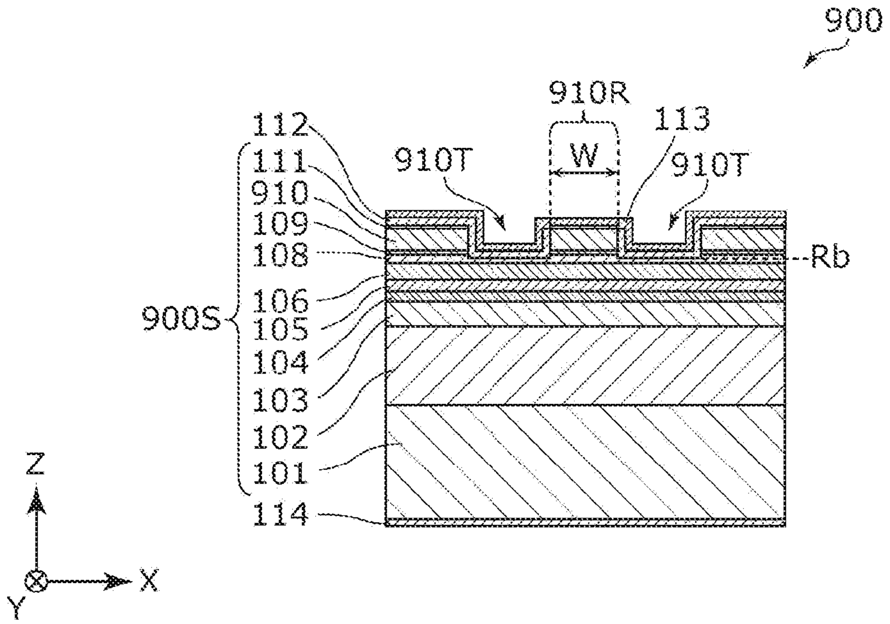
FIG. 45 is a schematic cross sectional view illustrating an overall configuration of a nitride-based semiconductor light-emitting element according to Embodiment 9.
Figure 46:
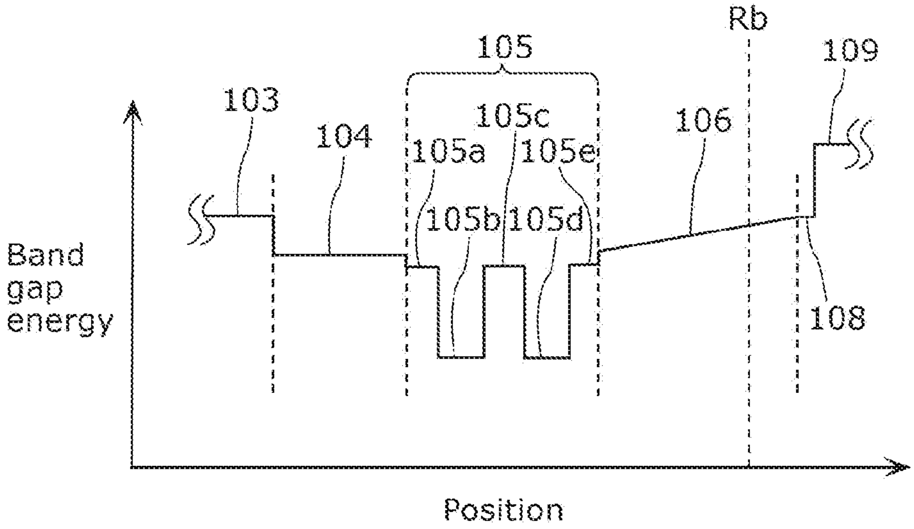
FIG. 46 is a schematic graph showing a distribution of band gap energy in an active layer and layers in the vicinity thereof in the nitride-based semiconductor light-emitting element according to Embodiment 9.

FIG. 45 is a schematic cross sectional view illustrating an overall configuration of nitride-based semiconductor light-emitting element 900 according to the present embodiment. FIG. 46 is a schematic graph showing a distribution of band gap energy in active layer 105 and layers in the vicinity thereof in nitride-based semiconductor light-emitting element 900 according to the present embodiment.

As illustrated in FIG. 45, nitride-based semiconductor light-emitting element 900 according to the present embodiment includes semiconductor stack body 900S, current block layer 112, P-side electrode 113, and N-side electrode 114. Semiconductor stack body 900S includes substrate 101, N-type first cladding layer 102, N-type second cladding layer 103, N-side guide layer 104, active layer 105, P-side guide layer 106, intermediate layer 108, electron barrier layer 109, P-type cladding layer 910, and contact layer 111.

P-type cladding layer 910 according to the present embodiment is provided between electron barrier layer 109 and contact layer 111. P-type cladding layer 910 has a smaller refractive index and greater band gap energy than those of active layer 105.

P-type cladding layer 910 is a P-type $Al_{0.026}Ga_{0.974}N$ layer having a thickness of 315 nm. P-type cladding layer 910 is doped with Mg as an impurity. In the present embodiment, an impurity concentration of P-type cladding layer 910 at an edge portion on the side close to active layer 105 is lower than the impurity concentration thereof at an edge portion on the side far from active layer 105. P-type cladding layer 910 includes a P-type $Al_{0.026}Ga_{0.974}N$ layer provided on the side close to active layer 105, doped with Mg having a concentration of $2\times10^{18}$ $cm^{-3}$, and having a thickness of 150 nm, and a P-type $Al_{0.026}Ga_{0.974}N$ layer provided thereabove, doped with Mg having a concentration of $1\times10^{19}$ $cm^{-3}$, and having a thickness of 165 nm.

Ridge 910R is formed in P-type cladding layer 910. Further, two grooves 910T are formed in P-type cladding layer 910, which are provided along ridge 910R and extend in the Y-axis direction.

Figure 47:
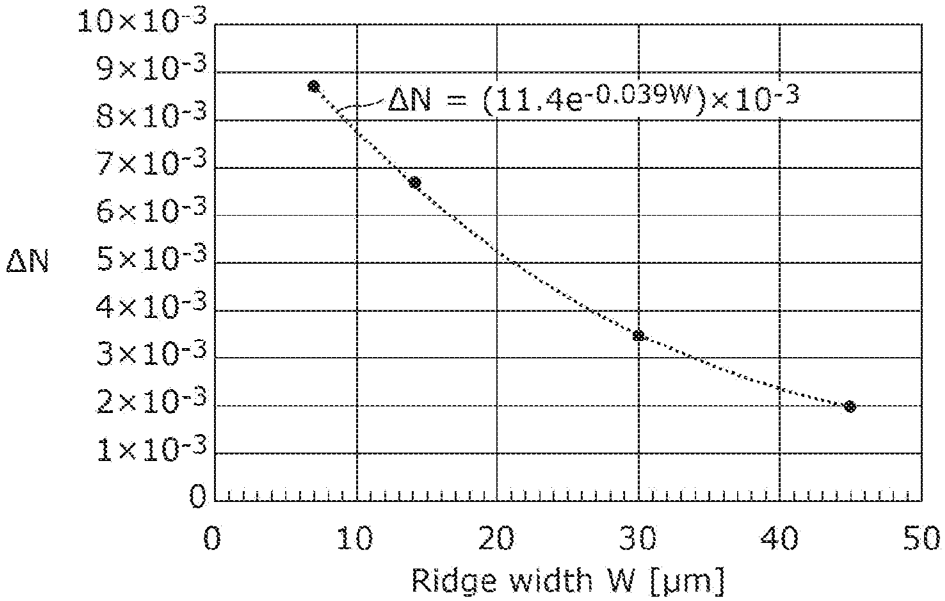
FIG. 47 is a graph showing a relation between a ridge width and an effective refractive index difference necessary to reduce kinks.

One method of reducing kinks is to increase effective refractive index difference ΔN of nitride-based semiconductor light-emitting element 900. Here, a relation between ridge width W and effective refractive index difference ΔN necessary to reduce kinks is to be described with reference to FIG. 47. FIG. 47 is a graph showing a relation between ridge width W and effective refractive index difference ΔN necessary to reduce kinks. FIG. 47 illustrates a relation obtained by simulation of a semiconductor light-emitting element having a stack structure similar to that of nitride-based semiconductor light-emitting element 900 according to the present embodiment.

As illustrated in FIG. 47, effective refractive index difference ΔN necessary to reduce kinks increases with a decrease in ridge width W. In the present embodiment, a relation between ridge width W [μm] and effective refractive index difference ΔN necessary to reduce kinks is $\Delta N=11.4 \exp(-0.039W)\times10^{-3}$. Thus, in order to reduce kinks, effective refractive index difference ΔN may be preferably greater than or equal to $11.4 \exp(-0.039W)\times10^{-3}$. In this manner, if ridge width W is small, kinks are readily generated in a graph showing IL characteristics. In particular, ridge width W is smaller than ridge width W according to Embodiment 1, and kinks are readily generated when ridge width W is less than or equal to 30 μm.

In order to achieve such effective refractive index difference ΔN that reduces kinks, in the present embodiment, as illustrated in FIG. 45 and FIG. 46, a ridge is formed in P-type cladding layer 910 and electron barrier layer 109, and lower edge Rb of ridge 910R (that is, the bottoms of grooves 910T) is positioned between active layer 105 and electron barrier layer 109. Accordingly, effective refractive index difference ΔN can be increased without reducing a distance between electron barrier layer 109 having a low refractive index and active layer 105. Thus, effective refractive index difference ΔN can be increased while a decrease in a light confinement coefficient is reduced, and position P1 is placed in active layer 105. Ridge width W according to the present embodiment is less than or equal to 45 μm. Ridge width W can be made smaller than ridge width W according to Embodiment 1, and can be made 30 μm or less. In other words, a beam spot size in the horizontal direction can be decreased.

In the present embodiment, the thickness of P-type cladding layer 910 is 315 nm, and lower edge Rb of ridge 910R is positioned in P-side guide layer 106. More specifically, lower edge Rb of ridge 910R is at a position distant from the interface between P-side guide layer 106 and intermediate layer 108 by 70 nm (or in other words, the distance from the interface between P-side guide layer 106 and active layer 105 is 210 nm). In this manner, since ridge 910R is formed in P-side guide layer 106, an average refractive index of P-side guide layer 106 can be decreased, and thus position P1 can be shifted from active layer 105 toward N-side guide layer 104. Accordingly, light absorption by P-side electrode 113 can be decreased. Thus, waveguide loss can be decreased.

In the present embodiment, as described above, position P1 can be shifted from active layer 105 toward N-side guide layer 104. Accordingly, by using P-type cladding layer 910 having a small thickness, even if a distance between P-side electrode 113 and active layer 105 is short, light absorbed by P-side electrode 113 can be decreased. Here, if Ag is used for P-side electrode 113, a refractive index of light having a wavelength in a range from 360 nm to 800 nm can be decreased down to 0.2 or less, even if the thickness of P-type cladding layer 910 is set to 300 nm or less, loss of light absorbed by P-side electrode 113 is small, so that an increase in waveguide loss is not caused. Thus, the thickness of a P-type cladding layer having a high impurity doping concentration and great free carrier loss can be made further thinner. If the thickness of P-type cladding layer 910 is made excessively thin, a light intensity distribution in the stack direction shifts toward the substrate, which leads to a decrease in light confinement coefficient, so the thickness may be greater than or equal to 100 nm.

Further, a light-transmitting conductive film may be provided as a portion of an electrode, between P-type cladding layer 910 and P-side electrode 113 according to the present embodiment. Similarly to light-transmitting conductive film 420 according to Embodiment 4, light-transmitting conductive film 420 according to the present embodiment is a conductive film that is provided above P-type cladding layer 910, and transmits at a portion of light generated in nitride-based semiconductor light-emitting element 900. As light-transmitting conductive film 420, for example, an oxide film can be used which has visible light transmissivity and low-resistance electrical conductivity, such as a tin-doped indium oxide (ITO) layer, a Ga-doped zinc oxide layer, an Al-doped zinc oxide layer, or an In- and Ga-doped zinc oxide layer.

It is sufficient if light-transmitting conductive film 420 is formed above at least P-type cladding layer 410, and light-transmitting conductive film 420 may be formed between current block layer 112 and P-side electrode 113.

Light-transmitting conductive film 420 has high transmissivity for light having a wavelength in a range from 400 nm to 1 μm, and has a refractive index of about 2 (for example, 2.1 in the case of an ITO layer). From this, a light intensity distribution in a waveguide propagation mode can spread in light-transmitting conductive film 420, and thus light-transmitting conductive film 420 can be used as a portion of a cladding layer. Light-transmitting conductive film 420 has low loss of absorbed light having a wavelength greater than or equal to 420 nm, and can be used as a low-loss cladding layer for a nitride-based semiconductor light-emitting element having a wavelength range from 420 nm to 600 nm. In this case, even if the thickness of P-type cladding layer 910 is reduced down to 300 nm or less, waveguide loss does not increase, and a low-loss waveguide can be produced, which reduces kinks owing to an increase in effective refractive index difference ΔN even in an element having ridge width W that is less than or equal to 30 μm. Furthermore, light-transmitting conductive film 420 has functions as a cladding layer as described above, and even if a distance between light-transmitting conductive film 420 and active layer 105 is decreased, an intensity peak position of a light intensity distribution in the stack direction can be placed in active layer 105 or in the vicinity thereof, and thus a high light confinement coefficient can be obtained. The thickness of P-type cladding layer 910 may be zero nm (or stated differently, P-type cladding layer 910 may not be provided). Yet, the refractive index of P-type cladding layer 910 has a magnitude between the refractive index of active layer 105 and the refractive index of light-transmitting conductive film 420, and better control for placing an intensity peak position of a light intensity distribution in the stack direction in active layer 105 or in the vicinity thereof can be achieved if P-type cladding layer 910 is present between active layer 105 and light-transmitting conductive film 420. As a result, the thickness of P-type cladding layer 910 may be preferably greater than or equal to 10 nm. If the thickness of light-transmitting conductive film 420 is too thin, attenuation of a light intensity distribution in the stack direction in light-transmitting conductive film 420 is insufficient, and waveguide loss is generated when an electrode such as an Ag electrode having a low refractive index as described above is used as P-side electrode 113. In contrast, if the thickness of light-transmitting conductive film 420 is excessively thick, a series resistance of a nitride-based semiconductor light-emitting element increases, and thus the thickness of light-transmitting conductive film 420 may be in a range from 100 nm to 500 nm. Here, if Ag is used for P-side electrode 113, loss of light absorbed by P-side electrode 113 is decreased, and thus the thickness of light-transmitting conductive film 420 may be in a range from 50 nm to 500 nm.

According to the present embodiment, nitride-based semiconductor light-emitting element 900 can be produced, in which effective refractive index difference ΔN is $8.4\times10^{-3}$, position P1 is 1.9 nm, a coefficient of confinement of light in active layer 105 is 1.46%, and waveguide loss is 3.44 $cm^{-1}$.

Embodiment 10

A nitride-based semiconductor light-emitting element according to Embodiment 10 is to be described. The nitride-based semiconductor light-emitting element according to the present embodiment is different from nitride-based semiconductor light-emitting element 900 according to Embodiment 9 mainly in the position of the lower edge of the ridge. The following mainly describes differences of the nitride-based semiconductor light-emitting element according to the present embodiment from nitride-based semiconductor light-emitting element 900 according to Embodiment 9, with reference to FIG. 48.

Figure 48:
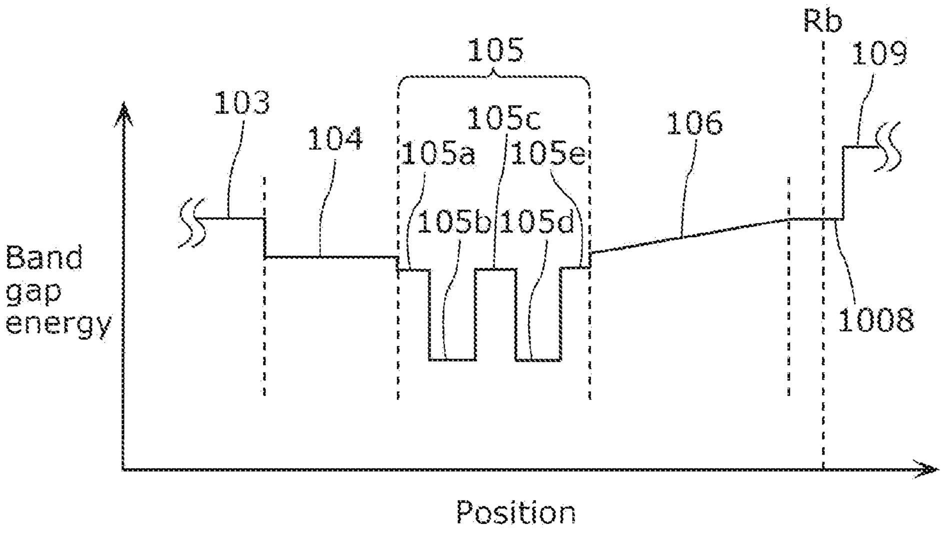
FIG. 48 is a schematic graph showing a distribution of band gap energy in an active layer and layers in the vicinity thereof in a nitride-based semiconductor light-emitting element according to Embodiment 10.

FIG. 48 is a schematic graph showing a distribution of band gap energy in active layer 105 and layers in the vicinity thereof in the nitride-based semiconductor light-emitting element according to the present embodiment.

The nitride-based semiconductor light-emitting element according to the present embodiment is different from nitride-based semiconductor light-emitting element 900 according to Embodiment 9 in the configurations of intermediate layer 1008 and P-type cladding layer 910 and the position of lower edge Rb of ridge 910R.

Intermediate layer 1008 according to the present embodiment is a layer provided between P-side guide layer 106 and electron barrier layer 109, and having band gap energy less than that of electron barrier layer 109 and greater than that of P-side guide layer 106, similarly to intermediate layer 108 according to Embodiment 9. In the present embodiment, intermediate layer 1008 is an undoped GaN layer having a thickness of 50 nm.

P-type cladding layer 910 according to the present embodiment includes a P-type $Al_{0.026}Ga_{0.974}N$ layer provided on the side close to active layer 105, doped with Mg having a concentration of $2\times10^{18}$ $cm^{-3}$, and having a thickness of 150 nm, and a P-type $Al_{0.026}Ga_{0.974}N$ layer provided thereabove, doped with Mg having a concentration of $1\times10^{19}$ $cm^{-3}$, and having a thickness of 215 nm.

As illustrated in FIG. 48, in the nitride-based semiconductor light-emitting element according to the present embodiment, lower edge Rb of ridge 910R is positioned in intermediate layer 1008. More specifically, lower edge Rb of ridge 910R is at a position distant from the interface between P-side guide layer 106 and intermediate layer 1008 by 10 nm (or in other words, the distance from the interface between intermediate layer 1008 and electron barrier layer 109 is 40 nm). Accordingly, a shift in position P2 from active layer 105 toward N-side guide layer 104 can be reduced. Thus, in the graph showing IL characteristics, generation of kinks can be reduced.

In the present embodiment, intermediate layer 1008 has a first constant region in which band gap energy is constant in the stack direction, and lower edge Rb of ridge 910R is positioned in the first constant region. Accordingly, even if the position of lower edge Rb of ridge 910R changes due to a manufacturing error, for instance, a change in characteristics of the nitride-based semiconductor light-emitting element can be reduced. Thus, an individual difference of the nitride-based semiconductor light-emitting element can be reduced. In particular, lower edge Rb of ridge 910R is positioned outside P-side guide layer 106, and thus influence exerted by a change in position of lower edge Rb of ridge 910R on light guide effects can be reduced. Thus, an individual difference in effect of the nitride-based semiconductor light-emitting element on a light guide can be reduced. Note that in the present embodiment, entire intermediate layer 1008 is the first constant region. Note that intermediate layer 1008 may have a region in which band gap energy is not constant in the stack direction.

According to the present embodiment, the nitride-based semiconductor light-emitting element can be produced, in which effective refractive index difference ΔN is $3.83\times10^{-3}$, position P1 is 1.4 nm, a coefficient of confinement of light in active layer 105 is 1.49%, and waveguide loss is 3.32 $cm^{-1}$.

Embodiment 11

A nitride-based semiconductor light-emitting element according to Embodiment 11 is to be described. The nitride-based semiconductor light-emitting element according to the present embodiment is different from nitride-based semiconductor light-emitting element according to Embodiment 1 mainly in the configuration of the intermediate layer. The following mainly describes differences of the nitride-based semiconductor light-emitting element according to the present embodiment from the nitride-based semiconductor light-emitting element according to Embodiment 10, with reference to FIG. 49.

Figure 49:
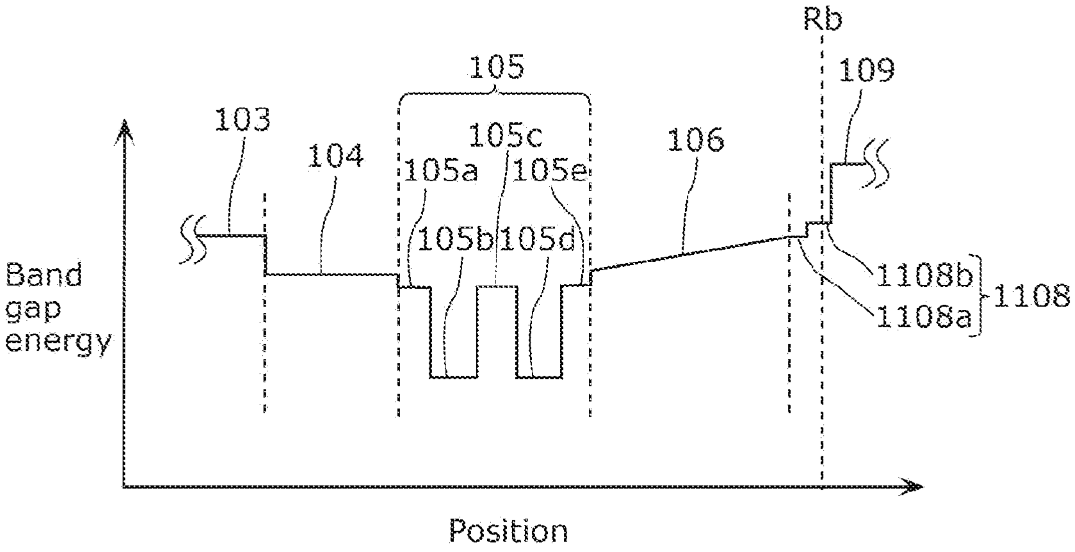
FIG. 49 is a schematic graph showing a distribution of band gap energy in an active layer and layers in the vicinity thereof in a nitride-based semiconductor light-emitting element according to Embodiment 11.

FIG. 49 is a schematic graph showing a distribution of band gap energy in active layer 105 and layers in the vicinity thereof in the nitride-based semiconductor light-emitting element according to the present embodiment.

The nitride-based semiconductor light-emitting element according to the present embodiment is different from the nitride-based semiconductor light-emitting element according to Embodiment 10 in the configurations of intermediate layer 1008 and P-type cladding layer 910 and the position of lower edge Rb of ridge 910R.

Intermediate layer 1108 according to the present embodiment is a layer provided between P-side guide layer 106 and electron barrier layer 109, and having band gap energy less than that of electron barrier layer 109 and greater than that of P-side guide layer 106, similarly to intermediate layer 1008 according to Embodiment 10. In the present embodiment, intermediate layer 1108 includes first constant region 1108*a* in which band gap energy is constant in the stack direction, and second constant region 1108*b* which is provided above first constant region 1108*a*, and having band gap energy greater than that in first constant region 1108*a* and constant in the stack direction. In the present embodiment, first constant region 1108*a* is an undoped GaN layer having a thickness of 10 nm, and second constant region 1108*b* is an undoped $Al_{0.02}GaN_{0.98}N$ layer having a thickness of 10 nm.

P-type cladding layer 910 according to the present embodiment includes a P-type $Al_{0.026}Ga_{0.974}N$ layer provided on the side close to active layer 105, doped with Mg having a concentration of $2\times10^{18}$ $cm^{-3}$, and having a thickness of 150 nm, and a P-type $Al_{0.026}Ga_{0.974}N$ layer provided thereabove, doped with Mg having a concentration of $1\times10^{19}$ $cm^{-3}$, and having a thickness of 250 nm.

As illustrated in FIG. 49, in the nitride-based semiconductor light-emitting element according to the present embodiment, lower edge Rb of ridge 910R is positioned in second constant region 1108*b* of intermediate layer 1108. More specifically, lower edge Rb of ridge 910R is at a position distant from the interface between first constant region 1108*a* and second constant region 1108*b* by 5 nm (stated differently, 5 nm from the interface between second constant region 1108*b* and electron barrier layer 109). Accordingly, a shift in position P2 from active layer 105 toward N-side guide layer 104 can be reduced, similarly to Embodiment 10. Thus, generation of kinks can be reduced in the graph showing IL characteristics.

Also in the present embodiment, similarly to Embodiment 10, lower edge Rb of ridge 910R is positioned in a region in which band gap energy is constant in the stack direction. Accordingly, even if the position of lower edge Rb of ridge 910R changes due to a manufacturing error, for instance, a change in characteristics of the nitride-based semiconductor light-emitting element can be reduced. In particular, lower edge Rb of ridge 910R is positioned outside P-side guide layer 106, and thus influence exerted due to the position of lower edge Rb of ridge 910R on light guide effects can be reduced. Thus, an individual difference in effect of the nitride-based semiconductor light-emitting element on light guide can be reduced.

Note that in the present embodiment, lower edge Rb of ridge 910R is positioned in second constant region 1108*b*, but may be positioned in first constant region 1108*a*. Further, intermediate layer 1108 includes two regions in which band gap energy is constant in the stack direction, but may include three or more of such regions. Moreover, intermediate layer 1008 may have a region in which band gap energy is not constant in the stack direction.

According to the present embodiment, the nitride-based semiconductor light-emitting element can be produced, in which effective refractive index difference $\Delta N$ is $3.7\times10^{-3}$, position P1 is 1.2 nm, a coefficient of confinement of light in active layer 105 is 1.49%, and waveguide loss is 3.52 $cm^{-1}$.

Variations and Others

The nitride-based semiconductor light-emitting elements according to the present disclosure have been described above based on the embodiments, yet the present disclosure is not limited to the above embodiments.

For example, the embodiments have shown examples in which the nitride-based semiconductor light-emitting elements are semiconductor laser elements, yet the nitride-based semiconductor light-emitting elements are not limited to semiconductor laser elements. For example, the nitride-based semiconductor light-emitting element may be a super luminescent diode. In this case, a reflectance of an edge surface of the semiconductor stack body included in the nitride-based semiconductor light-emitting element with respect to emitted light from the semiconductor stack body may be less than or equal to 0.1%. Such a reflectance can be obtained by forming an anti-reflection film that includes, for instance, a dielectric multilayer film on the edge surface, for example. Alternatively, if a tilting stripe structure is adopted in which ridges serving as waveguides cross a front end surface in a state of tilting 5 degrees or more relative to the normal line direction, a percentage of a component that is guided light, which is reflected off the front end surface, coupled to the waveguides again, and guided, can be decreased to a small value that is less than or equal to 0.1%. In particular, if the wavelength of emitted light is caused to fall within a band from 430 nm to 455 nm, the thickness of each of well layers 105*b* and 105*d* is less than or equal to 35 Å. In this case, even if a reflectance of the edge surface is reduced, light amplification gain can be ensured owing to effects on reduction in waveguide loss and effects on an increase in a coefficient of confinement of light in active layer 105, which are yielded by the nitride-based semiconductor light-emitting element according to the present disclosure. If such a nitride-based semiconductor light-emitting element is provided inside an external resonator that includes a wavelength selection element, self-heating of the nitride-based semiconductor light-emitting element can be reduced, and a change in wavelength of emitted light can be decreased, and thus oscillation at a desired selected wavelength can be more readily caused.

In Embodiments 1 to 4 and 6 described above, the nitride-based semiconductor light-emitting element has a structure in which two well layers are included as the structure of active layer 105, yet a structure in which only a single well layer is included may be adopted. In this manner, also when the active layer includes only one well layer having a high refractive index, controllability of a position in light intensity distribution in the stack direction can be enhanced if the N-side guide layer and the P-side guide layer according to the present disclosure are used, and thus a peak of the light intensity distribution in the stack direction can be located in the well layer or in the vicinity thereof. Thus, the nitride-based semiconductor light-emitting element that has a low oscillation threshold, a low waveguide loss, a high light confinement coefficient, and current-light output (IL) characteristics with excellent linearity can be produced.

Figure 50:
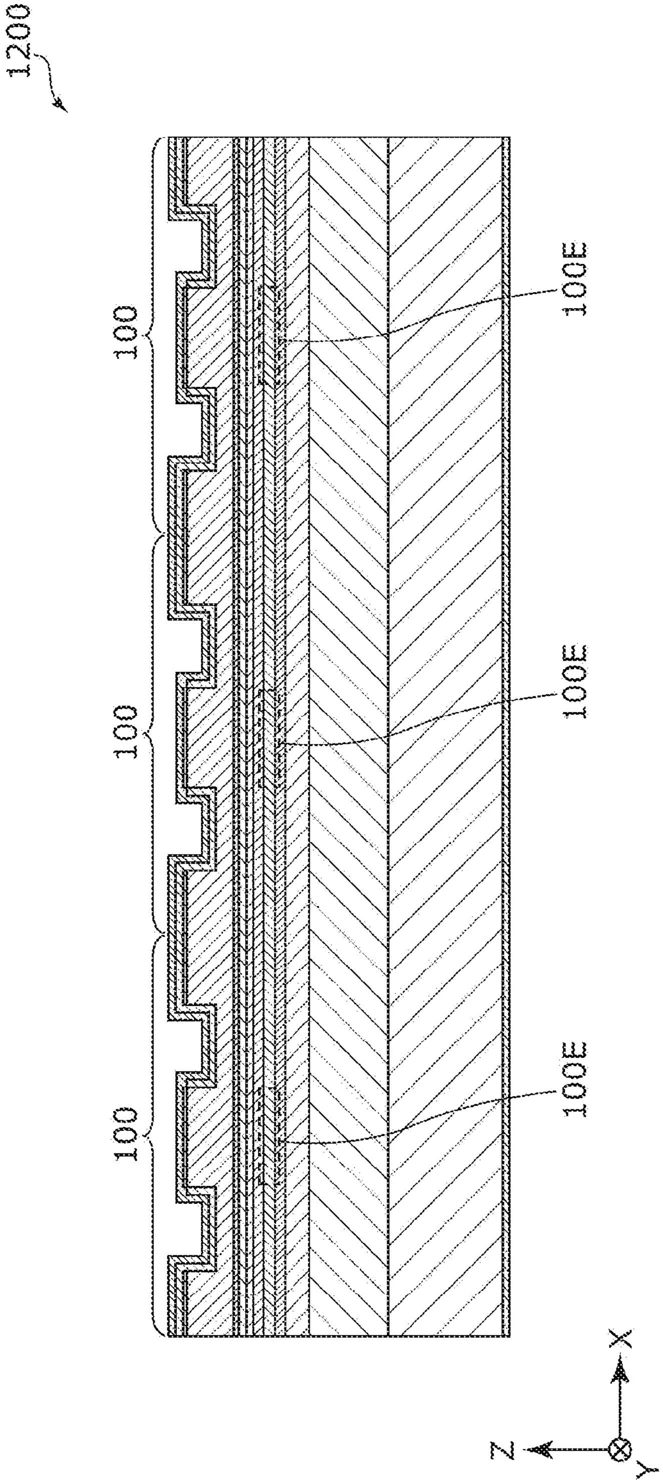
FIG. 50 is a schematic cross sectional view illustrating an overall configuration of a nitride-based semiconductor light-emitting element according to Variation 1.

In the above embodiments, the nitride-based semiconductor light-emitting element has a single ridge, but may include a plurality of ridges. Such a nitride-based semiconductor light-emitting element is to be described with reference to FIG. 50. FIG. 50 is a schematic cross sectional view illustrating an overall configuration of nitride-based semiconductor light-emitting element 1200 according to Variation 1. As illustrated in FIG. 50, nitride-based semiconductor light-emitting element 1200 according to Variation 1 includes a configuration in which nitride-based semiconductor light-emitting elements 100 according to Embodiment 1 are provided in an array in the horizontal direction. In FIG. 50, nitride-based semiconductor light-emitting element 1200 has a configuration in which three nitride-based semiconductor light-emitting elements 100 are integrally provided, but the number of nitride-based semiconductor light-emitting elements 100 included in nitride-based semiconductor light-emitting element 1200 is not limited to three. The number of nitride-based semiconductor light-emitting elements 100 included in nitride-based semiconductor light-emitting element 1200 may be preferably two or more. Nitride-based semiconductor light-emitting elements 100 each include light emitter 100E that emits light. Light emitter 100E is a portion of active layer 105 that emits light and corresponds to a portion of active layer 105 positioned below ridge 110R. In this manner, nitride-based semiconductor light-emitting element 1200 according to Variation 1 includes a plurality of light emitters 100E provided in an array. Accordingly, a plurality of light beams are emitted from single nitride-based semiconductor light-emitting element 1200, and thus high-power nitride-based semiconductor light-emitting element 1200 can be produced. Note that in Variation 1, nitride-based semiconductor light-emitting element 1200 includes plural nitride-based semiconductor light-emitting elements 100, yet the plural nitride-based semiconductor light-emitting elements included in nitride-based semiconductor light-emitting element 1200 are not limited thereto, and may be nitride-based semiconductor light-emitting elements according to a different embodiment.

Figure 51:
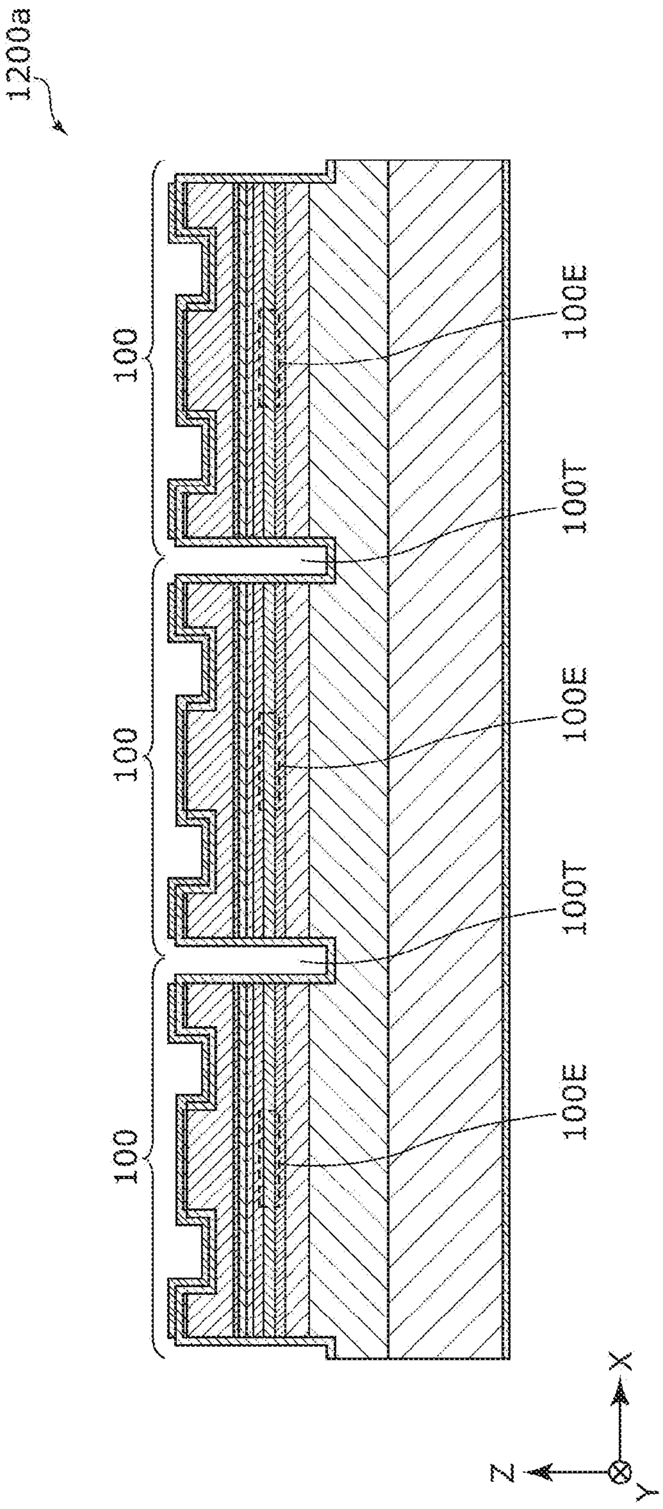
FIG. 51 is a schematic cross sectional view illustrating an overall configuration of a nitride-based semiconductor light-emitting element according to Variation 2.

As shown in nitride-based semiconductor light-emitting element 1200*a* according to Variation 2 illustrated in FIG. 51, each adjacent pair of light emitters 100E may be separated by separation groove 100T having a width (a size in the X-axis direction) in a range from 8 μm to 20 μm and a depth (a size in the Z-axis direction) in a range from 1.0 μm to 1.5 μm. By adopting such a structure, even when the spacing between adjacent light emitters 100E is narrowed down to 300 μm or less, thermal interference caused by self-heating of light emitters 100E while operating can be reduced.

In the semiconductor laser device according to the present disclosure, ΔN is small and a horizontal spread angle can be decreased, and thus even if the distance between centers of light emitters 100E illustrated in FIG. 50 and FIG. 51 is shortened, light beams emitted from light emitters 100E are not readily interfered, so that the distance between the centers of light emitters 100E can be shortened down to 250 μm or less. In Variation 2, the distance is 225 μm.

The nitride-based semiconductor light-emitting elements according to the above embodiments each include N-type second cladding layer 103, intermediate layer 108, electron barrier layer 109, and current block layer 112, but do not necessarily include those layers.

Furthermore, P-type cladding layers 110, 410, and 610 are layers having a uniform Al composition ratio, yet the configurations of the P-type cladding layers are not limited thereto. For example, the P-type cladding layers may each have a superlattice structure in which AlGaN layers and GaN layers are alternately stacked. Specifically, the P-type cladding layers may each have a superlattice structure in which AlGaN layers each having a thickness of 1.85 nm and an Al composition ratio of 0.052 (5.2%) and GaN layers each having a thickness of 1.85 nm are alternately stacked. In this case, the Al composition ratio of each P-type cladding layer is defined by an average Al composition ratio of 0.026 (2.6%) in the superlattice structure.

The present disclosure also encompasses embodiments as a result of adding, to the embodiments, various modifications that may be conceived by those skilled in the art, and embodiments obtained by combining elements and functions in the embodiments in any manner as long as the combination does not depart from the spirit of the present disclosure.

For example, the configuration of the cladding layers according to Embodiment 1 may be applied to the nitride-based semiconductor light-emitting elements according to Embodiment 3 and Embodiment 4. For example, the light-transmitting conductive film according to Embodiment 3 may be applied to the nitride-based semiconductor light-emitting elements according to Embodiment 1 and Embodiment 4.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The nitride-based semiconductor light-emitting elements according to the present disclosure are applicable to, for instance, light sources for processing machines, as high-power highly efficient light sources, for example.

The invention claimed is:

1. A nitride-based semiconductor light-emitting element comprising:

a semiconductor stack body, wherein the nitride-based semiconductor light-emitting element emits light from an end surface that faces in a direction perpendicular to a stack direction of the semiconductor stack body, the semiconductor stack body includes:

an N-type first cladding layer;

an N-side guide layer provided above the N-type first cladding layer;

an active layer provided above the N-side guide layer, the active layer including a well layer and a barrier layer and having a quantum well structure;

a P-side guide layer provided above the active layer; and a P-type cladding layer provided above the P-side guide layer, band gap energy of the P-side guide layer monotonically increases with an increase in distance from the active layer, the P-side guide layer includes a portion in which the band gap energy continuously increases with an increase in distance from the active layer, an average of the band gap energy of the P-side guide layer is greater than or equal to an average of band gap energy of the N-side guide layer, band gap energy of the barrier layer is less than or equal to a smallest value of the band gap energy of the N-side guide layer and a smallest value of the band gap energy of the P-side guide layer, $Tn<Tp$ is satisfied, where Tp denotes a thickness of the P-side guide layer, and Tn denotes a thickness of the N-side guide layer, the P-side guide layer consists essentially of $In_{Xp}G_{1-Xp}N$, the N-side guide layer consists essentially of $In_{Xn}Ga_{1-Xn}N$, an In composition ratio of the P-side guide layer monotonically decreases with an increase in distance from the active layer, and an average of an In composition ratio of the N-side guide layer is greater than or equal to an average of the In composition ratio of the P-side guide layer.

2. The nitride-based semiconductor light-emitting element according to claim 1, wherein the average of the In composition ratio of the N-side guide layer is greater than the average of the In composition ratio of the P-side guide layer.

3. The nitride-based semiconductor light-emitting element according to claim 1, wherein an average rate of change in the In composition ratio of the P-side guide layer in the stack direction in a region from an interface on a side close to the active layer to a center portion in the stack direction is greater than an average rate of change in the In composition ratio of the P-side guide layer in the stack direction in a region from the center portion to an interface on a side close to the P-type cladding layer.

4. The nitride-based semiconductor light-emitting element according to claim 1, wherein the barrier layer consists essentially of $In_{Xb}Ga_{1-Xb}N$, and a greatest value of the In composition ratio of the P-side guide layer is less than or equal to an In composition ratio of the barrier layer.

5. The nitride-based semiconductor light-emitting element according to claim 1, wherein a peak of a light intensity distribution in the stack direction is located in the active layer.

6. The nitride-based semiconductor light-emitting element according to claim 1, wherein an impurity concentration at an edge portion of the P-type cladding layer on a side close to the active layer is lower than an impurity concentration at an edge portion of the P-type cladding layer on a side far from the active layer.

7. The nitride-based semiconductor light-emitting element according to claim 1, further comprising:

an electron barrier layer provided between the P-side guide layer and the P-type cladding layer, wherein the electron barrier layer includes an Al composition ratio increasing region in which an Al composition ratio monotonically increases with an increase in distance from the active layer.

8. A nitride-based semiconductor light-emitting element comprising:

a semiconductor stack body, wherein the nitride-based semiconductor light-emitting element emits light from an end surface that faces in a direction perpendicular to a stack direction of the semiconductor stack body, the semiconductor stack body includes:

an N-type first cladding layer;

an N-side guide layer provided above the N-type first cladding layer;

an active layer provided above the N-side guide layer, the active layer including a well layer and a barrier layer and having a quantum well structure;

a P-side guide layer provided above the active layer;

a P-type cladding layer provided above the P-side guide layer; and an electron barrier layer provided between the P-side guide layer and the P-type cladding layer, band gap energy of the P-side guide layer monotonically increases with an increase in distance from the active layer, the P-side guide layer includes a portion in which the band gap energy continuously increases with an increase in distance from the active layer, an average of the band gap energy of the P-side guide layer is greater than or equal to an average of band gap energy of the N-side guide layer, band gap energy of the barrier layer is less than or equal to a smallest value of the band gap energy of the N-side guide layer and a smallest value of the band gap energy of the P-side guide layer, $Tn<Tp$ is satisfied, where Tp denotes a thickness of the P-side guide layer, and Tn denotes a thickness of the N-side guide layer, a ridge is provided in the P-type cladding layer, and a distance between a lower edge of the ridge and the electron barrier layer is in a range from 10 nm to 70 nm.

9. The nitride-based semiconductor light-emitting element according to claim 1, further comprising:

an electron barrier layer provided between the P-side guide layer and the P-type cladding layer, wherein a ridge is provided in the P-type cladding layer and the electron barrier layer, and a lower edge of the ridge is positioned between the active layer and the electron barrier layer.

10. The nitride-based semiconductor light-emitting element according to claim 9, further comprising:

an intermediate layer provided between the P-side guide layer and the electron barrier layer, the intermediate layer having band gap energy less than band gap energy of the electron barrier layer and greater than or equal to the band gap energy of the P-side guide layer, wherein the intermediate layer includes a first constant region in which the band gap energy is constant in the stack direction, and the lower edge of the ridge is positioned in the first constant region.

11. The nitride-based semiconductor light-emitting element according to claim 9, further comprising:

an intermediate layer provided between the P-side guide layer and the electron barrier layer, the intermediate layer having band gap energy less than band gap energy of the electron barrier layer and greater than or equal to the band gap energy of the P-side guide layer, wherein the intermediate layer includes:

a first constant region in which the band gap energy is constant in the stack direction; and a second constant region in which the band gap energy is greater than the band gap energy in the first constant region, and is constant in the stack direction, the second constant region being provided above the first constant region, and the lower edge of the ridge is positioned in the first constant region or the second constant region.

12. The nitride-based semiconductor light-emitting element according to claim 9, wherein the ridge has a width that is less than or equal to 30 μm.

13. The nitride-based semiconductor light-emitting element according to claim 1, wherein the N-type first cladding layer and the P-type cladding layer each contain Al, and $Ync>Ypc$ is satisfied, where Ync denotes an Al composition ratio of the N-type first cladding layer, and Ypc denotes an Al composition ratio of the P-type cladding layer.

14. The nitride-based semiconductor light-emitting element according to claim 1, wherein the P-type cladding layer has a thickness that is less than or equal to 460 nm.

15. The nitride-based semiconductor light-emitting element according to claim 1, further comprising:

a light-transmitting conductive film provided above the P-type cladding layer.

16. A nitride-based semiconductor light-emitting element comprising:

a semiconductor stack body, wherein the nitride-based semiconductor light-emitting element emits light from an end surface that faces in a direction perpendicular to a stack direction of the semiconductor stack body, the semiconductor stack body includes:

an N-type first cladding layer;

an N-side guide layer provided above the N-type first cladding layer;

an N-type second cladding layer provided between the N-type first cladding layer and the N-side guide layer;

an active layer provided above the N-side guide layer, the active layer including a well layer and a barrier layer and having a quantum well structure;

a P-side guide layer provided above the active layer; and a P-type cladding layer provided above the P-side guide layer, band gap energy of the P-side guide layer monotonically increases with an increase in distance from the active layer, the P-side guide layer includes a portion in which the band gap energy continuously increases with an increase in distance from the active layer, an average of the band gap energy of the P-side guide layer is greater than or equal to an average of band gap energy of the N-side guide layer, band gap energy of the barrier layer is less than or equal to a smallest value of the band gap energy of the N-side guide layer and a smallest value of the band gap energy of the P-side guide layer, $Tn<Tp$ is satisfied, where Tp denotes a thickness of the P-side guide layer, and Tn denotes a thickness of the N-side guide layer, and band gap energy of the N-type second cladding layer is less than band gap energy of the N-type first cladding layer, and is greater than or equal to a greatest value of the band gap energy of the P-side guide layer.

17. The nitride-based semiconductor light-emitting element according to claim 1, further comprising:

a plurality of light emitters provided in an array.

18. The nitride-based semiconductor light-emitting element according to claim 1, wherein a reflectance of the end surface of the semiconductor stack body is less than or equal to 0.1%.

19. The nitride-based semiconductor light-emitting element according to claim 8, further comprising:

a light-transmitting conductive film provided above the P-type cladding layer.

20. The nitride-based semiconductor light-emitting element according to claim 16, further comprising:

a light-transmitting conductive film provided above the P-type cladding layer.

* * * * *